United States Patent
Ogashiwa et al.

(10) Patent No.: US 12,404,604 B2
(45) Date of Patent: Sep. 2, 2025

(54) SILICON INGOT, SILICON BLOCK, SILICON SUBSTRATE, AND SOLAR CELL

(71) Applicant: KYOCERA CORPORATION, Kyoto (JP)

(72) Inventors: Youhei Ogashiwa, Higashiomi (JP); Seiji Oguri, Higashiomi (JP); Takeshi Takenoshita, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 760 days.

(21) Appl. No.: 17/630,851

(22) PCT Filed: Jul. 30, 2020

(86) PCT No.: PCT/JP2020/029233
§ 371 (c)(1),
(2) Date: Jan. 27, 2022

(87) PCT Pub. No.: WO2021/020510
PCT Pub. Date: Feb. 4, 2021

(65) Prior Publication Data
US 2022/0389612 A1    Dec. 8, 2022

(30) Foreign Application Priority Data

Jul. 31, 2019   (JP) ................. 2019-141352

(51) Int. Cl.
*C30B 29/06* (2006.01)
*C30B 11/14* (2006.01)
(Continued)

(52) U.S. Cl.
CPC .............. *C30B 29/06* (2013.01); *C30B 11/14* (2013.01); *H10F 10/14* (2025.01); *H10F 77/122* (2025.01)

(58) Field of Classification Search
CPC ........ C30B 29/06; C30B 11/14; H01L 31/028; H01L 31/068; H01L 31/036;
(Continued)

(56) References Cited

U.S. PATENT DOCUMENTS

2013/0095028 A1* 4/2013 Lan .................. C30B 11/00
65/33.9

FOREIGN PATENT DOCUMENTS

| CN | 104911691 A | 9/2015 |
| EP | 3825446 A1 | 5/2021 |

(Continued)

OTHER PUBLICATIONS

Tsoutsouva, M. G., et al. "In situ investigation of the structural defect generation and evolution during the directional solidification of <110> seeded growth Si." Acta Materialia, Elsevier, Oxford, GB, vol. 115, (Jun. 10, 2016), pp. 210-223, XP029631564, ISSN: 1359-6454, DOI: 10.1016/J.ACTAMAT. 2016.06.004.
(Continued)

*Primary Examiner* — Sally A Merkling
*Assistant Examiner* — Logan Edward Laclair
(74) *Attorney, Agent, or Firm* — HAUPTMAN HAM, LLP

(57) ABSTRACT

An ingot having a first surface, a second surface opposite to the first surface, and a third surface extending in a first direction from the second surface to the first surface and connecting the first and second surfaces includes a first mono-like crystalline portion, a first intermediate portion including one or more mono-like crystalline sections, and a second mono-like crystalline portion sequentially adjacent to one another in a second direction perpendicular to the first direction. The first and second mono-like crystalline portions have a greater width than the first intermediate portion in the second direction. A first boundary between the first
(Continued)

mono-like crystalline portion and the first intermediate portion and a second boundary between the second mono-like crystalline portion and the first intermediate portion each include a coincidence boundary. At least one of the first or second boundary is curved in an imaginary cross section perpendicular to the first direction.

8 Claims, 32 Drawing Sheets

(51) Int. Cl.
*H10F 10/14* (2025.01)
*H10F 77/122* (2025.01)

(58) Field of Classification Search
CPC ......... H01L 31/1804; H01L 31/022433; H01L 31/035281; Y02E 10/547
See application file for complete search history.

(56) References Cited

FOREIGN PATENT DOCUMENTS

| | | |
|---|---|---|
| EP | 4001477 A1 | 5/2022 |
| JP | 2013-087051 A | 5/2013 |
| JP | 5486190 B2 | 5/2014 |
| WO | 2007/004631 A1 | 1/2007 |
| WO | 2007/084934 A2 | 7/2007 |
| WO | 2014192662 A1 | 12/2014 |

OTHER PUBLICATIONS

Dongli Hu, Shuai Yuan, Liang He, Hongrong Chen, Yuepeng Wan, Xuegong Yu, Deren Yang, "Higher quality mono-like cast silicon with induced grain boundaries", Solar Energy Materials & Solar Cells140 (2015) 121-125.

* cited by examiner

XIXa-XIXa

XIXb-XIXb

XXIIIa-XXIIIa

XXIIIb-XXIIIb

XXXII-XXXII

XXXIIIb-XXXIIIb

XXXIVb-XXXIVb

SILICON INGOT, SILICON BLOCK, SILICON SUBSTRATE, AND SOLAR CELL

CROSS-REFERENCE TO RELATED APPLICATION

The present application is a National Phase entry based on PCT Application No. PCT/JP2020/029233 filed on Jul. 30, 2020, entitled "SILICON INGOT, SILICON BLOCK. SILICON SUBSTRATE, AND SOLAR CELL", which claims the benefit of Japanese Patent Application No. 2019-141352, filed on Jul. 31, 2019, entitled "SILICON INGOT, SILICON BLOCK, SILICON SUBSTRATE, AND SOLAR CELL". The contents of which are incorporated by reference herein in their entirety.

FIELD

Embodiments of the present disclosure relates generally to a silicon ingot, a silicon block, a silicon substrate, and a solar cell.

BACKGROUND

Solar cells using polycrystalline silicon substrates (polycrystalline silicon solar cells) have relatively high conversion efficiency and are easy to mass-manufacture.

Such polycrystalline silicon substrates used in polycrystalline silicon solar cells are obtained typically by manufacturing a silicon ingot by casting, cutting the ingot into blocks, and then slicing the blocks. In casting, a bulk of polycrystalline silicon is grown in a mold upward from the bottom using silicon melt.

Mono-like casting has been developed as a type of casting. In mono-like casting, crystal grains are grown upward from a seed crystal placed on the bottom of a mold using silicon melt. The resulting silicon grains inherit the crystal orientation of the seed crystal to be a crystal like a monocrystal (mono-like crystal). A solar cell including a substrate of this mono-like crystalline silicon is expected to achieve higher conversion efficiency than polycrystalline silicon solar cells.

SUMMARY

A silicon ingot, a silicon block, a silicon substrate, and a solar cell are described.

In one embodiment, a silicon ingot has a first surface, a second surface opposite to the first surface, and a third surface extending in a first direction from the second surface to the first surface and connecting the first surface and the second surface. The silicon ingot includes a first mono-like crystalline portion, a first intermediate portion including one or more mono-like crystalline sections, and a second mono-like crystalline portion. The first mono-like crystalline portion, the first intermediate portion, and the second mono-like crystalline portion are adjacent to one another in sequence in a second direction perpendicular to the first direction. A first width of the first mono-like crystalline portion and a second width of the second mono-like crystalline portion each are greater than a third width of the first intermediate portion in the second direction. A first boundary between the first mono-like crystalline portion and the first intermediate portion and a second boundary between the second mono-like crystalline portion and the first intermediate portion each include a coincidence boundary. At least one of the first boundary or the second boundary is curved in an imaginary cross section perpendicular to the first direction.

In one embodiment, a silicon block has a fourth surface, a fifth surface opposite to the fourth surface, and a sixth surface extending in a first direction from the fifth surface to the fourth surface and connecting the fourth surface and the fifth surface. The silicon block includes a 1A-mono-like crystalline portion, a 1A-intermediate portion including one or more mono-like crystalline sections, and a 2A-mono-like crystalline portion. The 1A-mono-like crystalline portion, the 1A-intermediate portion, and the 2A-mono-like crystalline portion are adjacent to one another in sequence in a second direction perpendicular to the first direction. A 1A-width of the 1A-mono-like crystalline portion and a 2A-width of the 2A-mono-like crystalline portion each are greater than a 3A-width of the 1A-intermediate portion in the second direction. A 1A-boundary between the 1A-mono-like crystalline portion and the 1A-intermediate portion and a 2A-boundary between the 2A-mono-like crystalline portion and the 1A-intermediate portion each include a coincidence boundary. At least one of the 1A-boundary or the 2A-boundary is curved in an imaginary cross section perpendicular to the first direction.

In one embodiment, a silicon substrate has a seventh surface, an eighth surface opposite to the seventh surface, and a ninth surface extending in a first direction from the eighth surface to the seventh surface and connecting the seventh surface and the eighth surface. The silicon substrate includes a 1B-mono-like crystalline portion, a 1B-intermediate portion including one or more mono-like crystalline sections, and a 2B-mono-like crystalline portion. The 1B-mono-like crystalline portion, the 1B-intermediate portion, and the 2B-mono-like crystalline portion are adjacent to one another in sequence in a second direction perpendicular to the first direction. A 1B-width of the 1B-mono-like crystalline portion and a 2B-width of the 2B-mono-like crystalline portion each are greater than a 3B-width of the 1B-intermediate portion in the second direction. A 1B-boundary between the 1B-mono-like crystalline portion and the 1B-intermediate portion and a 2B-boundary between the 2B-mono-like crystalline portion and the 1B-intermediate portion each include a coincidence boundary. At least one of the 1B-boundary or the 2B-boundary is curved in an imaginary cross section perpendicular to the first direction.

In one embodiment, a solar cell includes the silicon substrate described above and a plurality of electrodes on the silicon substrate.

DETAILED DESCRIPTION

Figure 1:
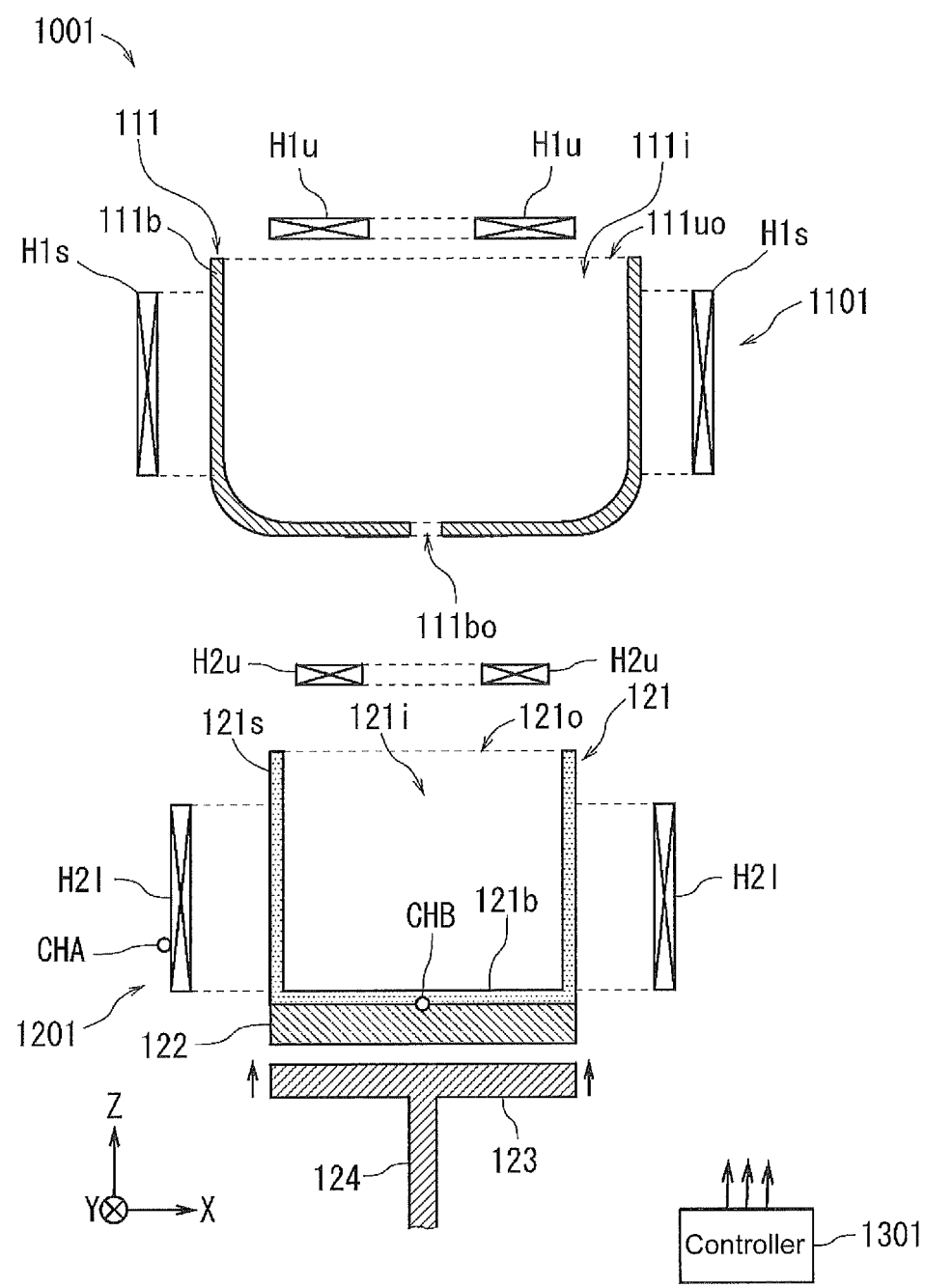
FIG. 1 illustrates an imaginary cross-sectional view of an example first manufacturing apparatus.

Solar cells using polycrystalline silicon substrates (polycrystalline silicon solar cells) have, for example, relatively high conversion efficiency and are suited to mass-manufacturing. Silicon is obtained from, for example, silicon oxide found in large quantities on the earth. Polycrystalline silicon substrates are also relatively easy to produce by, for example, slicing silicon blocks cut out from a silicon ingot obtained by casting. Polycrystalline silicon solar cells thus have a large share of the total solar cell production for many years.

Monocrystalline silicon substrates used in solar cells are, for example, expected to yield higher conversion efficiency than polycrystalline silicon substrates.

For example, a silicon ingot having a portion of a crystal similar to a monocrystal (mono-like crystal) may thus be manufactured by mono-like casting in which crystal grains are grown upward from a seed crystal placed on the bottom of a mold using silicon melt. The mono-like crystal inherits the crystal orientation of the seed crystal and grows unidirectionally. The mono-like crystal is allowed to include, for example, a certain number of dislocations or grain boundaries.

In the same manner as common casting, mono-like casting tends to have, for example, distortions and defects originating from the side walls of the mold during manufacture of a silicon ingot. The silicon ingot is likely to contain many defects at its periphery. Thus, the periphery of the silicon ingot may be cut off to form a silicon block, which is then sliced into high-quality silicon substrates having fewer defects. To reduce the ratio of the periphery to be cut off from the silicon ingot, the silicon ingot may be upsized to increase the areas of its bottom surface and the upper surface. This improves, for example, the productivity of the silicon ingot.

However, for example, the seed crystal to be placed on the bottom of the mold is not easily upsized. To upsize a silicon ingot, for example, multiple seed crystals may be arranged on the bottom of the mold to grow silicon mono-like crystals upward from the bottom in the mold using silicon melt.

However, for example, many defects can occur in portions of the silicon mono-like crystals grown upward from the boundaries at which multiple seed crystals abut against one another and the surroundings of the boundaries. This may cause many defects and thus deteriorate the quality of the silicon ingot, the silicon block, and the silicon substrate.

The inventors of the present disclosure have developed a technique for improving the quality of the silicon ingot, the silicon block, the silicon substrate, and the solar cell.

A first embodiment and its modifications will now be described with reference to the drawings. Throughout the drawings, components with the same structures and functions are given the same reference numerals and will not be described repeatedly. The drawings are schematic. A right-handed XYZ coordinate system is defined in FIGS. 1, 2, 4 to 5B, 8A to 11, and 13 to 35B. In the XYZ coordinate system, the positive Z-direction is parallel to the height of a mold 121, silicon ingots In1, In1a, and In1b, and silicon blocks Bk1, Bk1a, and Bk1b and to the thickness of silicon substrates 1, 1a, and 1b. In the XYZ coordinate system, the positive X-direction is parallel to a width of each of the mold 121, the silicon ingots In1, In1a, and In1b, the silicon blocks Bk1, Bk1a, and Bk1b, and the silicon substrates 1, 1a, and 1b. The positive Y-direction is orthogonal to both the positive X-direction and the positive Z-direction.

1. First Embodiment

1-1. Manufacturing Apparatus for Silicon Ingot

A manufacturing apparatus for an ingot of silicon (silicon ingot) In1 (refer to FIGS. 19A and 19B) according to a first embodiment includes, for example, a manufacturing apparatus 1001 operable in a first manner (first manufacturing apparatus) and a manufacturing apparatus 1002 operable in a second manner (second manufacturing apparatus). The first manufacturing apparatus 1001 and the second manufacturing apparatus 1002 are both used to manufacture a silicon ingot In1 having a portion of a crystal similar to a monocrystal (mono-like crystalline portion) by mono-like casting, in which crystal grains are grown from a seed crystal assembly placed on a bottom 121b of a mold 121.

1-1-1. First Manufacturing Apparatus

The first manufacturing apparatus 1001 will now be described with reference to FIG. 1. With the first manufacturing apparatus 1001, a silicon ingot is manufactured by solidifying, in the mold 121, molten silicon liquid (silicon melt) poured from a crucible 111 into the mold 121 (pouring method).

As shown in FIG. 1, the first manufacturing apparatus 1001 includes, for example, an upper unit 1101, a lower unit 1201, and a controller 1301.

The upper unit 1101 has, for example, the crucible 111, a first upper heater H1u, and a side heater H1s. The lower unit 1201 includes, for example, the mold 121, a mold holder 122, a cooling plate 123, a rotational shaft 124, a second upper heater H2u, a lower heater H21, a first temperature measurer CHA, and a second temperature measurer CHB. The crucible 111 and the mold 121 are formed from, for example, a material unlikely to melt, deform, decompose, and react with silicon at temperatures at or above the melting point of silicon. Impurity content is reduced in the material.

The crucible 111 includes, for example, a body 111b. The overall shape of the body 111b is substantially a bottomed cylinder. The crucible 111 has, for example, a first internal space 111i and an upper opening (first upper opening) 111uo. The first internal space 111i is surrounded by the body 111b. For example, the first upper opening 111uo connects the first internal space 111i to an upper space outside the crucible 111. For example, the body 111b also has a lower opening 111bo through the bottom of the body 111b. The body 111b is formed from, for example, quartz glass. The first upper heater H1u is, for example, directly above the first upper opening 111uo and is annular as viewed in plan. The side heater H1s surrounds, for example, the side surface of the body 111b and is annular as viewed in plan.

For example, to manufacture the silicon ingot In1 with the first manufacturing apparatus 1001, multiple lumps of solid silicon (silicon lumps) as the material of the silicon ingot In1 are placed in the first internal space 111i of the crucible 111 in the upper unit 1101 through the first upper opening 111uo. The silicon lumps may contain, for example, silicon in powder form (silicon powder). The silicon lumps placed in the first internal space 111i is, for example, melted by heating with the first upper heater H1u and the side heater H1s. For example, silicon lumps on the lower opening 111bo melted by heating cause silicon melt MS1 (refer to FIG. 10) in the first internal space 111i to be poured into the mold 121 in the lower unit 1201 through the lower opening 111bo. In one example, the upper unit 1101 may not have the lower opening 111bo in the crucible 111. In this case, the crucible 111 may be tilted to cause the silicon melt MS1 to be poured into the mold 121 from the crucible 111.

The overall shape of the mold 121 is a bottomed tube. The mold 121 includes, for example, a bottom 121b and a side wall 121s. The mold 121 has, for example, a second internal space 121i and an upper opening (second upper opening) 121o. For example, the second internal space 121i is surrounded by the bottom 121b and the side wall 121s. For example, the second upper opening 1210 connects the second internal space 121*i* to an upper space outside the mold 121. In other words, for example, the second upper opening 1210 is open in the positive Z-direction as a first direction. The second upper opening 1210 is, for example, at an end of the mold 121 in the positive Z-direction. The bottom 121*b* and the second upper opening 1210 are, for example, square. Each of the bottom 121*b* and the second upper opening 1210 is, for example, about 300 to 800 millimeters (mm) on a side. The second upper opening 1210 can receive, for example, the silicon melt MS1 poured into the second internal space 121*i* from the crucible 111. The side wall 121*s* and the bottom 121*b* are formed from, for example, silica. The side wall 121*s* may include, for example, a combination of a carbon fiber-reinforced carbon composite and felt as a heat insulating material.

As shown in FIG. 1, the second upper heater H2*u* is, for example, directly above the second upper opening 1210 in the mold 121 and is looped. Being looped includes being circular, triangular, quadrangular, or polygonal. For example, the lower heater H21 is looped and surrounds a portion of the side wall 121*s* of the mold 121 from the bottom to the top in the positive Z-direction. The lower heater H21 may be, for example, divided into multiple sections for separate temperature control.

The mold holder 122 holds the mold 121 from, for example, below and is in close contact with the bottom 121*b* of the mold 121. The mold holder 122 may be formed from, for example, a material with high thermal conductivity such as graphite. The mold holder 122 and the side wall 121*s* of the mold 121 may be, for example, separated from each other by a heat insulator. In this case, for example, the mold holder 122 may conduct more heat from the bottom 121*b* than from the side wall 121*s* to the cooling plate 123. The heat insulator may be formed from, for example, a heat insulating material such as felt.

The cooling plate 123 is raised or lowered as the rotational shaft 124 is rotated, for example. For example, the cooling plate 123 is raised as the rotational shaft 124 is rotated and comes in contact with the lower surface of the mold holder 122. For example, the cooling plate 123 is lowered as the rotational shaft 124 is rotated and separates from the lower surface of the mold holder 122. In other words, the cooling plate 123 can be, for example, in contact with and separate from the lower surface of the mold holder 122. The cooling plate 123 coming in contact with the lower surface of the mold holder 122 is referred to as contacting. The cooling plate 123 may include, for example, a hollow metal plate or another structure through which water or gas circulates. For example, during manufacture of the silicon ingot In1 using the first manufacturing apparatus 1001, the cooling plate 123 may be placed into contact with the lower surface of the mold holder 122 to remove heat from the silicon melt MS1 contained in the second internal space 121*i* of the mold 121. During the heat removal, heat from the silicon melt MS1 transfers through, for example, the bottom 121*b* of the mold 121 and the mold holder 122 to the cooling plate 123. The cooling plate 123 thus cools, for example, the silicon melt MS1 from the portion near the bottom 121*b*.

The first temperature measurer CHA and the second temperature measurer CHB measure, for example, temperature. For example, the second temperature measurer CHB is optional. The first temperature measurer CHA and the second temperature measurer CHB measure temperature with, for example, a thermocouple coated with a thin alumina or carbon tube. The controller 1301 includes, for example, a temperature detector that detects temperature corresponding to the voltage generated by each of the first temperature measurer CHA and the second temperature measurer CHB. The first temperature measurer CHA is, for example, adjacent to the lower heater H21. The second temperature measurer CHB is, for example, adjacent to the lower surface of the bottom 121*b* of the mold 121 in the middle on the lower surface.

The controller 1301 controls, for example, the overall operation of the first manufacturing apparatus 1001. The controller 1301 has, for example, a processor, a memory, and a storage. The controller 1301 performs, for example, various control operations by executing a program stored in the storage with the processor. For example, the controller 1301 controls the outputs from the first upper heater H1*u*, the second upper heater H2*u*, the side heater H1*s*, and the lower heater H21. The controller 1301 controls the outputs from the first upper heater H1*u*, the second upper heater H2*u*, the side heater H1*s*, and the lower heater H21 in accordance with, for example, at least one of an elapsed time or the temperatures obtained with the first temperature measurer CHA and the second temperature measurer CHB. The controller 1301 is capable of controlling the rotational shaft 124 to raise or lower the cooling plate 123 in accordance with, for example, at least one of an elapsed time or the temperatures obtained with the first temperature measurer CHA and the second temperature measurer CHB. The controller 1301 thus controls, for example, the cooling plate 123 to be in contact with or separate from the lower surface of the mold holder 122.

1-1-2. Second Manufacturing Apparatus

The second manufacturing apparatus 1002 will now be described with reference to FIG. 2. With the second manufacturing apparatus 1002, the silicon ingot In1 is manufactured by solidifying silicon melt MS1 resulting from melting multiple solid silicon lumps as a material of the silicon ingot In1 in the mold 121 (in-mold melting method).

Figure 2:
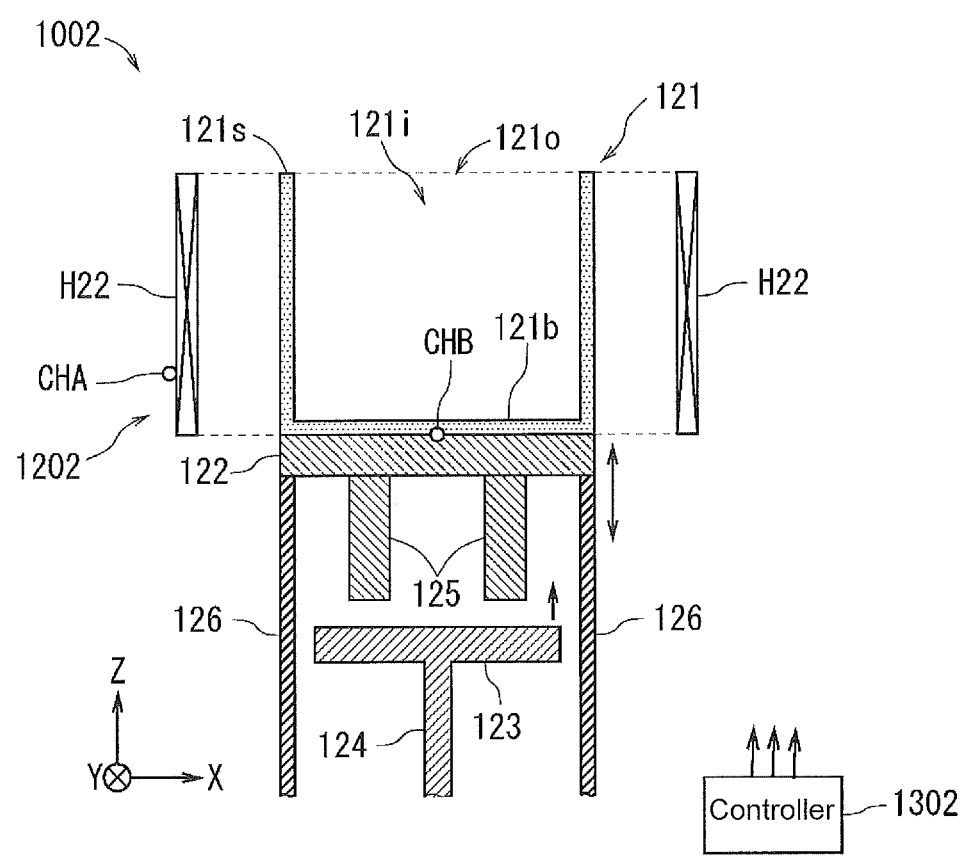
FIG. 2 illustrates an imaginary cross-sectional view of an example second manufacturing apparatus.

As shown in FIG. 2, the second manufacturing apparatus 1002 includes, for example, a main unit 1202 and a controller 1302.

The main unit 1202 includes, for example, the mold 121, the mold holder 122, the cooling plate 123, the rotational shaft 124, a heat conductor 125, a mold support 126, a side heater H22, the first temperature measurer CHA, and the second temperature measurer CHB. The same components and the functions as those in the first manufacturing apparatus 1001 are given the same names and reference numerals. The components and the functions in the second manufacturing apparatus 1002 different from those in the first manufacturing apparatus 1001 will be described below.

The heat conductor 125 is connected to, for example, the bottom of the mold holder 122. The heat conductor 125 includes, for example, multiple members (heat conductor members) connected to the bottom of the mold holder 122. For example, the multiple heat conductor members are four heat conductor members. The heat conductor members may be formed from, for example, a material with high thermal conductivity such as graphite. For example, the cooling plate 123 is raised as the rotational shaft 124 is rotated and comes in contact with the bottom of the heat conductor 125. For example, the cooling plate 123 is lowered as the rotational shaft 124 is rotated and separates from the bottom of the heat conductor 125. In other words, the cooling plate 123 can be, for example, in contact with and separate from the bottom of the heat conductor 125. More specifically, the cooling plate 123 can be, for example, in contact with and separate from the bottom of each heat conductor member. The cooling plate 123 coining in contact with the bottom of the heat conductor 125 is referred to as contacting. For example, during manufacture of the silicon ingot In1 using the second manufacturing apparatus 1002, the cooling plate 123 may be placed into contact with the bottom of the heat conductor 125 to remove heat from the silicon melt MS1 contained in the second internal space 121*i* of the mold 121. During the heat removal, for example, heat from the silicon melt MS1 transfers through, for example, the bottom 121*b* of the mold 121, the mold holder 122, and the heat conductor 125 to the cooling plate 123. The cooling plate 123 thus cools, for example, the silicon melt MS1 from the portion near the bottom 121*b*.

For example, the side heater H22 is looped as viewed in plan and surrounds a portion of the side wall 121*s* of the mold 121 from the bottom to the top in the positive Z-direction. The first temperature measurer CHA is, for example, adjacent to the side heater H22. The side heater H22 may be, for example, divided into multiple sections for separate temperature control.

The mold support 126 supports, for example, the mold holder 122 from below. The mold support 126 includes, for example, multiple rods connected to the mold holder 122 to support the mold holder 122 from below. The multiple rods are vertically movable with a raising and lowering device such as a ball screw or an air cylinder. The mold support 126 can thus raise and lower the mold 121 with the mold holder 122.

The controller 1302 controls, for example, the overall operation of the second manufacturing apparatus 1002. The controller 1302 includes, for example, a processor, a memory, and a storage. The controller 1302 performs, for example, various control operations by executing a program stored in the storage with the processor. For example, the controller 1302 controls the output from the side heater H22, the raising and lowering of the cooling plate 123 performed by the rotational shaft 124, and the raising and lowering of the mold 121 performed by the mold support 126. The controller 1302 controls the output from the side heater H22 and the contact and separation of the cooling plate 123 with and from the bottom of the heat conductor 125 in accordance with, for example, at least one of an elapsed time or the temperatures obtained with the first temperature measurer CHA and the second temperature measurer CHB. The controller 1302 includes, for example, a temperature detector that detects temperature corresponding to the voltage generated by each of the first temperature measurer CHA and the second temperature measurer CHB.

Figure 3:
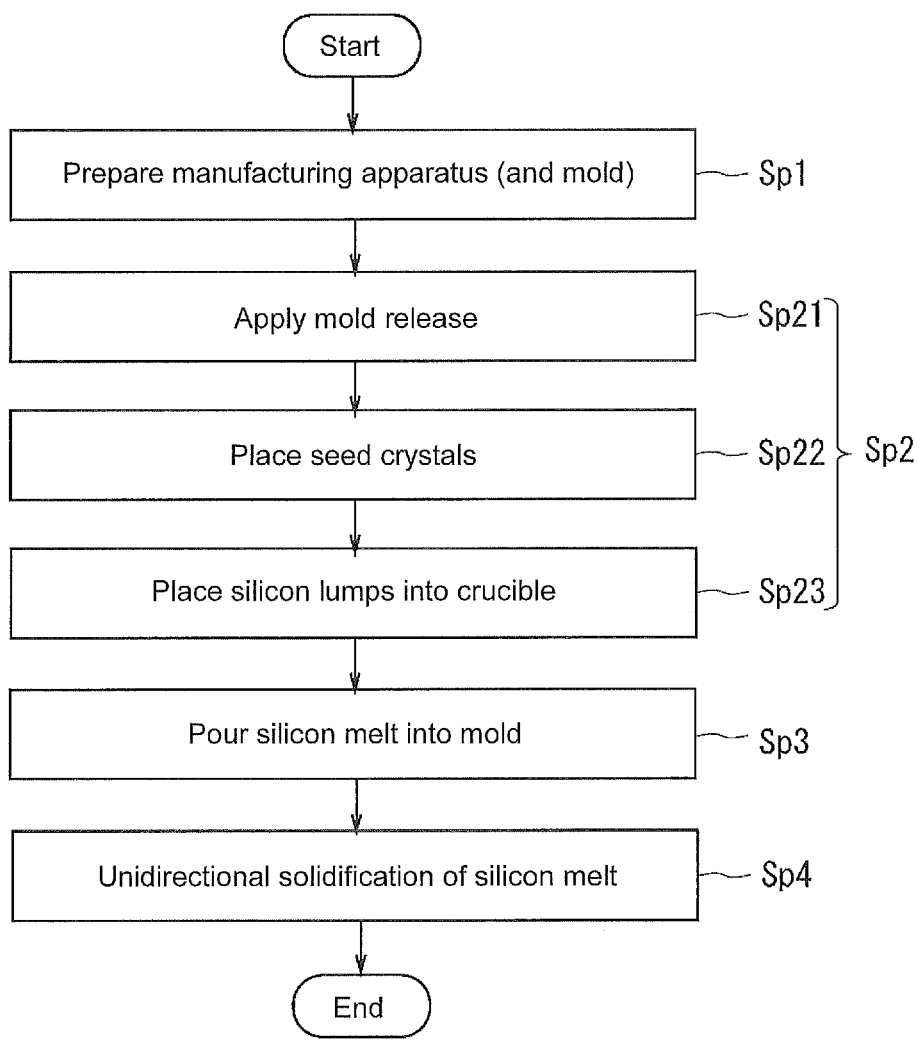
FIG. 3 illustrates a flowchart of an example manufacturing process of a silicon ingot performed using the first manufacturing apparatus.

1-2. Manufacturing Method for Silicon Ingot 1-2-1. Manufacturing Method for Silicon Ingot Using First Manufacturing Apparatus A manufacturing method for the silicon ingot In1 using the first manufacturing apparatus 1001 will be described with reference to FIGS. 3 to 11. As shown in FIG. 3, the manufacturing method for the silicon ingot In1 using the first manufacturing apparatus 1001 includes, for example, a first process in step Sp1, a second process in step Sp2, a third process in step Sp3, and a fourth process in step Sp4 performed in this order. The method allows easy manufacture of the high quality silicon ingot In1 with the crystal orientations aligned. FIGS. 4 to 5B and 8A to 11 show both the crucible 111 and the mold 121 or the mold 121 alone in each process.

First Process (Step Sp1)

In the first process in step Sp1, the first manufacturing apparatus 1001 is prepared.

The first manufacturing apparatus 1001 includes, for example, the mold 121 having the second upper opening 1210 that is open in the positive Z-direction as the first direction.

Second Process (Step Sp2)

In the second process in step Sp2, for example, a seed crystal assembly 200*s* of silicon monocrystals is placed on the bottom 121*b* of the mold 121 prepared in the first process.

In the second process, three steps including step Sp21, step Sp22, and step Sp23 are perfoinied in this order.

Figure 4:
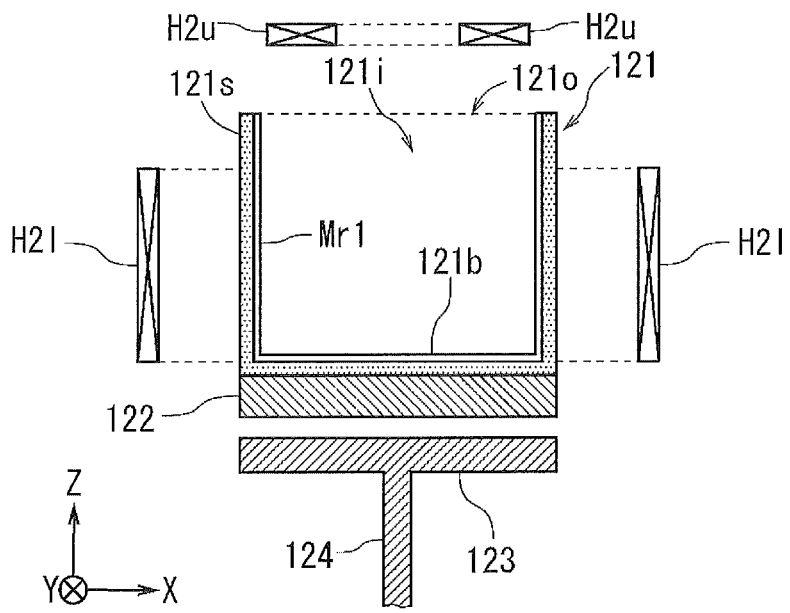
FIG. 4 illustrates an imaginary cross-sectional view of an example mold and its surrounding parts included in the first manufacturing apparatus, with the inner wall of the mold coated with a mold release.

In step Sp21, as shown in the example in FIG. 4, a mold release is applied to the inner wall surface of the mold 121 to form a layer Mn1 of the mold release (a mold release layer). The mold release layer Mr1 reduces, for example, the likelihood of the silicon ingot In1 fusing to the inner wall of the mold 121 while the silicon melt MS1 is solidifying in the mold 121. The mold release layer Mr1 may be formed from, for example, at least one material selected from, for example, silicon nitride, silicon carbide, and silicon oxide. The mold release layer Mr1 may include, for example, a coating of slurry applied or sprayed to the inner wall surface of the mold 121. The slurry includes at least one selected from, for example, silicon nitride, silicon carbide, and silicon oxide. The slurry is prepared by, for example, adding, to a solution containing mainly an organic binder such as polyvinyl alcohol (PVA) and a solvent, powder of one of silicon nitride, silicon carbide, or silicon oxide or powder mixture of at least two of those materials, and stirring the resultant solution.

Figure 5A:
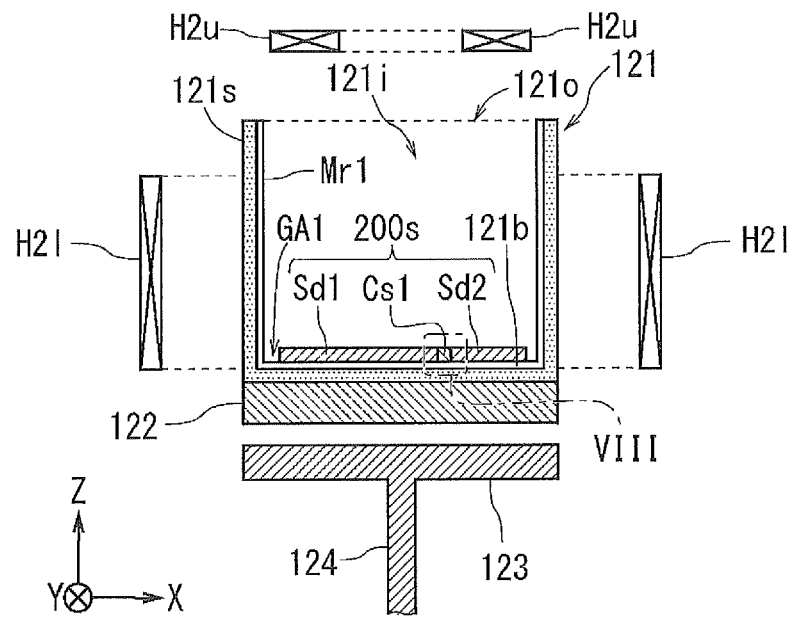
FIG. 5A illustrates an imaginary cross-sectional view of the mold and its surrounding parts included in the first manufacturing apparatus, with seed crystals placed on the bottom of the mold.
Figure 5B:
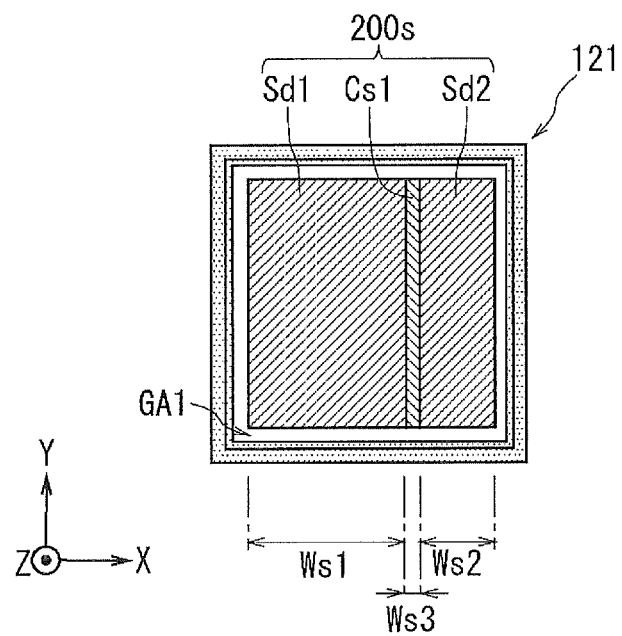
FIG. 5B illustrates a plan view of the mold in the first manufacturing apparatus, with the seed crystals placed on the bottom of the mold.

In the step Sp22, as shown in FIGS. 5A and 5B, the seed crystal assembly 200*s* is placed on the bottom 121*b* of the mold 121. The seed crystal assembly 200*s* may be attached to, for example, the mold release layer Mr1 formed on the inner wall surface of the mold 121 in step Sp21 before the mold release layer Mr1 is dried.

For example, the upper surface of the seed crystal assembly 200*s* facing in the positive Z-direction as the first direction may have the Miller indices of (100). In this case, the seed crystal assembly 200*s* may be easily prepared, and the crystal growth rate may be increased during unidirectional solidification of the silicon melt MS1 described later. As shown in the example in FIG. 5B, the upper surface of the seed crystal assembly 200*s* is rectangular or square as viewed in plan. The seed crystal assembly 200*s* may be, for example, thick enough not to melt at the bottom 121*b* when the silicon melt MS1 is poured into the mold 121 from the crucible 111. More specifically, the seed crystal assembly 200*s* has a thickness of, for example, about 5 to 70 mm. The seed crystal assembly 200*s* may have a thickness of, for example, about 10 to 30 mm.

For example, the seed crystal assembly 200*s* including multiple seed crystals is placed on the bottom 121*b* to upsize the bottom area of the silicon ingot In1 for increasing casting efficiency and to cover the difficulty of forming a large seed crystal. The seed crystal assembly 200*s* includes, for example, a first seed crystal Sd1, a second seed crystal Sd2, and a first intermediate seed crystal Cs1. More specifically, for example, the first seed crystal Sd1, the first intermediate seed crystal Cs1, and the second seed crystal Sd2 are arranged on the bottom 121*b* of the mold 121 adjacent to one another in the stated order in the positive X-direction as a second direction perpendicular to the positive Z-direction as the first direction. In other words, for example, the first intermediate seed crystal Cs1 is between the first seed crystal Sd1 and the second seed crystal Sd2. Each of the first seed crystal Sd1 and the second seed crystal Sd2 is a monocrystal of silicon (or simply a seed crystal). The first intermediate seed crystal Cs1 is a section containing one or more silicon mono crystals (or simply an intermediate seed crystal). Each of the first seed crystal Sd1, the second seed crystal Sd2, and the first intermediate seed crystal Cs1 has, for example, a rectangular profile as viewed in plan or in the negative Z-direction. The profile may be other than a rectangle.

The first intermediate seed crystal Cs1 has a width (third seed width) Ws3 less than each of a width (first seed width) Ws1 of the first seed crystal Sd1 and a width (second seed width) Ws2 of the second seed crystal Sd2 in the positive X-direction as the second direction. In other words, each of the first seed width Ws1 and the second seed width Ws2 is greater than the third seed width Ws3 in the positive X-direction as the second direction. In this example, the bottom 121b has, for example, a rectangular or square inner wall surface that is about 350 mm on a side. In this case, each of the first seed width Ws1 and the second seed width Ws2 is, for example, about 50 to 250 mm. The third seed width Ws3 is, for example, about 5 to 20 mm.

Each of the first seed crystal Sd1 and the second seed crystal Sd2 is, for example, a monocrystalline silicon plate or block. The first intermediate seed crystal Cs1 contains, for example, one or more monocrystalline silicon rods. In other words, for example, each of the first seed crystal Sd1, the second seed crystal Sd2, and the first intermediate seed crystal Cs1 contains the same monocrystalline silicon material. The first intermediate seed crystal Cs1 is, for example, elongated in the positive Y-direction as a third direction, which is orthogonal to both the positive Z-direction as the first direction and the positive X-direction as the second direction. For example, the first intermediate seed crystal Cs1 may be formed from a single silicon monocrystal, two or more silicon monocrystals arranged in the positive Y-direction as the third direction, or two or more silicon monocrystals arranged in the positive X-direction as the second direction.

For example, the first seed crystal Sd1 and the first intermediate seed crystal Cs1 have a first rotation angle relationship between their silicon monocrystals about an imaginary axis parallel to the positive Z-direction as the first direction. For example, the first intermediate seed crystal Cs1 and the second seed crystal Sd2 have a second rotation angle relationship between their silicon monocrystals about an imaginary axis parallel to the positive Z-direction as the first direction. In this case, in step Sp22, the seed crystals in the seed crystal assembly 200s are, for example, arranged to allow the first rotation angle relationship and the second rotation angle relationship to be a rotation angle relationship of silicon monocrystals corresponding to a coincidence boundary. The coincidence boundary may occur between two neighboring crystal grains having the same crystal lattices and having the relationship of being rotated relative to each other about a rotation axis parallel to their shared crystal direction. When the crystal lattices shared by the two crystal grains are located to faun lattice points arranged regularly, the grain boundary is referred to as a coincidence boundary. The two neighboring crystal grains across the coincidence boundary may be referred to as a first crystal grain and a second crystal grain. When the crystal lattices in the first crystal grain have lattice points shared by the crystal lattices in the second crystal grain for every N lattice points at the coincidence boundary, the period N indicating the occurrence frequency of such a lattice point is referred to as a $\Sigma$ value of the coincidence boundary.

Figure 6:
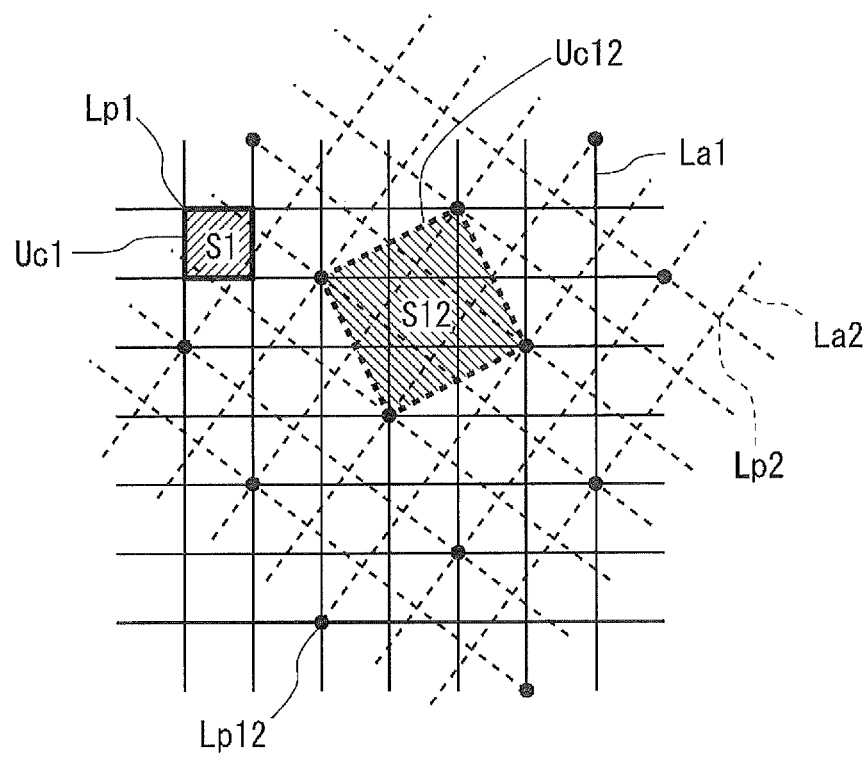
FIG. 6 illustrates a diagram describing Σ values.
Figure 6:
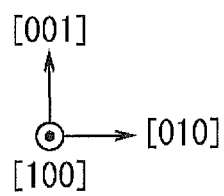

The $\Sigma$-value will be described using a simple cubic lattice as an example. In FIG. 6, a simple cubic lattice has lattice points Lp1 on a plane having the Miller indices of (100) at intersections between multiple vertical and horizontal solid lines La1 orthogonal to each other. In the example in FIG. 6, the square defined by the thick solid line is a unit cell (first unit cell) Uc1 of the simple cubic lattice. In FIG. 6, the simple cubic lattice is rotated clockwise by 36.52 degrees (36.52°) about a crystal axis parallel to a direction having the Miller indices of as a rotation axis. The resultant simple cubic lattice has lattice points Lp2 on a plane having the Miller indices of (100) at intersections of multiple broken lines La2 orthogonal to each other. A point (coincidence lattice point) Lp12 at which a lattice point Lp1 before rotation overlaps a lattice point Lp2 after rotation occurs periodically. In FIG. 6, the dots indicate the periodically-occurring coincidence lattice points Lp12. In the example in FIG. 6, multiple coincidence lattice points Lp12 form a lattice (coincidence lattice) including a unit cell (coincidence unit cell) Uc12 indicated by the square defined by the thick broken line. The E value is used as an index representing the degree of coincidence (the density of coincidence lattice points) between the simple cubic lattice before rotation (first lattice) including its lattice points Lp1 at the intersections between the solid lines La1 and the simple cubic lattice after rotation (second lattice) including its lattice points Lp2 at the intersections between the broken lines La2. In the example in FIG. 6, the E value may be calculated by dividing an area S12 of the coincidence unit cell Uc12 by an area S1 of the first unit cell Uc1. More specifically, the $\Sigma$ value may be calculated by the formula $\Sigma$ value=(the area of the coincidence unit cell)/(the area of the first unit cell)=(S12)/(S1). In the example in FIG. 6, the calculated $\Sigma$ value is 5. The $\Sigma$ value calculated in this manner may be used as an index representing the degree of coincidence between the first and second lattices adjacent to one another across a grain boundary with a predetermined rotation angle relationship. In other words, the $\Sigma$ value may be used as an index representing the degree of coincidence between two neighboring crystal grains across a grain boundary having the predetermined rotation angle relationship and the same crystal lattices.

The rotation angle relationship of silicon monocrystals corresponding to the coincidence boundary may allow an error margin of, for example, 1 to 3 degrees. The error may occur when, for example, preparing the first seed crystal Sd1, the second seed crystal Sd2, and the first intermediate seed crystal Cs1 by cutting and when arranging the first seed crystal Sd1, the second seed crystal Sd2, and the first intermediate seed crystal Cs1. Such errors may be reduced during, for example, unidirectional solidification of the silicon melt MS1 (described later).

In this example, the upper surface of each of the first seed crystal Sd1, the second seed crystal Sd2, and the first intermediate seed crystal Cs1 facing in the positive Z-direction as the first direction has the Miller indices of (100). In other words, the crystal direction of each of the first seed crystal Sd1, the second seed crystal Sd2, and the first intermediate seed crystal Cs1 parallel to the positive Z-direction as the first direction has the Miller indices of <100>.

In this case, for example, the coincidence boundary is one of a $\Sigma5$ coincidence boundary, a $\Sigma13$ coincidence boundary, a $\Sigma17$ coincidence boundary, a $\Sigma25$ coincidence boundary, or a $\Sigma29$ coincidence boundary. The rotation angle relationship of silicon monocrystals corresponding to the $\Sigma5$ coincidence boundary may be, for example, about 36 to 37 degrees or about 35 to 38 degrees. The rotation angle relationship of silicon monocrystals corresponding to the Σ13 coincidence boundary may be, for example, about 22 to 23 degrees or about 21 to 24 degrees. The rotation angle relationship of silicon monocrystals corresponding to the Σ17 coincidence boundary may be, for example, about 26 to 27 degrees or about 25 to 28 degrees. The rotation angle relationship of silicon monocrystals corresponding to the Σ25 coincidence boundary may be, for example, about 16 to 17 degrees or about 15 to 18 degrees. The rotation angle relationship of silicon monocrystals corresponding to the Σ29 coincidence boundary (random boundary) may be, for example, about 43 to 44 degrees or about 42 to 45 degrees. The crystal orientation of each of the first seed crystal Sd1, the second seed crystal Sd2, and the first intermediate seed crystal Cs1 may be identified by measurement using, for example, X-ray diffraction or electron backscatter diffraction patterns (EBSDs).

In this example, the first seed crystal Sd1, the second seed crystal Sd2, and the first intermediate seed crystal Cs1 are arranged to cause their upper surface with the Miller indices of (100) to face in the positive Z-direction as the first direction. This may improve, for example, the crystal growth rate during unidirectional solidification of the silicon melt MS1 described later. Thus, for example, mono-like crystals are easily obtained by growing crystal grains upward from each of the first seed crystal Sd1, the second seed crystal Sd2, and the first intermediate seed crystal Cs1. The quality of the silicon ingot In1 may thus be easily improved.

Figure 7A:
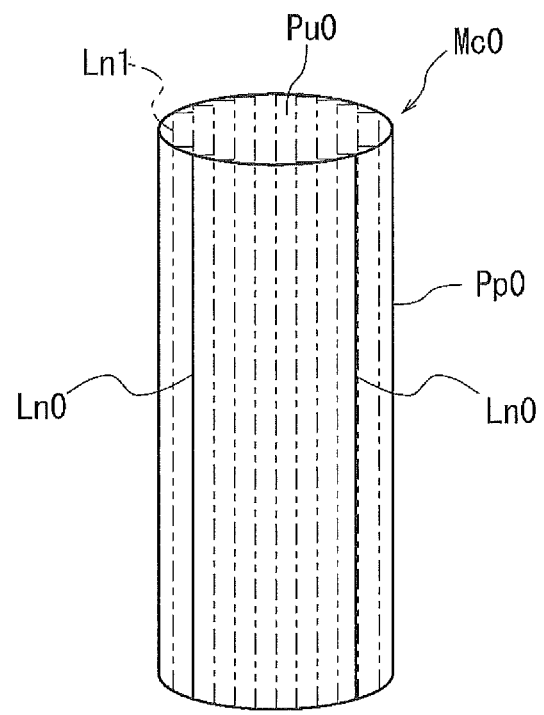
FIG. 7A illustrates diagram illustrating example preparation of seed crystals.
Figure 7B:
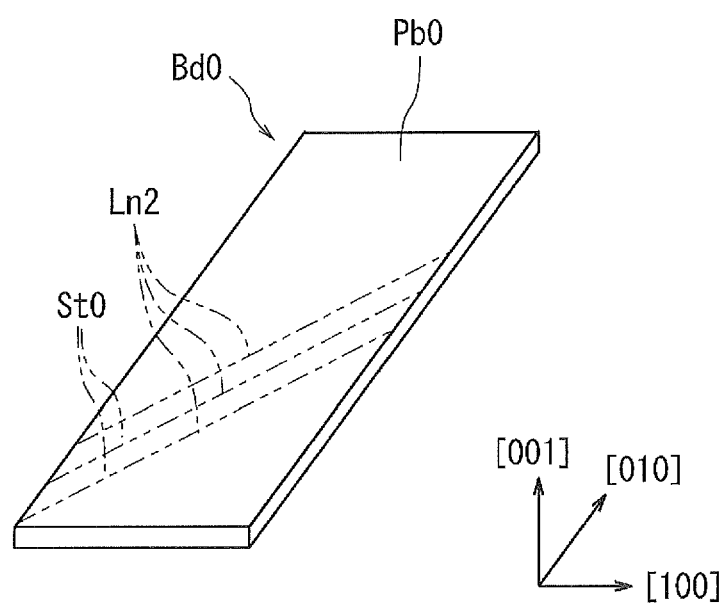
FIG. 7B illustrates a perspective view of an example seed crystal.

Each of the first seed crystal Sd1, the second seed crystal Sd2, and the first intermediate seed crystal Cs1 may be prepared in the manner described below, for example. As shown in the example in FIG. 7A, a cylindrical lump of monocrystalline silicon (monocrystalline silicon lump) Mc0 is first obtained using the Czochralski (CZ) method by setting the crystal direction parallel to the direction in which the monocrystalline silicon is grown to have the Miller indices of <100>. In this example, the monocrystalline silicon lump Mc0 has an upper surface Pu0 having the Miller indices of (100) and an outer peripheral surface Pp0 including specific linear portions Ln0 having the Miller indices of (110). As shown in FIG. 7A, the monocrystalline silicon lump Mc0 is then cut with reference to the linear portions Ln0 on the outer peripheral surface Pp0 of the monocrystalline silicon lump Mc0. In FIG. 7A, the position at which the monocrystalline silicon lump Mc0 is cut (cut position) is indicated by imaginary thin two-dot chain lines Ln1. As shown in FIG. 7B, the monocrystalline silicon lump Mc0 may be, for example, cut into multiple plates Bd0 of monocrystalline silicon (monocrystalline silicon plates) each having a rectangular plate surface Pb0 having the Miller indices of (100). The monocrystalline silicon plates Bd0 may be used as, for example, the first seed crystal Sd1 and the second seed crystal Sd2. As shown in FIG. 7B, for example, the monocrystalline silicon plate Bd0 may be cut along the cut position indicated by the imaginary two-dot chain lines Ln2 into rods St0 of monocrystalline silicon (monocrystalline silicon rods). The angle between any one of the four sides of the plate surface Pb0 of the monocrystalline silicon plate Bd0 and any one of the two-dot chain lines Ln2 is the rotation angle between silicon monocrystals corresponding to a coincidence boundary. Each monocrystalline silicon rod St0 obtained as above may be used as, for example, one of silicon monocrystals to be the first intermediate seed crystal Cs1.

Figure 8A:
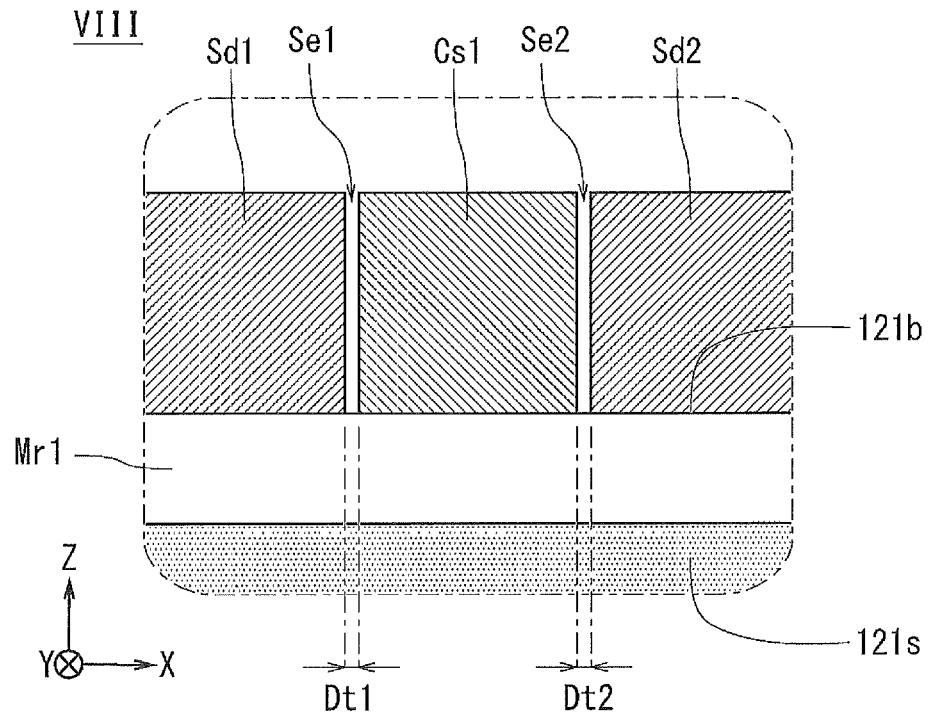
FIG. 8A illustrates an imaginary cross-sectional view of the mold and its surrounding parts containing seed crystals on the bottom of the mold in portion VIII in FIG. 5A in one example.

As shown in FIG. 8A, for example, the first seed crystal Sd1 and the first intermediate seed crystal Cs1 are arranged on the bottom 121b of the mold 121 with a small space (first small space) Se1 having a small width (first small width) Dt1 left in between in the positive X-direction as the second direction. For example, the first intermediate seed crystal Cs1 and the second seed crystal Sd2 are arranged with a small space (second small space) Se2 having a small width (second small width) Dt2 left in between in the positive X-direction as the second direction. The first small width Dt1 and the second small width Dt2 are, for example, about 100 to 500 micrometers (μm).

Figure 8B:
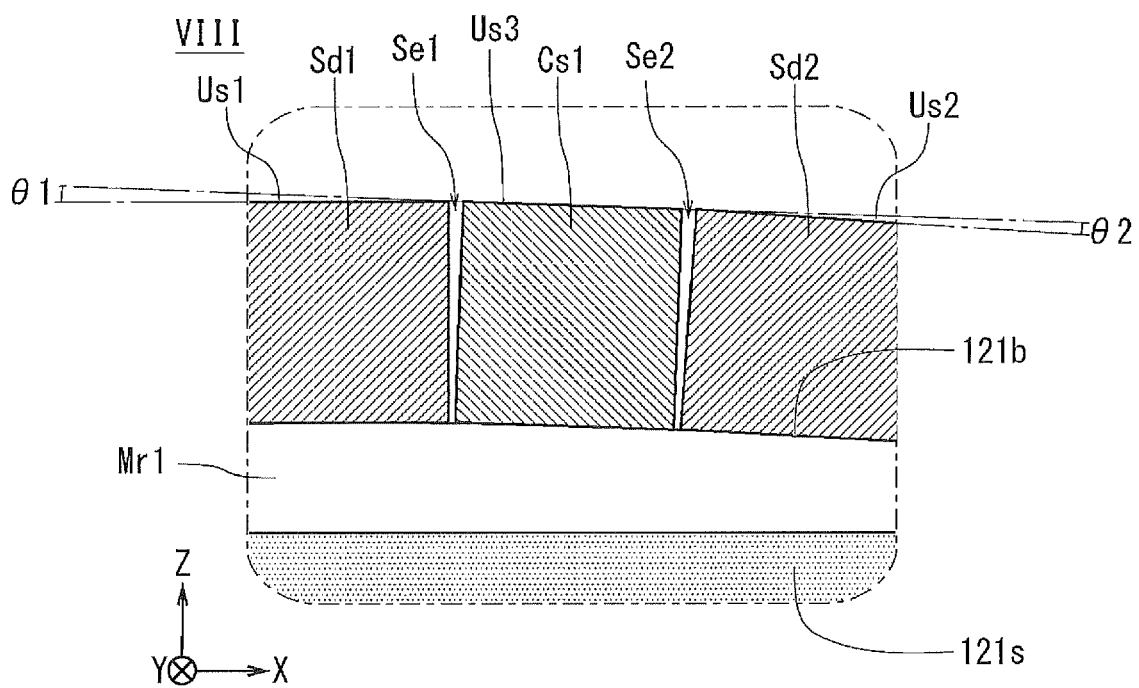
FIG. 8B illustrates an imaginary cross-sectional view of the mold and its surrounding parts containing seed crystals on the bottom of the mold in portion VIII in FIG. 5A in another example.

As shown in FIG. 8B, for example, the first seed crystal Sd1 and the first intermediate seed crystal Cs1 may be arranged on the bottom 121b of the mold 121 to allow the width of the first small space Se1 in the positive X-direction as the second direction between the first seed crystal Sd1 and the first intermediate seed crystal Cs1 to increase slightly at a greater distance in the positive Z-direction as the first direction from the bottom 121b. For example, the first intermediate seed crystal Cs1 and the second seed crystal Sd2 may be arranged on the bottom 121b of the mold 121 to allow the width of the second small space Se2 in the positive X-direction as the second direction between the first intermediate seed crystal Cs1 and the second seed crystal Sd2 to increase slightly at a greater distance in the positive Z-direction as the first direction from the bottom 121b. For example, the upper surface of the first seed crystal Sd1 is a first upper surface Us1, the upper surface of the second seed crystal Sd2 is a second upper surface Us2, and the upper surface of the first intermediate seed crystal Cs2 is a third upper surface Us3. In this case, for example, the first seed crystal Sd1 and the first intermediate seed crystal Cs1 are arranged on the bottom 121b in the mold 121 to allow the first upper surface Us1 and the third upper surface Us3 to be at a low angle (first low angle) θ1. For example, the first intermediate seed crystal Cs1 and the second seed crystal Sd2 are arranged on the bottom 121b of the mold 121 to allow the second upper surface Us2 and the third upper surface Us3 to be at a low angle (second low angle) θ2. The first low angle θ1 and the second low angle θ2 each are about 1 to 3 degrees. Such an arrangement may be achieved with, for example, at least one of the bottom 121b of the mold 121 or the mold release layer Mr1 applied on the bottom 121b slightly protruding in the positive Z-direction as the first direction.

In the lower space of the mold 121, silicon lumps in a solid state may be, for example, placed on the seed crystal assembly 200s of silicon monocrystals arranged on the bottom 121b of the mold 121. For example, the silicon lumps are relatively small silicon pieces.

Figure 9:
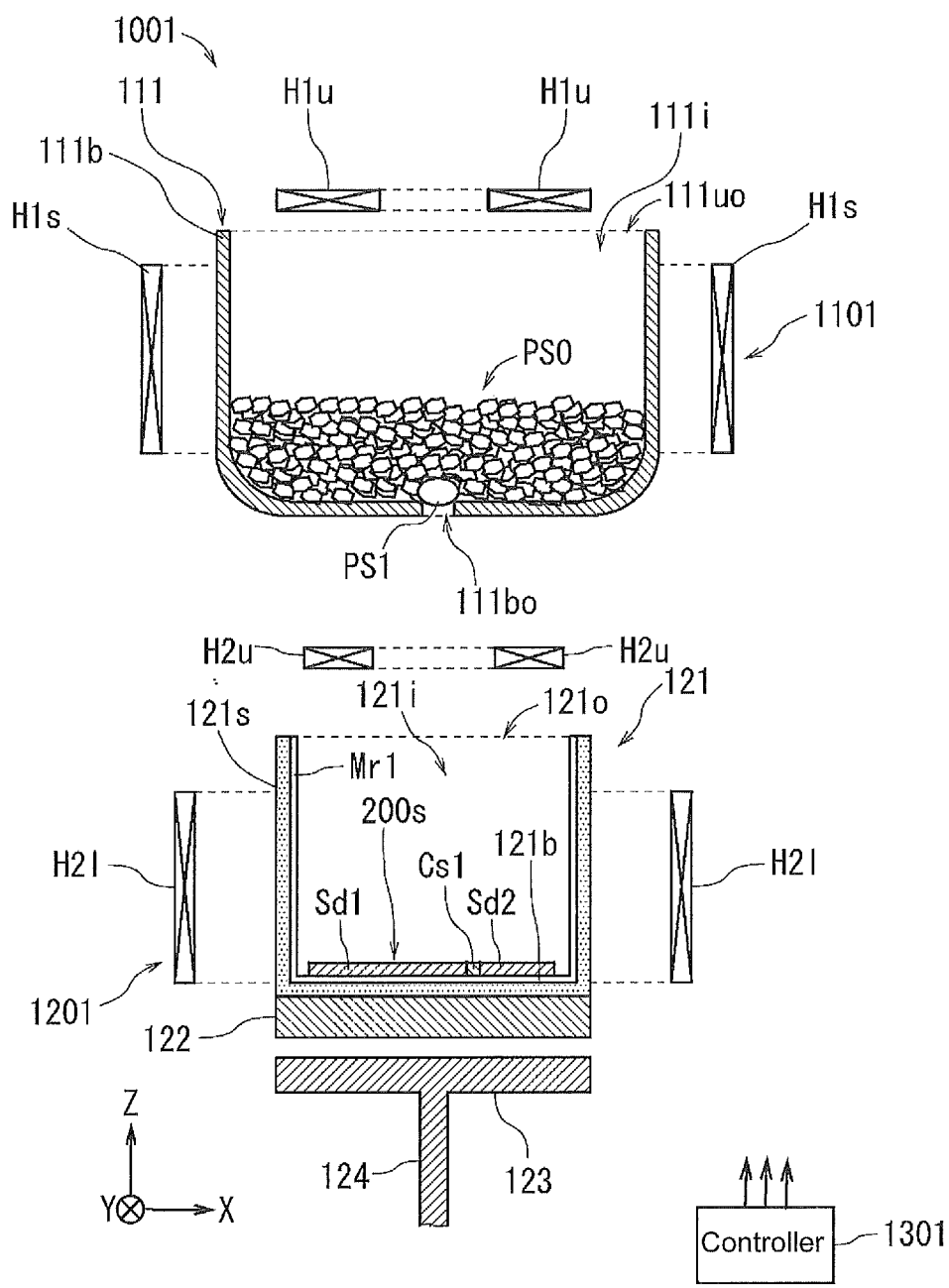
FIG. 9 illustrates an imaginary cross-sectional view of the first manufacturing apparatus, with its crucible containing silicon lumps.

In step Sp23, as shown in FIG. 9, silicon lumps PS0 are placed in the first internal space 111i of the crucible 111. The silicon lumps PS0 are, for example, placed from the lower space toward the upper space of the crucible 111. The silicon lumps PS0 are, for example, mixed with an element to be a dopant in the silicon ingot In1. The silicon lumps PS0 are, for example polysilicon lumps as a material of the silicon ingot In1. The polysilicon lumps are, for example, relatively small silicon pieces. To manufacture a p-type silicon ingot In1, the dopant element is, for example, boron or gallium. To manufacture an n-type silicon ingot In1, the dopant element is, for example, phosphorus. In this example, the lower opening 111bo in the crucible 111 is filled with a silicon lump PS1 for obstruction (obstructive silicon lump). This obstructs, for example, the path from the first internal space 111i to the lower opening 111bo.

For example, the cooling plate 123 may remain separate from the lower surface of the mold holder 122 until the subsequent third process is started.

Third Process (Step Sp3)

In the third process in step Sp3, for example, the seed crystal assembly 200s of silicon monocrystals placed on the bottom 121b of the mold 121 in the second process is heated to around the melting point of silicon, and the silicon melt MS1 is poured into the mold 121. More specifically, the first seed crystal Sd1, the second seed crystal Sd2, and the first intermediate seed crystal Cs1 are heated to around the melting point of silicon, and the silicon melt MS1 is poured into the mold 121.

Figure 10:
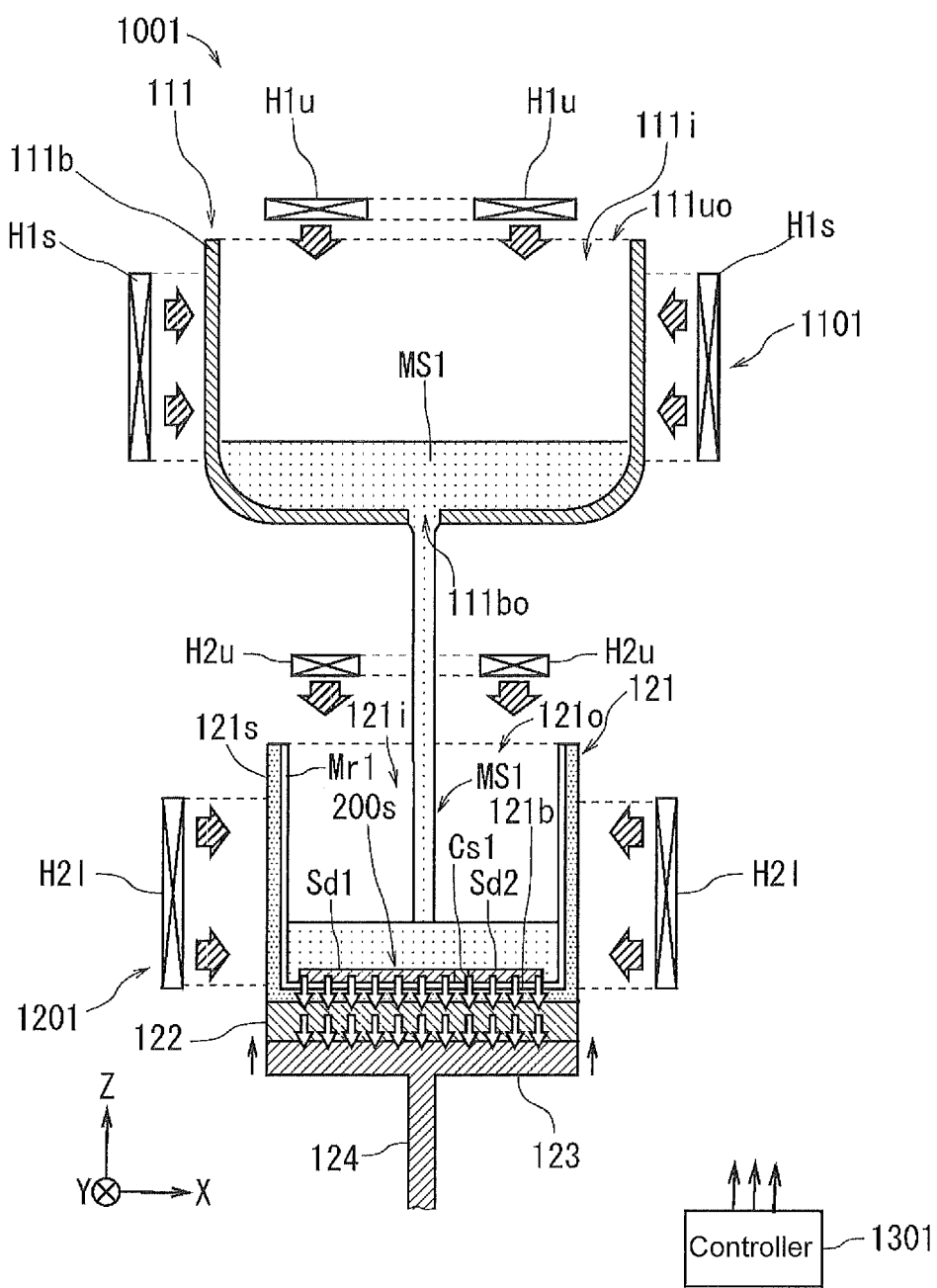
FIG. 10 illustrates an imaginary cross-sectional view of the first manufacturing apparatus, with silicon melt being poured into the mold from the crucible.

In the third process, as shown in the example in FIG. 10, the second upper heater H2u above the mold 121 and the lower heater H21 lateral to the mold 121 raise the temperature of the silicon seed crystal assembly 200s to around 1414° C. or the melting point of silicon. For example, any silicon lumps in a solid state placed on the seed crystal assembly 200s of silicon monocrystals arranged on the bottom 121b of the mold 121 in the second process may be melted. In this case, the seed crystal assembly 200s in close contact with the bottom 121b of the mold 121 transfers heat to the bottom 121b and thus remains unmelted.

In the third process, as shown in the example in FIG. 10, the silicon lumps PS0 placed in the crucible 111 are heated and melted into the silicon melt MS1 to be stored in the crucible 111, as shown in FIG. 10. For example, the first upper heater H1u above the crucible 111 and the side heater H1s lateral to the crucible 111 heat the silicon lumps PS0 to a temperature range of about 1414 to 1500° C. exceeding the melting point of silicon to obtain the silicon melt MS1. In FIG. 10, hatched arrows indicate heat from the heaters. In this state, the obstructive silicon lump PS1 on the lower opening 111bo obstructing the path in the crucible 111 is heated and thus melted. The obstructive silicon lump PS1 may be melted by a dedicated heater. The molten obstructive silicon lump PS1 opens the path from the first internal space 111i in the crucible 111 to the lower opening 111bo. This allows, for example, the silicon melt MS1 in the crucible 111 to be poured into the mold 121 through the lower opening 111bo. Thus, as in the example in FIG. 10, the silicon melt MS1 covers the upper surface of the seed crystal assembly 200s of silicon monocrystals arranged on the bottom 121b of the mold 121.

In the third process, as shown in the example in FIG. 10, the cooling plate 123 is placed into contact with the lower surface of the mold holder 122. This allows, for example, a heat removal from the silicon melt MS1 in the mold 121 to the cooling plate 123 through the mold holder 122. In FIG. 10, solid arrows indicate rising of the cooling plate 123, and outlined arrows indicate transfer of heat from the silicon melt MS1 to the cooling plate 123 through the mold holder 122. The cooling plate 123 may be placed into contact with the lower surface of the mold holder 122 upon, for example, a predetermined elapsed time after the silicon melt MS1 is started to be poured into the mold 121 from the crucible 111 (contacting moment). In another example, the contacting moment may be immediately before the silicon melt MS1 is started to be poured into the mold 121 from the crucible 111. The contacting moment may be controlled in accordance with the temperature detected by the temperature measurers in the first manufacturing apparatus 1001, such as the first temperature measurer CHA and the second temperature measurer CHB.

Fourth Process (Step Sp4)

In the fourth process in step Sp4, for example, the silicon melt MS1 poured into the mold 121 in the third process solidifies unidirectionally (unidirectional solidification) upward from the bottom 121b of the mold 121.

Figure 11:
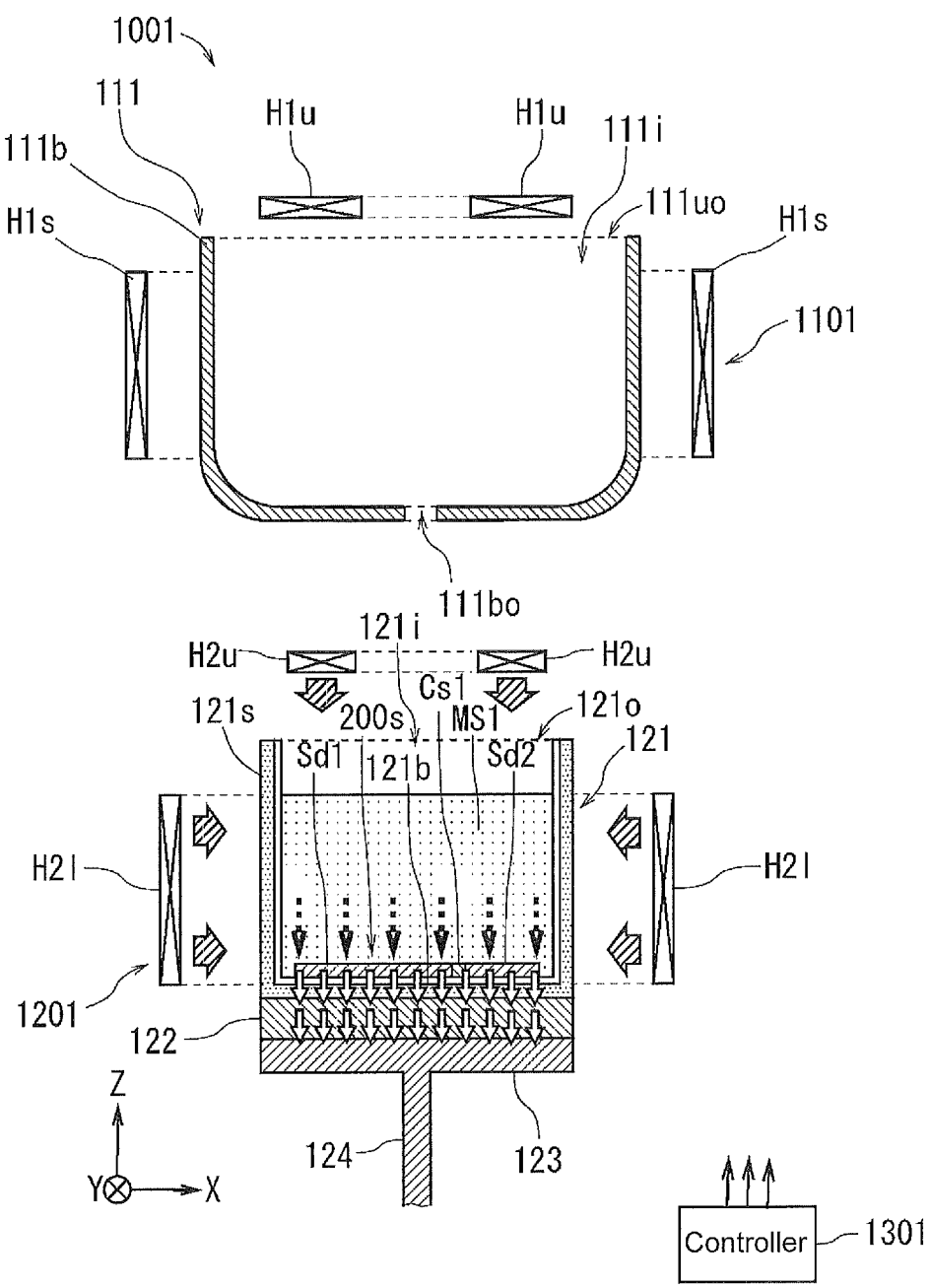
FIG. 11 illustrates an imaginary cross-sectional view of the first manufacturing apparatus, with the silicon melt solidifying unidirectionally in the mold.

In the fourth process, as shown in the example in FIG. 11, the silicon melt MS1 in the mold 121 is cooled from the bottom 121b as heat transfers from the silicon melt MS1 in the mold 121 to the cooling plate 123 through the mold holder 122. This allows, for example, unidirectional solidification of the silicon melt MS1 upward from the bottom 121b. In FIG. 11, thick dashed arrows indicate transfer of heat in the silicon melt MS1, and outlined arrows indicate transfer of heat from the silicon melt MS1 to the cooling plate 123 through the mold holder 122. For example, the outputs from the second upper heater H2u above the mold 121 and the lower heater H21 lateral to the mold 121 are controlled in accordance with the temperatures detected using, for example, the first temperature measurer CHA and the second temperature measurer CHB. In FIG. 11, hatched arrows indicate heat from the heaters. For example, the temperatures around the second upper heater H2u and the lower heater H21 are maintained at around the melting point of silicon. This reduces silicon crystal growth from the side surface of the mold 121 and increases the crystal growth of mono crystalline silicon in the positive Z-direction or upward. The lower heater H21 may be divided into multiple sections, for example. In this case, the second upper heater H2u and a section of the divided lower heater H21 may heat the silicon melt MS1, and another section of the divided lower heater H21 may not heat the silicon melt MS1.

In the fourth process, for example, the silicon melt MS1 slowly solidifies unidirectionally into silicon ingot In1 in the mold 121. During the solidification, for example, mono-like crystals grow from the first seed crystal Sd1, the second seed crystal Sd2, and the first intermediate seed crystal Cs1 included in the seed crystal assembly 200s of monocrystalline silicon.

For example, a mono-like crystal grown from the first seed crystal Sd1 and a mono-like crystal grown from the first intermediate seed crystal Cs1 have the first rotation angle relationship inherited from the first seed crystal Sd1 and the first intermediate seed crystal Cs1. A grain boundary (first functional grain boundary) including a coincidence boundary may form between such mono-like crystals. In other words, a coincidence boundary may form above the boundary between the first seed crystal Sd1 and the first intermediate seed crystal Cs1. For example, a mono-like crystal grown from the first intermediate seed crystal Cs1 and a mono-like crystal grown from the second seed crystal Sd2 have the second rotation angle relationship inherited from the first intermediate seed crystal Cs1 and the second seed crystal Sd2. A grain boundary (second functional grain boundary) including a coincidence boundary may form between such mono-like crystals. In other words, a coincidence boundary may form above the boundary between the first intermediate seed crystal Cs1 and the second seed crystal Sd2. Thus, while the silicon melt MS1 is solidifying unidirectionally, distortions are reduced as the coincidence boundaries form constantly. This may reduce defects in the silicon ingot In1. For example, while the silicon melt MS1 is solidifying unidirectionally, the first seed crystal Sd1 and the second seed crystal Sd2 tend to have dislocations relative to each other. However, the dislocations are likely to disappear at the two functional grain boundaries, being confined in the mono-like crystal portion between the two functional grain boundaries. For example, the third seed width Ws3 of the first intermediate seed crystal Cs1 is less than the first seed width Ws1 of the first seed crystal Sd1 and the second seed width Ws2 of the second seed crystal Sd2. In this case, the resultant silicon ingot In1 may have fewer defects.

For example, the first small space Se1 between the first seed crystal Sd1 and the first intermediate seed crystal Cs1 shown in FIGS. 8A and 8B may cause the first functional grain boundary to form in a curved shape in an imaginary XY plane as the silicon melt MS1 slowly solidifies unidirectionally. For example, the second small space Set between the first intermediate seed crystal Cs1 and the second seed crystal Sd2 shown in FIGS. 8A and 8B may cause the second functional grain boundary to form in a curved shape in an imaginary XY plane as the silicon melt MS1 slowly solidifies unidirectionally. The constantly-forming first and second functional grain boundaries including curves can, for example, easily absorb distortions in various directions. The curves also increase the area of each functional grain boundary to allow easy absorption of distortions. These may reduce defects in the silicon ingot Ir1.

In this manner, for example, the resultant silicon ingot In1 may have fewer defects and thus have higher quality.

For example, in the second process, the first seed crystal Sd1, the second seed crystal Sd2, and the first intermediate seed crystal Cs1 may be arranged to allow the first rotation angle relationship and the second rotation angle relationship to be the rotation angle relationship corresponding to a Σ29 coincidence boundary about an imaginary rotation parallel to a direction having the Miller indices of <100>. In this case, for example, Σ29 coincidence boundaries (random boundaries) may form above the boundaries between the first seed crystal Sd1 and the first intermediate seed crystal Cs1 and between the first intermediate seed crystal Cs1 and the second seed crystal Sd2 while the silicon melt MS1 is solidifying unidirectionally. For example, the random boundaries reduce distortions to cause fewer defects. The resultant silicon ingot In1 may thus have, for example, still fewer defects. Thus, the quality of the silicon ingot In1 may further be improved, for example.

For example, the silicon ingot In1 may have a first portion including one end (first end) in the direction (negative Z-direction) opposite to the first direction (positive Z-direction) and a second portion including the other end (second end) opposite the first end. When the silicon ingot In1 has a total length of 100 from the first end to the second end, the first portion may extend, for example, from 0 to about 30 with the first end being the basal end. The second portion may extend, for example, from 50 to 100 with the first end being the basal end. For example, the first portion may have a higher ratio of Σ29 coincidence boundaries (random boundaries) than the second portion. Thus, for example, the random boundaries in the first portion reduce distortions to cause fewer defects. Thus, for example, the silicon ingot In1 manufactured using unidirectional solidification of the silicon melt MS1 may have fewer defects in the first portion at a low position in the height direction. Thus, the silicon ingot In1 may have higher quality. The second portion may have a higher ratio of Σ5 coincidence boundaries than the first portion. This may improve the crystal quality in the second portion. The coincidence boundaries and the types of coincidence boundaries in the silicon ingot In1 may be identified by measurement using EBSDs or other techniques. In this example, the portion including Σ5 coincidence boundaries includes a portion in which Σ29 coincidence boundaries and Σ5 coincidence boundaries are both detected.

In the second process, the first seed width Ws1 of the first seed crystal Sd1 and the second seed width Ws2 of the second seed crystal Sd2 in the positive X-direction as the second direction may be, for example, the same or different. When, for example, the first seed width Ws1 and the second seed width Ws2 are different, the seed crystal strips cut out from the cylindrical monocrystalline silicon lump Mc0 obtained by, for example, the CZ method and having different widths from one another may be used as the first seed crystal Sd1 and the second seed crystal Sd2. This allows, for example, easy manufacture of the high quality silicon ingot In1.

In this example, as shown in FIGS. 5A and 5B, a gap GA1 may be left between the outer periphery of the seed crystal assembly 200s and the side surface of the inner wall (inner side surface) of the mold 121. For example, one or more seed crystals (peripheral seed crystals) of monocrystalline silicon may be placed in the gap GA1 adjacent to the seed crystal assembly 200s. In this case, for example, one or more monocrystals may be placed along the periphery of the bottom 121b of the mold 121 to fill the looped gap GA1 between the outer periphery of the seed crystal assembly 200s and the inner side surface of the mold 121. In the example in FIGS. 5A and 5B, the peripheral seed crystal(s) may include, for example, a first peripheral seed portion and a second peripheral seed portion. The first peripheral seed portion is adjacent to the first seed crystal Sd1. The second peripheral seed portion is adjacent to the second seed crystal Sd2. For example, the first seed crystal Sd1 and the first peripheral seed portion are arranged to allow their rotation angle relationship about an imaginary axis parallel to the positive Z-direction as the first direction to be a rotation angle relationship of silicon monocrystals corresponding to a coincidence boundary. For example, the second seed crystal Sd2 and the second peripheral seed portion are arranged to allow their rotation angle relationship about an imaginary axis parallel to the positive Z-direction as the first direction to be a rotation angle relationship of silicon monocrystals corresponding to a coincidence boundary.

In this structure, for example, a mono-like crystal grown from the first seed crystal Sd1 and a mono-like crystal grown from the first peripheral seed portion have the rotation angle relationship inherited from the first seed crystal Sd1 and the first peripheral seed portion. A grain boundary (functional grain boundary) including a coincidence boundary may form easily at the boundary between such mono-like crystals. In other words, a coincidence boundary may form above the boundary between the first seed crystal Sd1 and the first peripheral seed portion. For example, a mono-like crystal grown from the second seed crystal Sd2 and a mono-like crystal grown from the second peripheral seed portion have the rotation angle relationship inherited from the second seed crystal Sd2 and the second peripheral seed portion. A grain boundary (functional grain boundary) including a coincidence boundary may form easily at the boundary between such mono-like crystals. In other words, a coincidence boundary may form above the boundary between the second seed crystal Sd2 and the second peripheral seed portion. Thus, while the silicon melt MS1 is solidifying unidirectionally, distortions are reduced as the coincidence boundaries form constantly. This may reduce defects in the silicon ingot In1. For example, while the silicon melt MS1 is solidifying unidirectionally, dislocations may occur originating from the inner side surface of the mold 121. However, the functional grain boundaries forming in a loop along the inner side surface of the mold 121 may obstructs development (propagation) of the dislocations. Thus, for example, the mono-like crystal grown from the first seed crystal Sd1 and the mono-like crystal grown from the second seed crystal Sd2 may have fewer defects. In other words, the resultant silicon ingot In1 may have fewer defects.

The seed crystal assembly 200s may include, for example, three or more seed crystals and intermediate seed crystals each between adjacent ones of the three or more seed crystals arranged in the positive X-direction as the second direction. This may upsize, for example, the silicon ingot In1 further.

Figure 12:
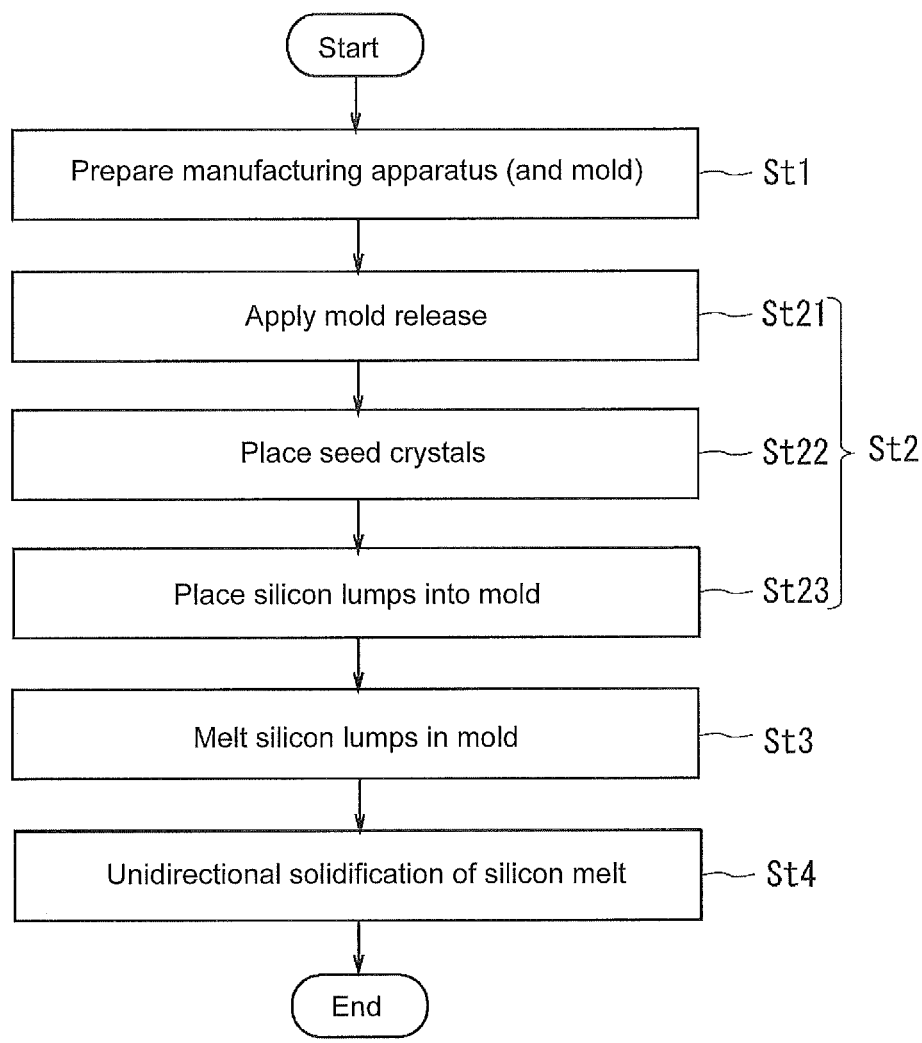
FIG. 12 illustrates a flowchart of an example manufacturing process of a silicon ingot performed using the second manufacturing apparatus.

1-2-2. Manufacturing Method for Silicon Ingot Using Second Manufacturing Apparatus A manufacturing method for the silicon ingot In1 using the second manufacturing apparatus 1002 will be described with reference to FIGS. 12 to 17. As shown in FIG. 12, the manufacturing method for the silicon ingot In1 using the second manufacturing apparatus 1002 includes, for example, a first process in step St1, a second process in step St2, a third process in step St3, and a fourth process in step St4 performed in this order. The method allows easy manufacture of the high quality silicon ingot In1 with the crystal orientations aligned. FIGS. 13 to 17 show the state of the mold 121 in each process.

First Process (Step St1)

In the first process in step St1, the second manufacturing apparatus 1002 described above is prepared. The second manufacturing apparatus 1002 includes, for example, a mold 121 having the upper opening 121O that is open in the positive Z-direction as the first direction.

Second Process (Step St2)

In the second process in step St2, for example, a seed crystal assembly 200s of silicon monocrystals is placed on the bottom of the mold 121 prepared in the first process. In the second process, three steps including step St21, step St22, and step St23 are performed in this order.

Figure 13:
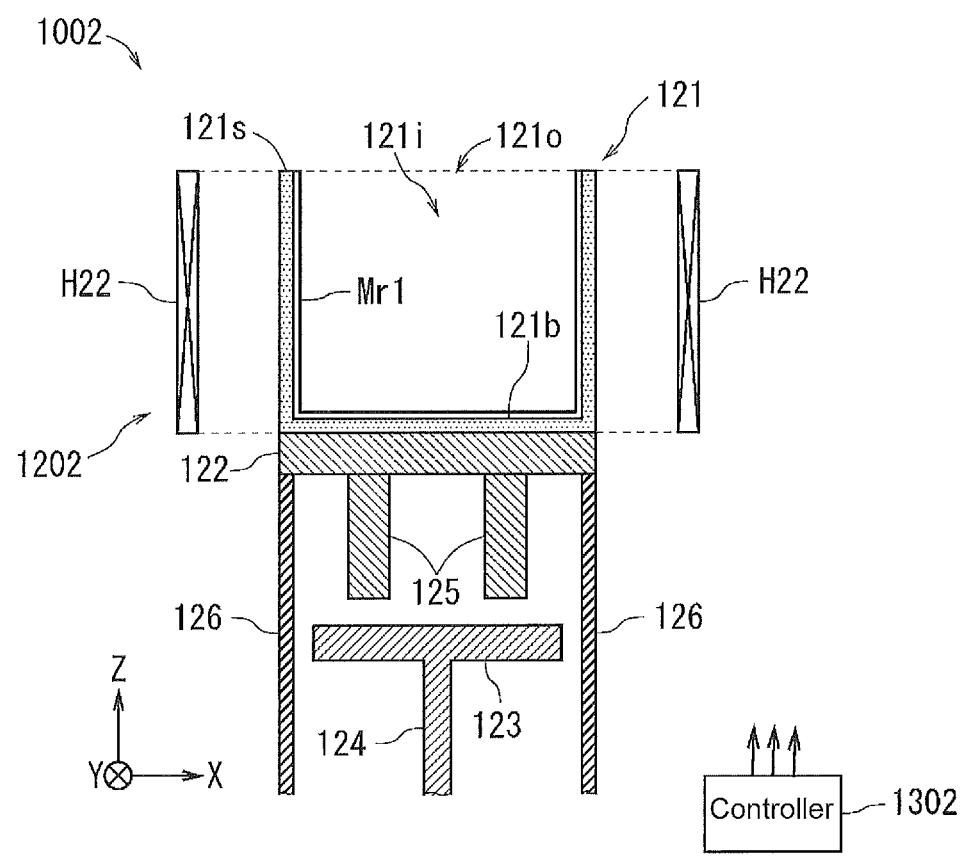
FIG. 13 illustrates an imaginary cross-sectional view of the second manufacturing apparatus, with the inner wall of a mold coated with a mold release.

In step St21, as shown in the example in FIG. 13, a mold release is applied to the inner wall surface of the mold 121 to form a mold release layer Mr1. This mold release layer Mr1 may be formed in the same manner as in step Sp21 in FIG. 3 described above.

Figure 14A:
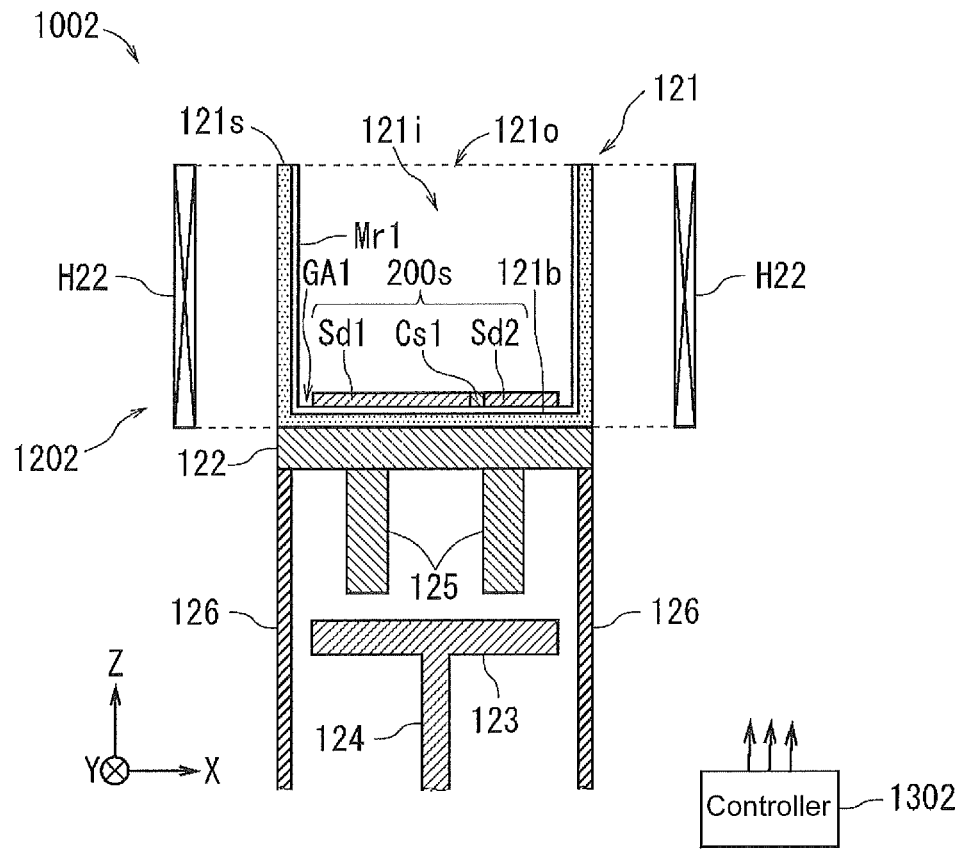
FIG. 14A illustrates an imaginary cross-sectional view of the second manufacturing apparatus, with seed crystals placed on the bottom of the mold.
Figure 14B:
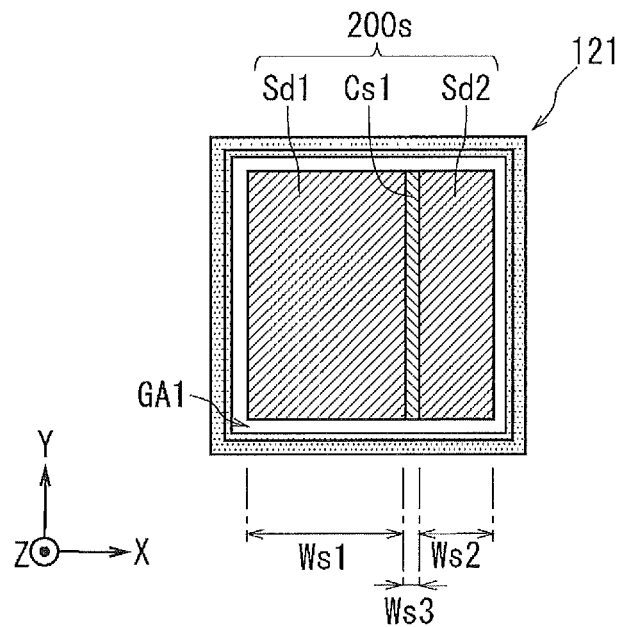
FIG. 14B illustrates a plan view of the mold in the second manufacturing apparatus, with the seed crystals placed on the bottom of the mold.

In the step St22, as shown in FIGS. 14A and 14B, the seed crystal assembly 200s is placed on the bottom 121b of the mold 121. The seed crystal assembly 200s may be placed in the same manner as in step Sp22 in FIG. 3 described above.

Figure 15:
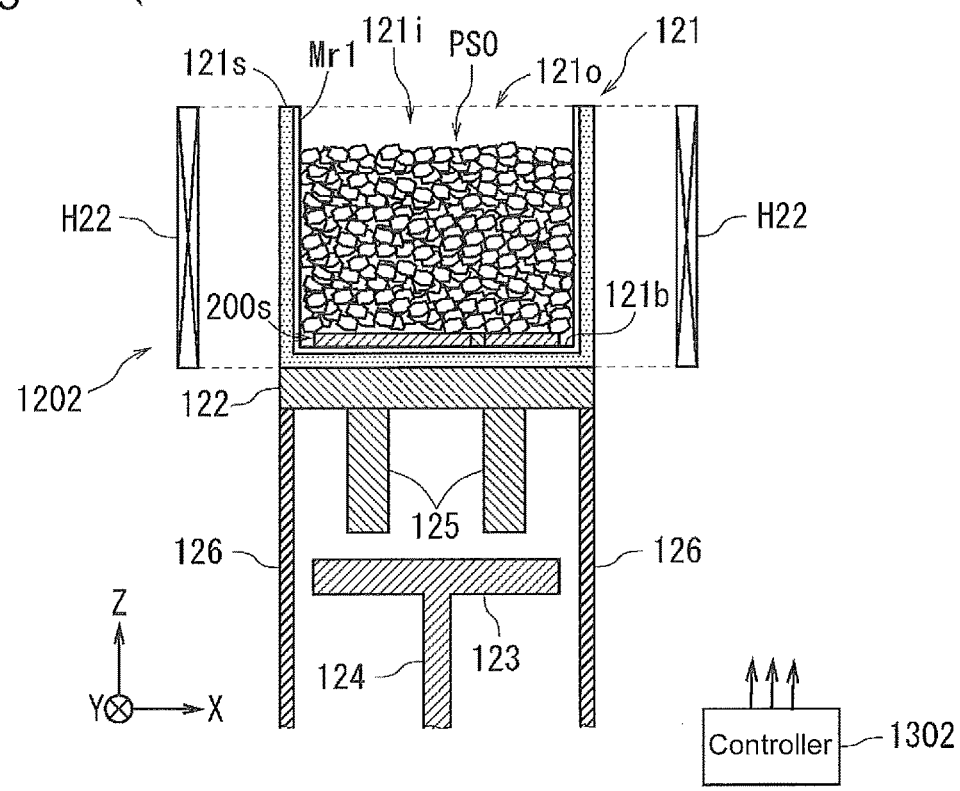
FIG. 15 illustrates an imaginary cross-sectional view of the second manufacturing apparatus, with the mold containing silicon lumps.

In step St23, as shown in FIG. 15, silicon lumps PS0 are placed onto the seed crystal assembly 200s of silicon monocrystals placed on the bottom 121b of the mold 121. In this example, the silicon lumps PS0 are placed from the upper surface of the seed crystal assembly 200s of silicon monocrystals placed on the bottom 121b of the mold 121 toward the upper space of the mold 121. The silicon lumps PS0 are, for example, mixed with an element to be a dopant in the silicon ingot In1. The silicon lumps PS0 are, for example polysilicon lumps as a material of the silicon ingot In1. The polysilicon lumps are, for example, relatively small silicon pieces. To manufacture a p-type silicon ingot In1, the dopant element is, for example, boron or gallium. To manufacture an n-type silicon ingot In1, the dopant element is, for example, phosphorus. In this example, before the subsequent third process is started, the cooling plate 123 is separate from the lower end of the heat conductor 125 connected to the mold holder 122.

Third Process (Step St3)

Figure 16:
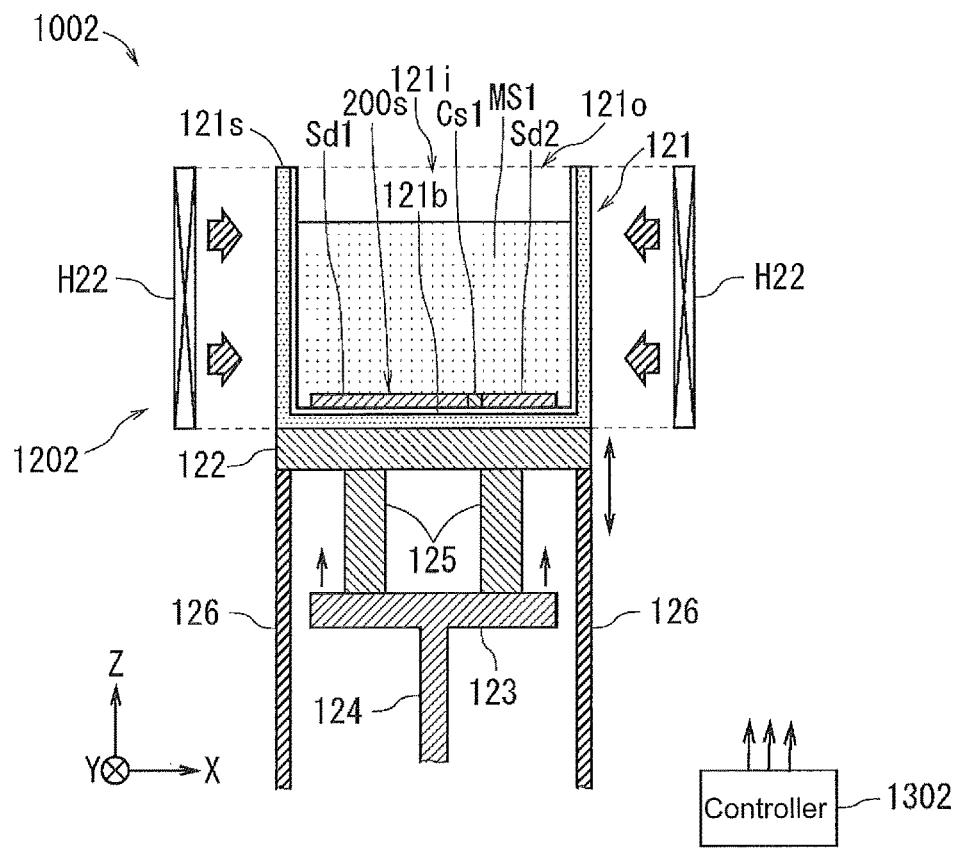
FIG. 16 illustrates an imaginary cross-sectional view of the second manufacturing apparatus, with the silicon lumps melted in the mold.

In the third process in step St3, as shown in the example in FIG. 16, the silicon lumps PS0 on the seed crystal assembly 200s placed in the second process are heated by the side heater H22 to be melted in the mold 121. This produces silicon melt MS1. Thus, for example, the silicon lumps PS0 are melted in the mold 121 into the silicon melt MS1 on the first seed crystal Sd1, the second seed crystal Sd2, and the first intermediate seed crystal Cs1. For example, the output from the side heater H22 and the raising and lowering of the mold 121 performed by the mold support 126 are controlled as appropriate. In FIG. 16, hatched arrows indicate heat from the heater, and solid arrows indicate raising and lowering of the cooling plate 123 and the mold 121. In this example, the seed crystal assembly 200s in close contact with the bottom 121b of the mold 121 may transfer heat from the seed crystal assembly 200s to the bottom 121b and remain unmelted. Thus, as in the example in FIG. 16, the silicon melt MS1 covers the upper surface of the monocrystalline silicon seed crystal assembly 200s placed on the bottom 121b of the mold 121.

In the third process, as shown in the example in FIG. 16, the cooling plate 123 is placed into contact with the lower end of the heat conductor 125. This allows, for example, heat removal from the silicon melt MS1 in the mold 121 to the cooling plate 123 through the mold holder 122 and the heat conductor 125. The cooling plate 123 may be placed into contact with the lower end of the heat conductor 125 upon, for example, a predetermined elapsed time after the silicon lumps PS0 are started to be melted in the mold 121 (contacting moment). In another example, the contacting moment may be immediately before the silicon lumps PS0 are started to be melted in the mold 121. The contacting moment may be controlled in accordance with the temperature detected by the temperature measurers in the second manufacturing apparatus 1002, such as the first temperature measurer CHA and the second temperature measurer CHB.

Fourth Process (Step St4)

In the fourth process in step St4, for example, the silicon melt MS1 produced in the mold 121 in the third process solidifies unidirectionally (unidirectional solidification) upward from the bottom 121b of the mold 121.

Figure 17:
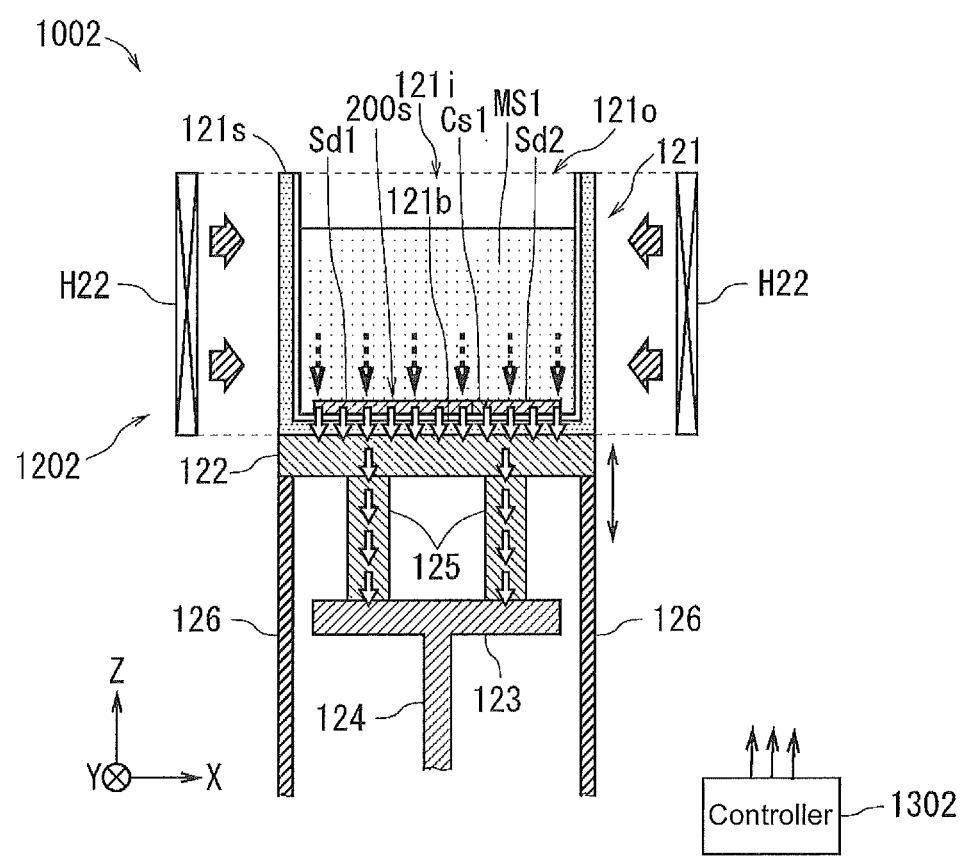
FIG. 17 illustrates an imaginary cross-sectional view of the second manufacturing apparatus, with the silicon melt solidifying unidirectionally in the mold.

In the fourth process, as shown in the example in FIG. 17, the silicon melt MS1 in the mold 121 is cooled from the bottom 121b as heat transfers from the silicon melt MS1 in the mold 121 to the cooling plate 123 through the mold holder 122 and the heat conductor 125. This allows, for example, unidirectional solidification of the silicon melt MS1 upward from the bottom 121b. In FIG. 17, thick dashed arrows indicate transfer of heat in the silicon melt MS1, and outlined arrows indicate transfer of heat from the silicon melt MS1 to the cooling plate 123 through the mold holder 122 and the heat conductor 125. In this example, the output from the side heater H22 and the raising and lowering of the mold 121 performed by the mold support 126 are controlled in accordance with the temperature detected with the first temperature measurer CHA and the second temperature measurer CHB. In FIG. 17, hatched arrows indicate heat from the heater, and solid arrows indicate raising and lowering of the mold 121. For example, the temperature around the side heater H22 is maintained at around the melting point of silicon. This reduces silicon crystal growth from the side surface of the mold 121 and increases the crystal growth of monocrystalline silicon in the positive Z-direction or upward. For example, the side heater H22 may be divided into multiple sections. In this case, a section of the divided side heater H22 may heat the silicon melt MS1, and another section of the divided side heater H22 may not heat the silicon melt MS1.

In the fourth process, for example, the silicon melt MS1 slowly solidifies unidirectionally into the silicon ingot In1 in the mold 121, in the same manner as in step Sp4 in the fourth process in FIG. 3. During the solidification, for example, mono-like crystals grow from the first seed crystal Sd1, the second seed crystal Sd2, and the first intermediate seed crystal Cs1 included in the seed crystal assembly 200s of monocrystalline silicon.

For the example manufacturing method for the silicon ingot In1 using the second manufacturing apparatus 1002, a gap GA1 may also be left between the outer periphery of the seed crystal assembly 200s and the inner side surface of the mold 121, in the same manner as the example manufacturing method for the silicon ingot In1 using the first manufacturing apparatus 1001 described above. For example, one or more seed crystals (peripheral seed crystals) of monociystalline silicon may be placed in the gap GA1 adjacent to the seed crystal assembly 200s. While the silicon melt MS1 is solidifying unidirectionally, dislocations may occur originating from the inner side surface of the mold 121. However, the functional grain boundaries forming in a loop along the inner side surface of the mold 121 may obstruct development (propagation) of the dislocations. Thus, for example, the resultant silicon ingot In1 may have fewer defects. The seed crystal assembly 200s may include, for example, three or more seed crystals and intermediate seed crystals each between adjacent ones of the three or more seed crystals arranged in the positive X-direction as the second direction. This may upsize, for example, the silicon ingot In1 further.

1-2-3. Manufacturing Method for Silicon Ingot in First Modification

Figure 18A:
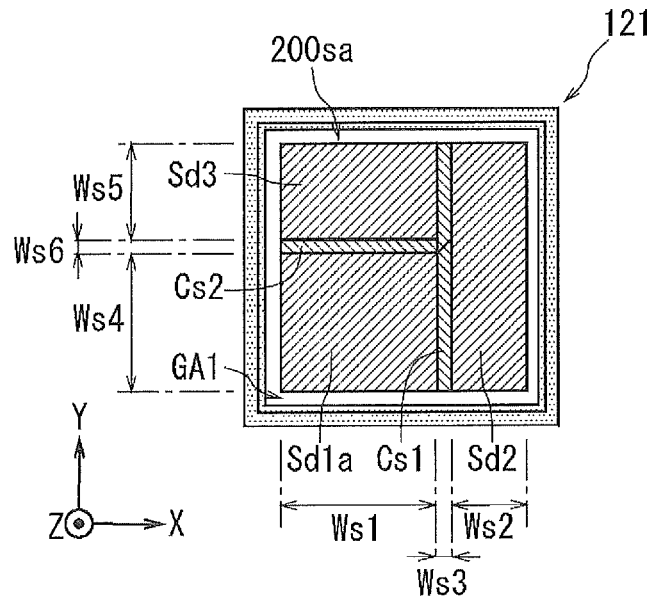
FIG. 18A illustrates a plan view of an example mold receiving seed crystals on its bottom in a second process in a manufacturing process of a silicon ingot according to a first modification.

A manufacturing method for a silicon ingot In1 a (refer to FIGS. 20A and 20B) according to a first modification may replace, for example, the seed crystal assembly 200s with a seed crystal assembly 200sa shown in FIG. 18A in the second process in the manufacturing method for the silicon ingot Int according to the first embodiment. The seed crystal assembly 200sa is modified from the seed crystal assembly 200s to replace the first seed crystal Sd1 described above (refer to FIGS. 5B and 14B) with a first seed crystal Sd1a, a second intermediate seed crystal Cs2, and a third seed crystal Sd3 that are adjacent to one another in sequence in the positive Y-direction as the third direction, which is perpendicular to the positive Z-direction as the first direction and crosses the positive X-direction as the second direction. In other words, the seed crystal assembly 200sa includes, for example, the first seed crystal Sd1a, the second seed crystal Sd2, the third seed crystal Sd3, the first intermediate seed crystal Cs1, and the second intermediate seed crystal Cs2.

In this example, as shown in FIG. 18A, the first seed crystal Sd1a, the second seed crystal Sd2, the third seed crystal Sd3, the first intermediate seed crystal Cs1, and the second intermediate seed crystal Cs2 are arranged on the bottom 121b of the mold 121. More specifically, for example, the first seed crystal Sd1a, the first intermediate seed crystal Cs1, and the second seed crystal Sd2 are arranged, on the bottom 121b of the mold 121, adjacent to one another in sequence in the positive X-direction as the second direction. The first seed crystal Sd1a, the second intermediate seed crystal Cs2, and the third seed crystal Sd3 are arranged, on the bottom 121b of the mold 121, adjacent to one another in sequence in the positive Y-direction as the third direction. For example, the second intermediate seed crystal Cs2 has one end in its longitudinal direction parallel to the positive X-direction as the second direction in contact with a middle portion of the first intermediate seed crystal Cs1 in its longitudinal direction parallel to the positive Y-direction in the third direction. In other words, for example, the first intermediate seed crystal Cs1 and the second intermediate seed crystal Cs2 together form a T-shape. For example, the third seed crystal Sd3, the first intermediate seed crystal Cs1, and the second seed crystal Sd2 may be arranged on the bottom 121b of the mold 121 adjacent to one another in sequence in the positive X-direction as the second direction.

For example, the first inteimediate seed crystal Cs1 has a width (third seed width) Ws3 less than each of the width (first seed width) Ws1 of the first seed crystal Sd1a and the width (second seed width) Ws2 of the second seed crystal Sd2 in the positive X-direction as the second direction. In other words, for example, each of the first seed width Ws1 and the second seed width Ws2 is greater than the third seed width Ws3 in the positive X-direction as the second direction. For example, the second inteimediate seed crystal Cs2 has a width (sixth width) Ws6 less than each of the width (fourth seed width) Ws4 of the first seed crystal Sd1a and the width (fifth seed width) Ws5 of the third seed crystal Sd3 in the positive Y-direction as the third direction. In other words, for example, each of the fourth seed width Ws4 and the fifth seed width Ws5 is greater than the sixth seed width Ws6 in the positive Y-direction as the third direction.

For example, the first seed crystal Sd1a and the first intermediate seed crystal Cs1 have a first rotation angle relationship between their silicon monocrystals about an imaginary axis parallel to the positive Z-direction as the first direction. For example, the first intermediate seed crystal Cs1 and the second seed crystal Sd2 have a second rotation angle relationship between their silicon monocrystals about an imaginary axis parallel to the positive Z-direction as the first direction. The first seed crystal Sd1 a and the second intermediate seed crystal Cs2 have a third rotation angle relationship between their silicon monocrystals about an imaginary axis parallel to the positive Z-direction as the first direction. For example, the second intermediate seed crystal Cs2 and the third seed crystal Sd3 have a fourth rotation angle relationship between their silicon monocrystals about an imaginary axis parallel to the positive Z-direction as the first direction. The seed crystals in the seed crystal assembly 200sa are arranged to allow, for example, each of the first rotation angle relationship between the first seed crystal Sd1a and the first intermediate seed crystal Cs1, the second rotation angle relationship between the first intermediate seed crystal Cs1 and the second seed crystal Sd2, the third rotation angle relationship between the first seed crystal Sd1a and the second intermediate seed crystal Cs2, and the fourth rotation angle relationship between the second intermediate seed crystal Cs2 and the third seed crystal Sd3 to be a rotation angle relationship of silicon monocrystals corresponding to a coincidence boundary. For example, the rotation angle relationship between the third seed crystal Sd3 and the first intermediate seed crystal Cs1 may be the rotation angle relationship of silicon monocrystals corresponding to a coincidence boundary.

With the manufacturing method for the silicon ingot In1a according to the first modification, for example, a first functional grain boundary, a second functional grain boundary, a third functional grain boundary, and a fourth functional grain boundary each including a coincidence boundary may form while mono-like crystals grow by unidirectional solidification of the silicon melt MS1 from the first seed crystal Sd1a, the second seed crystal Sd2, the third seed crystal Sd3, the first intermediate seed crystal Cs1, and the second intermediate seed crystal Cs2. For example, the first functional grain boundary may form above the boundary between the first seed crystal Sd1a and the first intermediate seed crystal Cs1. For example, the second functional grain boundary may form above the boundary between the second seed crystal Sd2 and the first intermediate seed crystal Cs1. For example, the third functional grain boundary may form above the boundary between the first seed crystal Sd1a and the second intermediate seed crystal Cs2. For example, the fourth functional grain boundary may forrii above the boundary between the third seed crystal Sd3 and the second intermediate seed crystal Cs2. Thus, while the silicon melt MS1 is unidirectionally solidifying, coincidence boundaries form constantly and reduce distortions. For example, while the silicon melt MS1 is solidifying unidirectionally, dislocations tend to occur above the portions between the first seed crystal Sd1a and the second seed crystal Sd2 and between the first seed crystal Sd1a and the third seed crystal Sd3. However, as the two functional grain boundaries form, the dislocations are likely to disappear, being confined into the mono-like crystalline portion between the two functional grain boundaries. Thus, the silicon ingot In1a may have higher quality, for example.

For example, a small space similar to the first small space Se1 shown in FIG. 8A or FIG. 8B may be left between the first seed crystal Sd1a and the first intermediate seed crystal Cs1 and between the first seed crystal Sd1a and the second intermediate seed crystal Cs2. In this case, for example, the first functional grain boundary and the third functional grain boundary may foriu in a curved shape in an imaginary XY plane while the silicon melt MS1 is slowly solidifying unidirectionally. For example, a small space similar to the second small space Se2 shown in FIG. 8A or FIG. 8B may be left between the second seed crystal Sd1 and the first intermediate seed crystal Cs1 and between the third seed crystal Sd3 and the second intermediate seed crystal Cs2. In this case, for example, the second functional grain boundary and the fourth functional grain boundary may form in a curved shape in an imaginary XY plane while the silicon melt MS1 is slowly solidifying unidirectionally. For example, each of the first, second, third, and fourth functional grain boundaries forming constantly while the silicon melt MS1 is slowly solidifying unidirectionally includes the curve. The curve allows each functional grain boundary to easily absorb distortions in various directions. The curve also increases the area of each functional grain boundary to allow easy absorption of distortions. These may reduce defects in the silicon ingot In1a, for example.

The seed crystal assembly 200sa may include, for example, three or more seed crystals and intermediate seed crystals each between adjacent ones of the three or more seed crystals arranged in the positive X-direction as the second direction. The seed crystal assembly 200sa may include, for example, three or more seed crystals and intermediate seed crystals each between adjacent ones of the three or more seed crystals arranged in the positive Y-direction as the third direction. This may upsize, for example, the silicon ingot In1a further.

1-2-4. Manufacturing Method for Silicon Ingot in Second Modification

Figure 18B:
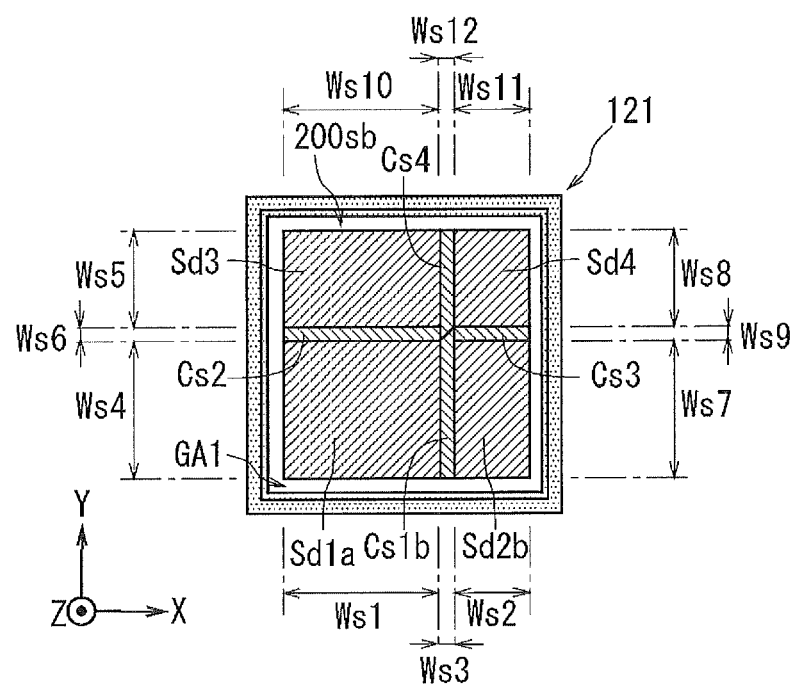
FIG. 18B illustrates a plan view of an example mold receiving seed crystals on its bottom in a second process in a manufacturing process of a silicon ingot according to a second modification.

A manufacturing method for a silicon ingot In1b (refer to FIGS. 21A and 21B) according to a second modification may replace, for example, the seed crystal assembly 200sa with a seed crystal assembly 200sb shown in FIG. 18B in the second process in the manufacturing method for the silicon ingot In1a according to the first modification. The seed crystal assembly 200sb is modified from the seed crystal assembly 200sa to replace the second seed crystal Sd2 described above (refer to FIG. 18A) with a second seed crystal Sd2b, a third intermediate seed crystal Cs3, and a fourth seed crystal Sd4 that are adjacent to one another in sequence in the positive Y-direction as the third direction and replace the first intermediate seed crystal Cs1 with a first intermediate seed crystal Cs1b located between the first seed crystal Sd1a and the second seed crystal Sd2b and a fourth intermediate seed crystal Cs4 located between the third seed crystal Sd3 and the fourth seed crystal Sd4. In other words, the seed crystal assembly 200sb includes, for example, the first seed crystal Sd1a, the second seed crystal Sd2b, the third seed crystal Sd3, the fourth seed crystal Sd4, the first intermediate seed crystal Cs1b, the second intermediate seed crystal Cs2, the third intermediate seed crystal Cs3, and the fourth intermediate seed crystal Cs4.

In this example, as shown in FIG. 18B, the first seed crystal Sd1a, the second seed crystal Sd2b, the third seed crystal Sd3, the fourth seed crystal Sd4, the first intermediate seed crystal Cs1b, the second intermediate seed crystal Cs2, the third intermediate seed crystal Cs3, and the fourth intermediate seed crystal Cs4 are arranged on the bottom 121b of the mold 121. More specifically, for example, the first seed crystal Sd1a, the first intermediate seed crystal Cs1b, and the second seed crystal Sd2b are arranged on the bottom 121b of the mold 121 adjacent to one another in sequence in the positive X-direction as the second direction. For example, the first seed crystal Sd1a, the second intermediate seed crystal Cs2, and the third seed crystal Sd3 are arranged adjacent to one another in sequence in the positive Y-direction as the third direction. For example, the second seed crystal Sd2b, the third intermediate seed crystal Cs3, and the fourth seed crystal Sd4 are arranged adjacent to one another in sequence in the positive Y-direction as the third direction. For example, the third seed crystal Sd3, the fourth intermediate seed crystal Cs4, and the fourth seed crystal Sd4 are arranged adjacent to one another in sequence in the positive X-direction as the second direction. In the example in FIG. 18B, the section defined by the first intermediate seed crystal Cs1b and the fourth intermediate seed crystal Cs4 and the section defined by the second intermediate seed crystal Cs2 and the third intermediate seed crystal Cs3 cross each other in a cross shape.

For example, the first intermediate seed crystal Cs1 has a width (third seed width) Ws3 less than each of the width (first seed width) Ws1 of the first seed crystal Sd1a and the width (second seed width) Ws2 of the second seed crystal Sd2b in the positive X-direction as the second direction. In other words, for example, each of the first seed width Ws1 and the second seed width Ws2 is greater than the third seed width Ws3 in the positive X-direction as the second direction. For example, the second intermediate seed crystal Cs2 has a width (sixth seed width) Ws6 less than each of the width (fourth seed width) Ws4 of the first seed crystal Sdla and the width (fifth seed width) Ws5 of the third seed crystal Sd3 in the positive Y-direction as the third direction. In other words, for example, each of the fourth seed width Ws4 and the fifth seed width Ws5 is greater than the sixth seed width Ws6 in the positive Y-direction as the third direction. For example, the third intermediate seed crystal Cs3 has a width (ninth seed width) Ws9 less than each of the width (seventh seed width) Ws7 of the second seed crystal Sd2b and the width (eighth seed width) Ws8 of the fourth seed crystal Sd4 in the positive Y-direction as the third direction. In other words, for example, each of the seventh seed width Ws7 and the eighth seed width Ws8 is greater than the ninth seed width Ws9 in the positive Y-direction as the third direction. For example, the fourth intermediate seed crystal Cs4 has a width (twelfth seed width) Ws12 less than each of the width (tenth seed width) Ws10 of the third seed crystal Sd3 and the width (an eleventh seed width) Ws11 of the fourth seed crystal Sd4 in the positive X-direction as the second direction. In other words, for example, each of the tenth seed width Ws10 and the eleventh seed width Ws11 is greater than the twelfth seed width Ws12 in the positive X-direction as the second direction.

For example, the first seed crystal Sd1a and the first intermediate seed crystal Cs1b have a first rotation angle relationship between their silicon monocrystals about an imaginary axis parallel to the positive Z-direction as the first direction. For example, the first intermediate seed crystal Cs1b and the second seed crystal Sd2b have a second rotation angle relationship between their silicon monocrystals about an imaginary axis parallel to the positive Z-direction as the first direction. For example, the first seed crystal Sd1a and the second intermediate seed crystal Cs2 have a third rotation angle relationship between their silicon monocrystals about an imaginary axis parallel to the positive Z-direction as the first direction. For example, the second intermediate seed crystal Cs2 and the third seed crystal Sd3 have a fourth rotation angle relationship between their silicon monocrystals about an imaginary axis parallel to the positive Z-direction as the first direction. For example, the second seed crystal Sd2b and the third intermediate seed crystal Cs3 have a fifth rotation angle relationship between their silicon monocrystals about an imaginary axis parallel to the positive Z-direction as the first direction. For example, the third intermediate seed crystal Cs3 and the fourth seed crystal Sd4 have a sixth rotation angle relationship between their silicon monocrystals about an imaginary axis parallel to the positive Z-direction as the first direction. For example, the third seed crystal Sd3 and the fourth intermediate seed crystal Cs4 have a seventh rotation angle relationship between their silicon monocrystals about an imaginary axis parallel to the positive Z-direction as the first direction. For example, the fourth intermediate seed crystal Cs4 and the fourth seed crystal Sd4 have an eighth rotation angle relationship between their silicon monocrystals about an imaginary axis parallel to the positive Z-direction as the first direction. In this case, for example, the seed crystals in the seed crystal assembly 200sb are arranged to allow each of the first rotation angle relationship between the first seed crystal Sd1a and the first intermediate seed crystal Cs1b, the second rotation angle relationship between the first intermediate seed crystal Cs1b and the second seed crystal Sd2b, the third rotation angle relationship between the first seed crystal Sd1a and the second intermediate seed crystal Cs2, the fourth rotation angle relationship between the second intermediate seed crystal Cs2 and the third seed crystal Sd3, the fifth rotation angle relationship between the second seed crystal Sd2b and the third intermediate seed crystal Cs3, the sixth rotation angle relationship between the third intermediate seed crystal Cs3 and the fourth seed crystal Sd4, the seventh rotation angle relationship between the third seed crystal Sd3 and the fourth intermediate seed crystal Cs4, and the eighth rotation angle relationship between the fourth intermediate seed crystal Cs4 and the fourth seed crystal Sd4 to be a rotation angle relationship of silicon monocrystals corresponding to a coincidence boundary.

With the manufacturing method for the silicon ingot In1b according to the second modification, for example, a first functional grain boundary, a second functional grain boundary, a third functional grain boundary, a fourth functional grain boundary, a fifth functional grain boundary, a sixth functional grain boundary, a seventh functional grain boundary, and an eighth functional grain boundary each including a coincidence boundary may form while mono-like crystals grow by unidirectional solidification of the silicon melt MS1 from the first seed crystal Sd1a, the second seed crystal Sd2b, the third seed crystal Sd3, the fourth seed crystal Sd4, the first intermediate seed crystal Cs1b, the second intermediate seed crystal Cs2, the third intermediate seed crystal Cs3, and the fourth intermediate seed crystal Cs4. For example, the first functional grain boundary may form above the boundary between the first seed crystal Sd1a and the first intermediate seed crystal Cs1b. For example, the second functional grain boundary may form above the boundary between the second seed crystal Sd2b and the first intermediate seed crystal Cs1b. For example, the third functional grain boundary may form above the boundary between the first seed crystal Sd1a and the second intermediate seed crystal Cs2. For example, the fourth functional grain boundary may form above the boundary between the third seed crystal Sd3 and the second intermediate seed crystal Cs2. For example, the fifth functional grain boundary may form above the boundary between the second seed crystal Sd2b and the third intermediate seed crystal Cs3. For example, the sixth functional grain boundary may form above the boundary between the fourth seed crystal Sd4 and the third intermediate seed crystal Cs3. For example, the seventh functional grain boundary may form above the boundary between the third seed crystal Sd3 and the fourth intermediate seed crystal Cs4. For example, the eighth functional grain boundary may form above the boundary between the fourth seed crystal Sd4 and the fourth intermediate seed crystal Cs4. Thus, while the silicon melt MS1 is unidirectionally solidifying, coincidence boundaries form constantly and reduce distortions. For example, while the silicon melt MS1 is solidifying unidirectionally, dislocations tend to occur above the portions between the first seed crystal Sd1a and the second seed crystal Sd2b, between the first seed crystal Sd1a and the third seed crystal Sd3, between the second seed crystal Sd2b and the fourth seed crystal Sd4, and between the third seed crystal Sd3 and the fourth seed crystal Sd4. However, as the two functional grain boundaries form, the dislocations are likely to disappear, being confined into the mono-like crystalline portion between the two functional grain boundaries. Thus, the silicon ingot In1b may have higher quality, for example.

For example, a small space similar to the first small space Se1 shown in FIG. 8A or 8B may be left between the first seed crystal Sd1a and the first intermediate seed crystal Cs1b, between the first seed crystal Sd1a and the second intermediate seed crystal Cs2, between the second seed crystal Sd2b and the third intermediate seed crystal Cs3, and between the third seed crystal Sd3 and the fourth intermediate seed crystal Cs4. In this case, for example, the first functional grain boundary, the third functional grain boundary, the fifth functional grain boundary, and the seventh functional grain boundary may form in a curved shape in an imaginary XY plane while the silicon melt MS1 is slowly solidifying unidirectionally. For example, a small space similar to the second small space Se2 shown in FIG. 8A or 8B may be left between the second seed crystal Sd2b and the first intermediate seed crystal Cs1b, between the third seed crystal Sd3 and the second intermediate seed crystal Cs2, between the fourth seed crystal Sd4 and the third intermediate seed crystal Cs3, and between the fourth seed crystal Sd4 and the fourth intermediate seed crystal Cs4. In this case, for example, the second functional grain boundary, the fourth functional grain boundary, the sixth functional grain boundary, and the eighth functional grain boundary may form in a curved shape in an imaginary XY plane while the silicon melt MS1 is slowly solidifying unidirectionally. For example, each of the first, second, third, fourth, fifth, sixth, seventh, and eighth functional grain boundaries forming constantly while the silicon melt MS1 is slowly solidifying unidirectionally includes the curve. The curve allows each functional grain boundary to easily absorb distortions in various directions. The curve also increases the area of each functional grain boundary to allow easy absorption of distortions. These may reduce defects in the silicon ingot In1b, for example.

The seed crystal assembly 200sb may include, for example, three or more seed crystals and intermediate seed crystals each between adjacent ones of the three or more seed crystals arranged in the positive X-direction as the second direction. The seed crystal assembly 200sb may include, for example, three or more seed crystals and intermediate seed crystals each between adjacent ones of the three or more seed crystals arranged in the positive Y-direction as the third direction. This may upsize, for example, the silicon ingot In1b further.

1-3. Silicon Ingot 1-3-1. Structure of Silicon Ingot

The silicon ingot In1 according to the first embodiment will be described with reference to FIGS. 19A and 19B. In the example in FIGS. 19A and 19B, the silicon ingot In1 is a rectangular prism. The silicon ingot In1 may be manufactured with, for example, the method for manufacturing the silicon ingot In1 according to the first embodiment described above, using the first manufacturing apparatus 1001 or the second manufacturing apparatus 1002 described above.

Figure 19A:
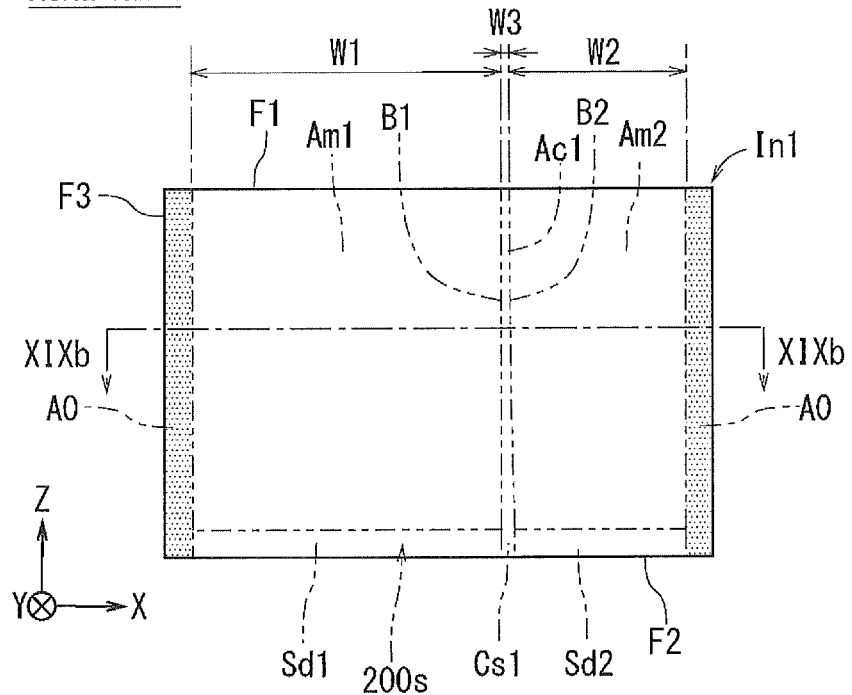
FIG. 19A illustrates a cross-sectional view of a silicon ingot according to a first embodiment taken along line XIXa-XIXa in FIG. 19B.
Figure 19B:
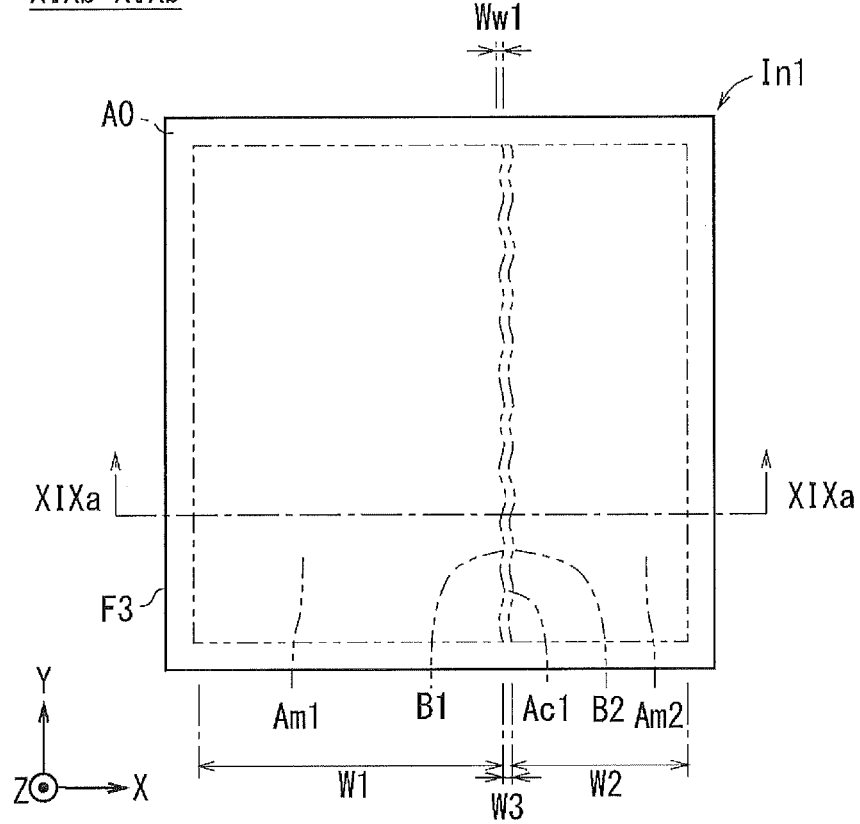
FIG. 19B illustrates a cross-sectional view of the silicon ingot according to the first embodiment taken along line XIXb-XIXb in FIG. 19A.

As shown in FIGS. 19A and 19B, the silicon ingot In1 has, for example, a first surface F1, a second surface F2, and a third surface F3. In the example in FIGS. 19A and 19B, the first surface F1 is rectangular or square surface (upper surface) facing in the positive Z-direction as the first direction. The second surface F2 is located opposite to the first surface F1. In the example in FIGS. 19A and 19B, the second surface F2 is rectangular or square surface (lower surface) facing in the negative Z-direction as a fourth direction, which is opposite to the first direction. The third surface F3 connects the first surface F1 and the second surface F2 and extends in the positive Z-direction as the first direction from the second surface F2 to the first surface F1. In the example in FIGS. 19A and 19B, the third surface F3 includes four surface (side surfaces) extending in the positive Z-direction as the first direction.

This silicon ingot In1 includes, for example, a first mono-like crystalline portion Am1, a second mono-like crystalline portion Am2, and a first intermediate portion Ac1. For example, the first mono-like crystalline portion Am1, the first intermediate portion Ac1, and the second mono-like crystalline portion Am2 are adjacent to one another in the stated order in the positive X-direction as the second direction, which is perpendicular to the positive Z-direction as the first direction. Each of the first mono-like crystalline portion Am1 and the second mono-like crystalline portion Am2 is a section of a mono-like crystal.

The first mono-like crystalline portion Am1 is, for example, a mono-like crystal portion (or simply a mono-like crystal) resulting from unidirectional solidification of the silicon melt MS1 from the first seed crystal Sd1. The first mono-like crystalline portion Am1 has a crystal structure and a crystal orientation inherited from the first seed crystal Sd1. The first mono-like crystalline portion Am1 thus includes, for example, a section corresponding to the first seed crystal Sd1 and a section above the section corresponding to the first seed crystal Sd1. In the example in FIGS. 19A and 19B, the section corresponding to the first seed crystal Sd1 is rectangular prismatic and has a rectangular upper surface facing in the positive Z-direction as the first direction and a rectangular lower surface facing in the negative Z-direction as the fourth direction. The first mono-like crystalline portion Am1 is rectangular prismatic and includes the section corresponding to the rectangular prismatic first seed crystal Sd1 as the lowest part.

The second mono-like crystalline portion Am2 is, for example, a mono-like crystalline portion resulting from unidirectional solidification of the silicon melt MS1 from the second seed crystal Sd2. The second mono-like crystalline portion Am2 has a crystal structure and a crystal orientation inherited from the second seed crystal Sd2. The second mono-like crystalline portion Am2 thus includes, for example, a section corresponding to the second seed crystal Sd2 and a section above the section corresponding to the second seed crystal Sd2. In the example in FIGS. 19A and 19B, the section corresponding to the second seed crystal Sd2 is rectangular prismatic and has a rectangular upper surface facing in the positive Z-direction as the first direction and a rectangular lower surface facing in the negative Z-direction as the fourth direction. The second mono-like crystalline portion Am2 is rectangular prismatic and includes the section corresponding to the rectangular-prismatic second seed crystal Sd2 as the lowest part.

The first intermediate portion Ac1 is a portion including one or more mono-like crystalline sections (or simply an intermediate portion). The first intermediate portion Ac1 is, for example, a portion resulting from unidirectional solidification of the silicon melt MS1 from the first intermediate seed crystal Cs1. The first intermediate portion Ac1 has a crystal structure and a crystal orientation inherited from the first intermediate seed crystal Cs1. The first intermediate portion Ac1 thus includes, for example, a section corresponding to the first intermediate seed crystal Cs1 and a section above the portion corresponding to the first intermediate seed crystal Cs1. In the example in FIGS. 19A and 19B, the section corresponding to the first intermediate seed crystal Cs1 is rod-like and has a narrow rectangular upper surface facing in the positive Z-direction as the first direction and a narrow rectangular lower surface facing in the negative Z-direction as the fourth direction. The first intermediate portion Ac1 is a plate-like portion including the section corresponding to the rod-like first intermediate seed crystal Cs1 as the lowest part. Thus, for example, a boundary (first boundary) B1 between the first mono-like crystalline portion Am1 and the first intermediate portion Ac1 and a boundary (second boundary) B2 between the second mono-like crystalline portion Am2 and the first intennediate portion Ac1 are rectangular.

For example, a width (first width) W1 of the first mono-like crystalline portion Am1 and a width (second width) W2 of the second mono-like crystalline portion Am2 each are greater than a width (third width) W3 of the first intermediate portion Ac1 in the positive X-direction as the second direction. For example, each of the first surface F1 and the second surface F2 of the silicon ingot In1 is rectangular or square, and is about 350 mm on a side. In this case, for example, the first width W1 and the second width W2 are each about 50 to 250 mm. For example, the third width W3 is about 2 to 25 mm.

For example, each of the first boundary B1 and the second boundary B2 includes a coincidence boundary. In this example, the surface of each of the first mono-like crystalline portion Am1 and the second mono-like crystalline portion Am2 perpendicular to the positive Z-direction as the first direction has the Miller indices of (100), and the surfaces of one or more mono-like crystals included in the first intermediate portion Ac1 perpendicular to the positive Z-direction as the first direction also has the Miller indices of (100). In other words, for example, the crystal direction of each of the first mono-like crystalline portion Am1 and the second mono-like crystalline portion Am2 parallel to the positive Z-direction as the first direction has the Miller indices of <100>, and the crystal direction of one or more mono-like crystals included in the first intermediate portion Ac1 parallel to the positive Z-direction as the first direction also has the Miller indices of <100>. In this case, for example, the coincidence boundary includes at least one of a Σ5 coincidence boundary, a Σ13 coincidence boundary, a Σ17 coincidence boundary, a Σ25 coincidence boundary, or a Σ29 coincidence boundary. The silicon ingot In1 having such a structure may be manufacture by, for example, growing mono-like crystals from the seed crystal assembly 200s and forming a coincidence boundary above each of the boundaries between the first seed crystal Sd1 and the first intermediate seed crystal Cs1 and between the second seed crystal Sd2 and the first intermediate seed crystal Cs1. While the coincidence boundary is forming, for example, distortions are reduced to cause fewer defects in the silicon ingot In1.

In this example, each of the first boundary B1 and the second boundary B2 is curved in an imaginary cross section parallel to an XY plane perpendicular to the positive Z-direction as the first direction. Being curved herein includes at least one of, for example, arc-shaped, S-shaped, wavy, or meandering. Each of the first boundary B1 and the second boundary B2 including the curve has a width in the positive X-direction as the second direction within a range of, for example, several to 20 mm. The silicon ingot In1 having such a structure includes curves in its functional grain boundaries including coincidence boundaries, which constantly form as the silicon melt MS1 solidifies unidirectionally into the silicon ingot In1, for example. In this case, for example, the tangential direction of each functional grain boundary changes variously at various locations. This allows distortions in various directions to be easily absorbed by the functional grain boundary. The increased area of the functional grain boundary also allows easy absorption of distortions. These may thus reduce defects in the silicon ingot In1, for example.

In one example, each of the first boundary B1 and the second boundary B2 is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1. This may further increase, for example, the functional grain boundaries including coincidence boundaries at which distortions are reduced, thus reducing defects. The silicon ingot In1 may thus have higher quality. In this example, the wavy first boundary B1 and second boundary B2 each have a maximum width in the positive X-direction as the second direction in a range of, for example, several to 20 mm.

For example, the silicon ingot In1 with the above structure suited to the manufacture of the silicon ingot In1 causing fewer defects may have higher quality with fewer defects. The coincidence boundaries and the ratio of each type of coincidence boundary may be identified in each of the first boundary B1 and the second boundary B2 by measurement using EBSDs or other techniques. The curves in the first boundary 91 and the second boundary B2 in an imaginary cross section parallel to an XY plane may be identified by cutting the silicon ingot In1 parallel to an XY plane with a wire saw, etching the cut surface with, for example, hydrofluoric acid, and then observing the etched surface with an optical microscope.

As shown in, for example, FIGS. 19A and 19B, the silicon ingot In1 may have a portion (peripheral portion) A0 along the third surface F3, which includes four sides. The peripheral portion A0 may contain, for example, defects resulting from dislocations originating from the inner side surface of the mold 121 during the unidirectional solidification of the silicon melt MS1. The peripheral portion A0 is, for example, cut off from the silicon ingot In1 to manufacture the silicon block Bk1 (refer to, for example, FIGS. 22A and 22B) and the silicon substrate 1 (refer to, for example, FIGS. 27A and 27B) described later.

In this example, the crystal direction of each of the first mono-like crystalline portion Am1 and the second mono-like crystalline portion Am2 parallel to the positive Z-direction as the first direction has the Miller indices of <100>, and the crystal direction of one or more mono-like crystals included in the first intermediate portion Ac1 parallel to the positive Z-direction as the first direction also has the Miller indices of <100>. This structure may be achieved by, for example, placing the seed crystal assembly 200s on the bottom 121b of the mold 121 with a plane having the Miller indices of (100) to be the upper surface and unidirectionally growing the silicon melt MS1 to cause the resulting crystals to inherit the crystal direction of the seed crystal assembly 200s. This may improve, for example, the crystal growth rate during unidirectional solidification of the silicon melt MS1. Thus, for example, the first mono-like crystalline portion Am1, the second mono-like crystalline portion Am2, and the first intermediate seed crystal Ac1 are easily obtained by growing crystal grains upward from each of the first seed crystal Sd1, the second seed crystal Sd2, and the first intermediate seed crystal Cs1. Thus, the quality of the silicon ingot In1 may be, for example, easily improved. For example, the coincidence boundary included in each of the first boundary B1 and the second boundary B2 may include a Σ29 coincidence boundary. In this case, for example, a Σ29 random boundary constantly forms above each of boundaries between the first seed crystal Sd1 and the first intermediate seed crystal Cs1 and between the second seed crystal Sd2 and the first intermediate seed crystal Cs1 while mono-like crystals are growing from the seed crystal assembly 200s into the silicon ingot In1. In this case, for example, distortions are further reduced at the random boundary to cause fewer defects.

The first width W1 and the second width W2 may be, for example, the same or different. When, for example, the first width W1 and the second width W2 are different, the first seed crystal Sd1 and the second seed crystal Sd2 on the bottom 121b of the mold 121 may have different widths. Thus, for example, the seed crystal strips cut out from the cylindrical monocrystalline silicon lump Mc0 obtained by, for example, the CZ method and having different widths from one another may be used as the first seed crystal Sd1 and the second seed crystal Sd2. This allows, for example, easy manufacture of the high quality silicon ingot In1. In other words, the quality of the silicon ingot In1 may be, for example, easily improved.

The silicon ingot In1 may include, for example, three or more mono-like crystalline portions and intermediate portions each between adjacent ones of the mono-like crystalline portions aligned in the positive X-direction as the second direction. This may upsize, for example, the silicon ingot In1 further.

1-3-2. Structure of Silicon Ingot in First Modification

Figure 20A:
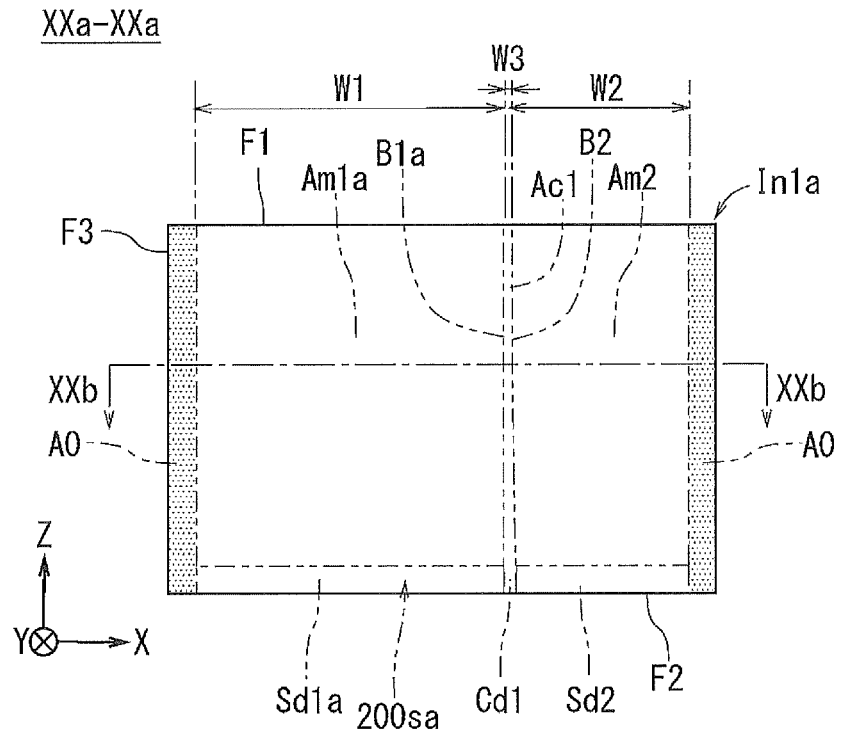
FIG. 20A illustrates a cross-sectional view of a silicon ingot according to a first modification taken along line XXa-XXa in FIG. 20B.
Figure 20B:
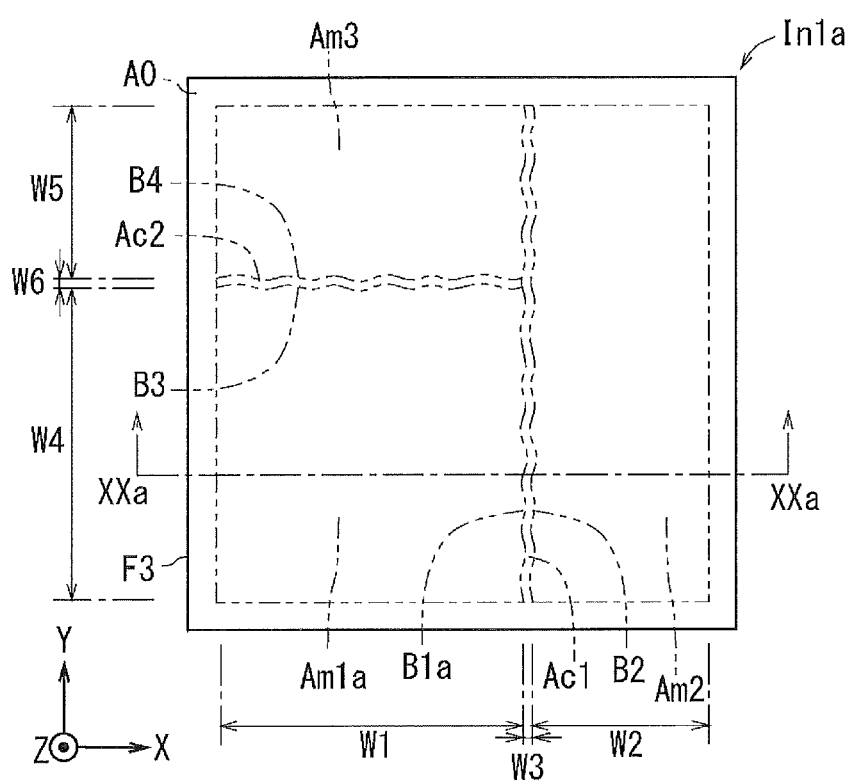
FIG. 20B illustrates a cross-sectional view of the silicon ingot according to the first modification taken along line XXb-XXb in FIG. 20A.

As shown in FIGS. 20A and 20B, the silicon ingot In1 described above may be, for example, modified into the silicon ingot In1a according to the first modification that includes, in place of the first mono-like crystalline portion Am1, a first mono-like crystalline portion Am1a, the second intermediate portion Ac2, the third mono-like crystalline portion Am3 that are adjacent to one another in sequence in the positive Y-direction as the third direction, which is perpendicular to the positive Z-direction as the first direction and crosses the positive X-direction as the second direction. The silicon ingot In1a may be manufactured with, for example, the manufacturing method for the silicon ingot In1a according to the first modification described above.

As shown in FIGS. 20A and 20B, the silicon ingot In1a includes, for example, the first mono-like crystalline portion Am1a, the second mono-like crystalline portion Am2, the third mono-like crystalline portion Am3, the first intermediate portion Ac1, and the second intermediate portion Ac2. More specifically, for example, the first mono-like crystalline portion Am1a, the first intermediate portion Ac1, and the second mono-like crystalline portion Am2 are adjacent to one another in the stated order in the positive X-direction as the second direction. The first mono-like crystalline portion Am1a, the second intermediate portion Ac2, and the third mono-like crystalline portion Am3 are adjacent to one another in the stated order in the positive Y-direction as the third direction. For example, the second intermediate portion Ac2 has one end in a direction parallel to the positive X-direction as the second direction in contact with a middle portion of the first intermediate portion Ac1 in a direction parallel to the positive Y-direction in the third direction. In other words, for example, the first intermediate portion Ac1 and the second intermediate portion Ac2 together form a T-shape. For example, the third mono-like crystalline portion Am3, the first intermediate portion Ac1, and the second mono-like crystalline portion Am2 are adjacent to one another in sequence in the positive X-direction as the second direction.

For example, the first intermediate portion Ac1 has a width (third width) W3 less than each of a width (first width) W1 of the first mono-like crystalline portion Am1a and the width (second width) W2 of the second mono-like crystalline portion Am2 in the positive X-direction as the second direction. In other words, for example, each of the first width W1 and the second width W2 is greater than the third width W3 in the positive X-direction as the second direction. For example, the second intermediate portion Ac2 has a width (sixth width) W6 less than each of a width (fourth width) W4 of the first mono-like crystalline portion Am1a and a width (fifth width) W5 of the third mono-like crystalline portion Am3 in the positive Y-direction as the third direction. In other words, for example, each of the fourth width W4 and the fifth width W5 is greater than the sixth width W6 in the positive Y-direction as the third direction. For example, each of the first surface F1 and the second surface F2 of the silicon ingot In1a is rectangular or square, and is about 350 mm on a side. In this case, for example, the first width W1, the second width W2, the fourth width W4, and the fifth width W5 are each about 50 to 250 mm, and the third width W3 and the sixth width W6 are each about 2 to 25 mm.

For example, a boundary (first boundary) B1a between the first mono-like crystalline portion Am1a and the first intermediate portion Ac1 includes a coincidence boundary. For example, the second boundary B2 between the first intermediate portion Ac1 and the second mono-like crystalline portion Am2 includes a coincidence boundary. For example, a boundary (third boundary) B3 between the first mono-like crystalline portion Am1a and the second intermediate portion Ac2 includes a coincidence boundary. For example, a boundary (fourth boundary) B4 between the second intermediate portion Ac2 and the third mono-like crystalline portion Am3 includes a coincidence boundary. For example, the boundary between the third mono-like crystalline portion Am3 and the first intermediate portion Ac1 may include a coincidence boundary.

For example, each of the first boundary B1a, the second boundary B2, the third boundary B3, and the fourth boundary B4 is curved in an imaginary cross section parallel to an XY plane perpendicular to the positive Z-direction as the first direction. Being curved herein includes at least one of, for example, arc-shaped, S-shaped, wavy, or meandering. Each of the first boundary B1a and the second boundary B2 including the curve has a width in the positive X-direction as the second direction within a range of, for example, several to 20 mm. Each of the third boundary B3 and the fourth boundary B4 including the curve has a width in the positive Y-direction as the third direction within a range of, for example, several to 20 mm. The silicon ingot In1a having such a structure includes functional grain boundaries including variously-directed curves forming constantly while, for example, the silicon melt MS1 is solidifying unidirectionally into the silicon ingot In1a. The structure may also increase the area of such a functional grain boundary. This allows, for example, more distortions in various directions to be easily absorbed at the functional grain boundary. The increased area of the functional grain boundary also allows easier absorption of distortions. These may thus reduce defects in the silicon ingot In1a, for example.

In one example, each of a first boundary B1a, the second boundary B2, the third boundary B3, and the fourth boundary B4 is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1a. This may further increase, for example, the functional grain boundaries including coincidence boundaries at which distortions are reduced, thus reducing defects. The silicon ingot In1a may thus have higher quality. In this example, the wavy first boundary B1a and second boundary B2 each have a maximum width in the positive X-direction as the second direction in a range of, for example, several to 20 mm. In this example, the wavy third boundary B3 and fourth boundary B4 each have a maximum width in the positive Y-direction as the third direction in a range of, for example, several to 20 mm.

For example, the silicon ingot In1a with the above structure suited to the manufacture of the silicon ingot M1a causing fewer defects may have higher quality with fewer defects. The coincidence boundaries and the ratio of each type of coincidence boundary may be identified in each of the first boundary B1a, the second boundary B2, the third boundary B3, and the fourth boundary B4 by measurement using EBSDs or other techniques. The curves in the first boundary B1a, the second boundary B2, the third boundary B3, and the fourth boundary B4 in an imaginary cross section parallel to an XY plane may be identified by cutting the silicon ingot In1a parallel to an XY plane with a wire saw, etching the cut surface with, for example, hydrofluoric acid, and then observing the etched surface with an optical microscope.

The silicon ingot In1a may include, for example, three or more mono-like crystalline portions and intermediate portions each between adjacent ones of the mono-like crystalline portions aligned in the positive X-direction as the second direction. The silicon ingot In1a may include, for example, three or more mono-like crystalline portions and intermediate portions each between adjacent ones of the mono-like crystalline portions aligned in the positive Y-direction as the third direction. This may upsize, for example, the silicon ingot In1a further.

1-3-3. Structure of Silicon Ingot in Second Modification

Figure 21A:
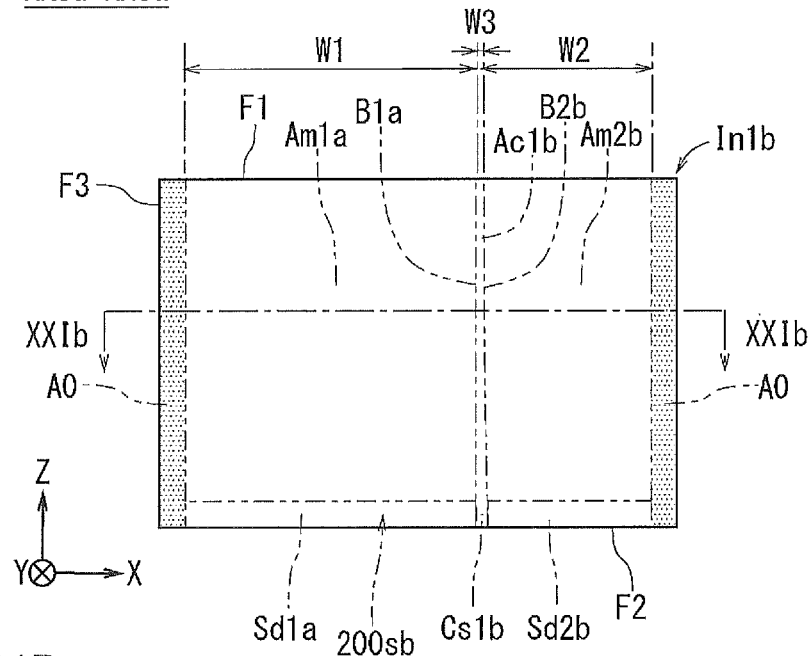
FIG. 21A illustrates a cross-sectional view of a silicon ingot according to a second modification taken along line XXIa-XXIa in FIG. 21B.
Figure 21B:
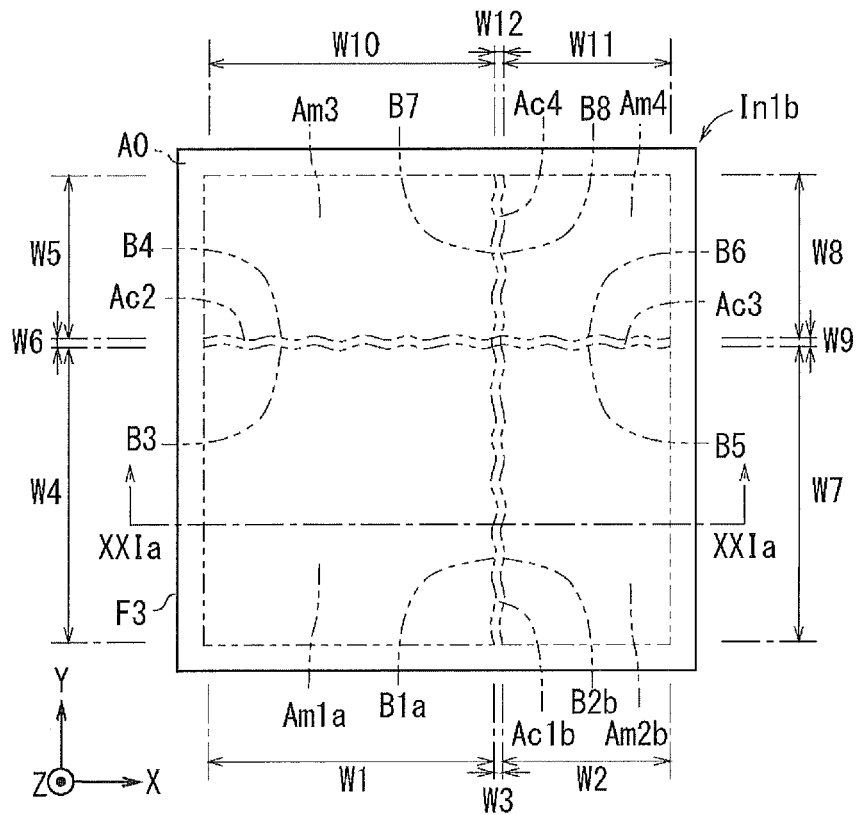
FIG. 21B illustrates a cross-sectional view of the silicon ingot according to the second modification taken along line XXIb-XXIb in FIG. 21A.

As shown in FIGS. 21A and 21B, the silicon ingot In1a described above may be, for example, modified into the silicon ingot In1b according to the second modification that includes, in place of the second mono-like crystalline portion Am2, a second mono-like crystalline portion Am2b, the third intermediate portion Ac3, and the fourth mono-like crystalline portion Am4 that are adjacent to one another in sequence in the positive Y-direction as the third direction. The silicon ingot In1b may be manufactured with, for example, the manufacturing method for the silicon ingot In1b according to the second modification described above.

As shown in FIGS. 21A and 21B, the silicon ingot In1b includes, for example, the first mono-like crystalline portion Am1a, the second mono-like crystalline portion Am2b, the third mono-like crystalline portion Am3, the fourth mono-like crystalline portion Am4, a first intermediate portion Ac1b, the second intermediate portion Ac2, the third intermediate portion Ac3, and the fourth intermediate portion Ac4. More specifically, for example, the first mono-like crystalline portion Am1a, the first intermediate portion Ac1b, and the second mono-like crystalline portion Am2b are adjacent to one another in the stated order in the positive X-direction as the second direction. The first mono-like crystalline portion Am1a, the second intermediate portion Ac2, and the third mono-like crystalline portion Am3 are adjacent to one another in the stated order in the positive Y-direction as the third direction. For example, the second mono-like crystalline portion Am2b, the third intermediate portion Ac3, and the fourth mono-like crystalline portion Am4 are adjacent to one another in the stated order in the positive Y-direction as the third direction. For example, the third mono-like crystalline portion Am3, the fourth intermediate portion Ac4, and the fourth mono-like crystalline portion Am4 are adjacent to one another in the stated order in the positive X-direction as the second direction.

The first intermediate portion Ac1b and the fourth intermediate portion Ac4 may define, for example, a single plate-like section extending in the positive Y-direction as the third direction, or may be deviated from each other in the positive X-direction as the second direction. The second intermediate portion Ac2 and the third intermediate portion Ac3 may define, for example, a single plate-like section extending in the positive X-direction as the second direction, or may be deviated from each other in the positive Y-direction as the third direction. In the example in FIG. 21B, the section defined by the first intermediate portion Ac1b and the fourth intermediate portion Ac4 and the section defined by the second intermediate portion Ac2 and the third intermediate portion Ac3 cross each other in a cross shape.

For example, the first intermediate portion Ac1b has a width (third width) W3 less than each of the width (first width) W1 of the first mono-like crystalline portion Am1a and a width (second width) W2 of the second mono-like crystalline portion Am2b in the positive X-direction as the second direction. In other words, for example, each of the first width W1 and the second width W2 is greater than the third width W3 in the positive X-direction as the second direction. The second intermediate portion Ac2 has the width (sixth width) W6 less than each of the width (fourth width) W4 of the first mono-like crystalline portion Am1a and the width (fifth width) W5 of the third mono-like crystalline portion Am3 in the positive Y-direction as the third direction. In other words, for example, each of the fourth width W4 and the fifth width W5 is greater than the sixth width W6 in the positive Y-direction as the third direction. For example, the third intermediate portion Ac3 has a width (ninth width) W9 less than each of a width (seventh width) W7 of the second mono-like crystalline portion Am2b and a width (eighth width) W8 of the fourth mono-like crystalline portion Am4 in the positive Y-direction as the third direction. In other words, for example, each of the seventh width W7 and the eighth width W8 is greater than the ninth width W9 in the positive Y-direction as the third direction. For example, the fourth intermediate portion Ac4 has a width (twelfth width) W12 less than each of a width (tenth width) W10 of the third mono-like crystalline portion Am3 and a width (eleventh width) W11 of the fourth mono-like crystalline portion Am4 in the positive X-direction as the second direction. In other words, for example, each of the tenth width W10 and the eleventh width W11 is greater than the twelfth width W12 in the positive X-direction as the second direction. For example, each of the first surface F1 and the second surface F2 of the silicon ingot In1a is rectangular or square, and is about 350 mm on a side. In this case, for example, each of the first width W1, the second width W2, the fourth width W4, the fifth width W5, the seventh width W7, the eighth width W8, the tenth width W10, and the eleventh width W11 is about 50 to 250 mm. Each of the third width W3, the sixth width W6, the ninth width W9, and the twelfth width W12 is about 2 to 25 mm.

For example, the boundary (first boundary) B1a between the first mono-like crystalline portion Am1a and the first intermediate portion Ac1b includes a coincidence boundary. For example, a boundary (second boundary) B2b between the first intermediate portion Ac1b and the second mono-like crystalline portion Am2b includes a coincidence boundary. For example, the boundary (third boundary) B3 between the first mono-like crystalline portion Am1a and the second intermediate portion Ac2 includes a coincidence boundary. For example, the boundary (fourth boundary) B4 between the second intermediate portion Ac2 and the third mono-like crystalline portion Am3 includes a coincidence boundary. For example, a boundary (fifth boundary) B5 between the second mono-like crystalline portion Am2b and the third intermediate portion Ac3 includes a coincidence boundary. For example, a boundary (sixth boundary) B6 between the third intermediate portion Ac3 and the fourth mono-like crystalline portion Am4 includes a coincidence boundary. For example, a boundary (seventh boundary) B7 between the third mono-like crystalline portion Am3 and the fourth intermediate portion Ac4 includes a coincidence boundary. For example, a boundary (eighth boundary) B8 between the fourth intermediate portion Ac4 and the fourth mono-like crystalline portion Am4 includes a coincidence boundary.

For example, each of the first boundary B1a, the second boundary B2b, the third boundary B3, the fourth boundary B4, the fifth boundary B5, the sixth boundary B6, the seventh boundary B7, and the eighth boundary B8 is curved in an imaginary cross section parallel to an XY plane perpendicular to the positive Z-direction as the first direction. Being curved herein includes at least one of, for example, arc-shaped, S-shaped, wavy, or meandering. Each of the first boundary B1a, the second boundary B2b, the seventh boundary B7, and the eighth boundary B8 including the curve has a width in the positive X-direction as the second direction within a range of, for example, several to 20 mm. Each of the third boundary B3, the fourth boundary B4, the fifth boundary B5, and the sixth boundary B6 including the curve has a width in the positive Y-direction as the third direction within a range of, for example, several to 20 mm. The silicon ingot In1*b* having such a structure includes variously-directed curves in its functional grain boundaries, which constantly form while, for example, the silicon melt MS1 is solidifying unidirectionally into the silicon ingot In1*b*. The structure may further increase the area in which such a functional grain boundary extends. This allows, for example, more distortions in various directions to be easily absorbed at the functional grain boundary. The further increased area of the functional grain boundary also allows easier absorption of distortions. These may thus reduce defects in the silicon ingot In1*b*, for example.

In one example, each of the first boundary B1*a*, the second boundary B2*b*, the third boundary B3, the fourth boundary B4, the fifth boundary B5, the sixth boundary B6, the seventh boundary B7, and the eighth boundary B8 is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1*b*. This may further increase, for example, the functional grain boundaries including coincidence boundaries at which distortions are reduced, thus reducing defects. The silicon ingot In1*b* may thus have higher quality. In this example, the wavy first boundary B1*a*, second boundary B2*b*, seventh boundary B7, and eighth boundary B8 each have a maximum width in the positive X-direction as the second direction in a range of, for example, several to 20 mm. In this example, the wavy third boundary B3, fourth boundary B4, fifth boundary B5, and sixth boundary B6 each have a maximum width in the positive Y-direction as the third direction in a range of, for example, several to 20 mm.

For example, the silicon ingot In1*b* with the above structure suited to the manufacture of the silicon ingot In1*b* causing fewer defects may have higher quality with fewer defects. The coincidence boundaries and the ratio of each type of coincidence boundary may be identified in each of the first boundary B1*a*, the second boundary B2*b*, the third boundary B3, the fourth boundary B4, the fifth boundary B5, the sixth boundary B6, the seventh boundary B7, and the eighth boundary B8 by measurement using EBSDs or other techniques. The curves in the first boundary B1a, the second boundary B2*b*, the third boundary B3, the fourth boundary B4, the fifth boundary B5, the sixth boundary B6, the seventh boundary B7, and the eighth boundary B8 in an imaginary cross section parallel to an XY plane may be identified by cutting the silicon ingot In1*b* parallel to an XY plane with a wire saw, etching the cut surface with, for example, hydrofluoric acid, and then observing the etched surface with an optical microscope.

The silicon ingot In1*b* may include, for example, three or more mono-like crystalline portions and intermediate portions each between adjacent ones of the mono-like crystalline portions aligned in the positive X-direction as the second direction. The silicon ingot In1*b* may include, for example, three or more mono-like crystalline portions and intermediate portions each between adjacent ones of the mono-like crystalline portions aligned in the positive Y-direction as the third direction. This may capsize, for example, the silicon ingot In1*b* further.

1-4. Silicon Block 1-4-1. Structure of Silicon Block

The block of silicon (silicon block) Bk1 according to the first embodiment will be described with reference to FIGS. 22A and 22B. In the example in FIGS. 22A and 22B, the silicon block Bk1 is a rectangular prism. The silicon block Bk1 may be obtained by, for example, cutting off the outer periphery of the silicon ingot In1 described above using, for example, a wire saw. The outer periphery is likely to contain defects. The periphery of the silicon ingot In1 includes, for example, a portion having a first thickness along the first surface F1, a portion having a second thickness along the second surface F2, and a portion having a third thickness along the third surface F3. The first thickness is, for example, about several to 20 mm. The second thickness is, for example, a thickness that allows cutting of the section corresponding to the seed crystal assembly 200*s*. The third thickness is, for example, a thickness that allows cutting of the peripheral portion A0.

Figure 22A:
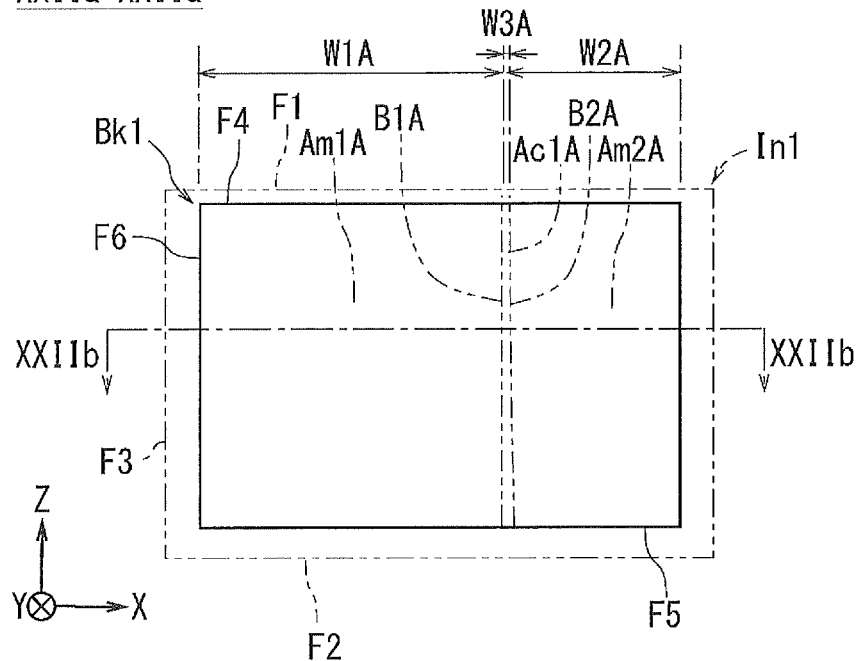
FIG. 22A illustrates a cross-sectional view of the silicon block according to the first embodiment taken along line XXIIa-XXIIa in FIG. 22B.
Figure 22B:
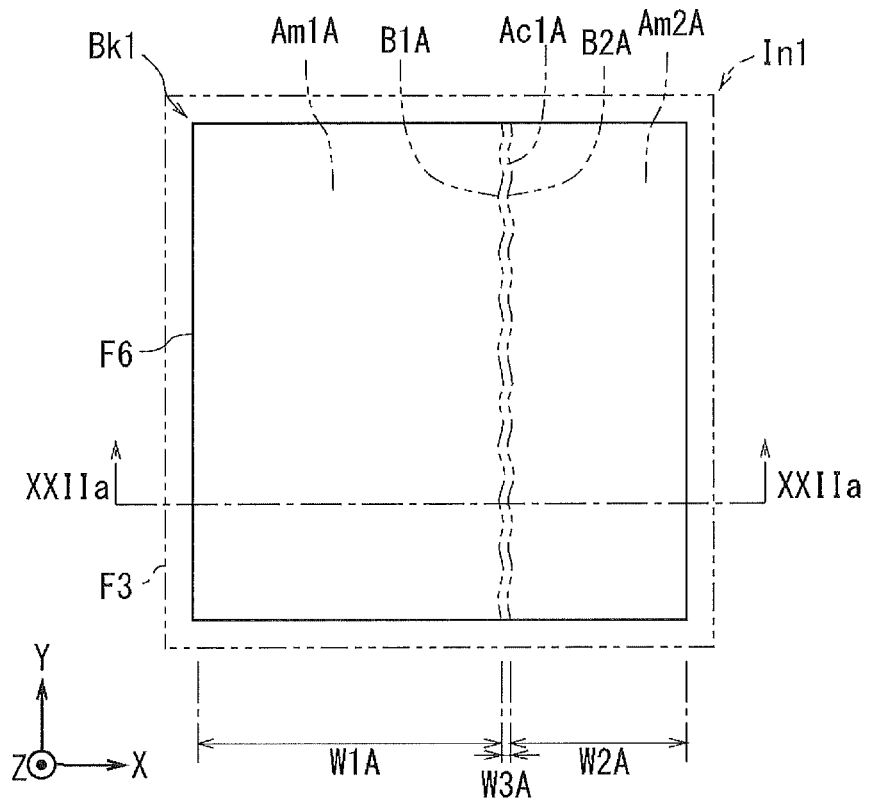
FIG. 22B illustrates a cross-sectional view of the silicon block according to the first embodiment taken along line XXIIb-XXIIb in FIG. 22A.

As shown in FIGS. 22A and 22B, the silicon block Bk1 has, for example, a fourth surface F4, a fifth surface F5, and a sixth surface F6. In the example in FIGS. 22A and 22B, the fourth surface F4 is rectangular or square surface (upper surface) facing in the positive Z-direction as the first direction. The fifth surface F5 is located opposite to the fourth surface F4. In the example in FIGS. 22A and 22B, the fifth surface F5 is rectangular or square surface (lower surface) facing in the negative Z-direction as the fourth direction, which is opposite to the first direction. The sixth surface F6 connects the fourth surface F4 and the fifth surface F5 and extends in the positive Z-direction as the first direction from the fifth surface F5 to the fourth surface F4. In the example in FIGS. 22A and 22B, the sixth surface F6 includes four surface (side surfaces) extending in the positive Z-direction as the first direction.

The silicon block Bk1 includes, for example, a 1A-mono-like crystalline portion Am1A, a 2A-mono-like crystalline portion Am2A, and a 1A-intermediate portion Ac1A. For example, the 1A-mono-like crystalline portion Am1A, the 1A-intermediate portion Ac1A, and the 2A-mono-like crystalline portion Am2A are adjacent to one another in the stated order in the positive X-direction as the second direction, which is perpendicular to the positive Z-direction as the first direction.

Each of the 1A-mono-like crystalline portion Am1A and the 2A-mono-like crystalline portion Am2A is a section of a mono-like crystal (mono-like crystalline portion). The 1A-mono-like crystalline portion Am1A is, for example, at least a part of the first mono-like crystalline portion Am1 in the silicon ingot In1. The 2A-mono-like crystalline portion Am2A is, for example, at least a part of the second mono-like crystalline portion Am2 in the silicon ingot In1. In the example in FIGS. 22A and 22B, each of the 1A-mono-like crystalline portion Am1A and the 2A-mono-like crystalline portion Am2A is a rectangular prism having a rectangular upper surface facing in the positive Z-direction as the first direction and a rectangular lower surface facing in the negative Z-direction as the fourth direction.

The 1A-intermediate portion Ac1A is a portion including one or more mono-like crystalline sections (intermediate portion). The 1A-intermediate portion Ac1A is, for example, at least a part of the first intermediate portion Ac1 in the silicon ingot In1. In the example in FIGS. 22A and 22B, the 1A-intermediate portion Ac1A is a plate-like portion having a narrow rectangular upper surface facing in the positive Z-direction as the first direction and a narrow rectangular lower surface facing in the negative Z-direction as the fourth direction. Thus, for example, a boundary (1A-boundary) B1A between the 1A-mono-like crystalline portion Am1A and the 1A-intermediate portion Ac1A and a boundary (2A-boundary) B2A between the 2A-mono-like crystalline portion Am2A and the 1A-intermediate portion Ac1A are rectangular. For example, the 1A-intermediate portion Ac1A is elongated in the positive Y-direction as the third direction.

For example, a width (1A-width) W1A of the 1A-mono-like crystalline portion Am1A and a width (2A-width) W2A of the 2A-mono-like crystalline portion Am2A each are greater than a width (3A-width) W3A of the 1A-intermediate portion Ac1A in the positive X-direction as the second direction. For example, each of the fourth surface F4 and the fifth surface F5 of the silicon block Bk1 is rectangular or square, and is about 300 to 320 mm on a side. In this case, for example, the 1A-width W1A and the 2A-width W2A are each about 50 to 250 mm. For example, the 3A-width W3A is about 2 to 25 mm.

For example, each of the 1A-boundary B1A and the 2A-boundary B2A includes a coincidence boundary. In this example, the surface of each of the 1A-mono-like crystalline portion Am1A, the 2A-mono-like crystalline portion Am2A, and the 1A-intermediate portion Ac1A perpendicular to the positive Z-direction as the first direction has the Miller indices of (100). In other words, the crystal direction of each of the 1A-mono-like crystalline portion Am1A and the 2A-mono-like crystalline portion Am2A parallel to the positive Z-direction as the first direction has the Miller indices of <100>, and the crystal direction of one or more mono-like crystals included in the 1A-intermediate portion Ac1A parallel to the positive Z-direction as the first direction also has the Miller indices of <100>.

In this case, for example, the coincidence boundary includes at least one of a Σ5 coincidence boundary, a Σ13 coincidence boundary, a Σ11 coincidence boundary, a Σ25 coincidence boundary, or a Σ29 coincidence boundary. The silicon block Bk1 having such a structure may be obtained by, for example, growing mono-like crystals from the seed crystal assembly 200s and forming a coincidence boundary above each of the boundaries between the first seed crystal Sd1 and the first intermediate seed crystal Cs1 and between the second seed crystal Sd2 and the first intermediate seed crystal Cs1, when manufacturing the silicon ingot In1 from which the silicon block Bk1 is cut out. While the coincidence boundary is forming, for example, distortions are reduced and thus cause fewer defects in the silicon ingot In1. For example, the silicon block Bk1 obtained by cutting off the periphery of the silicon ingot In1 may also have fewer defects.

In this example, each of the 1A-boundary B1A and the 2A-boundary B2A is curved in an imaginary cross section parallel to an XY plane perpendicular to the positive Z-direction as the first direction. Being curved herein includes at least one of, for example, arc-shaped, S-shaped, wavy, or meandering. Each of the 1A-boundary B1A and the 2A-boundary B2A including the curve has a width in the positive X-direction as the second direction within a range of, for example, several to 20 mm. The silicon block Bk1 having such a structure includes curves in its functional grain boundaries including coincidence boundaries, which, for example, constantly form as the silicon melt MS1 solidifies unidirectionally into the silicon ingot In1 from which the silicon block Bk1 is cut out. In this case, for example, the tangential direction of each functional grain boundary changes variously at various locations. This allows distortions in various directions to be easily absorbed by the functional grain boundary. The increased area of the functional grain boundary also allows easy absorption of distortions. This may, for example, reduce defects in the silicon ingot In1, and thus reduce defects in the silicon block Bk1 obtained by cutting off the peripheral portion of the silicon ingot In1.

In one example, each of the 1A-boundary B1A and 2A-boundary B2A is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1 from which the silicon block Bk1 is cut out. This may further increase, for example, the functional grain boundaries including coincidence boundaries at which distortions are reduced, thus reducing defects. The silicon block Bk1 may thus have higher quality. In this example, the wavy 1A-boundary B1A and 2A-boundary B2A each have a maximum width in the positive X-direction as the second direction in a range of, for example, several to 20 mm.

For example, the silicon block Bk1 with the above structure suited to the manufacture of the silicon ingot In1 with fewer defects may have higher quality and fewer defects. The coincidence boundaries and the ratio of each type of coincidence boundary may be identified in each of the 1A-boundary B1A and the 2A-boundary B2A by, for example, EBSDs. The curves in the 1A-boundary B1A and the 2A-boundary B2A in an imaginary cross section parallel to an XY plane may be identified by cutting the silicon block Bk1 parallel to an XY plane with a wire saw, etching the cut surface with, for example, hydrofluoric acid, and then observing the etched surface with an optical microscope.

In this example, the crystal direction of each of the 1A-mono-like crystalline portion Am1A and the 2A-mono-like crystalline portion Am2A parallel to the positive Z-direction as the first direction has the Miller indices of <100>, and the crystal direction of one or more mono-like crystals included in the 1A-intermediate portion Ac1A parallel to the positive Z-direction as the first direction also has the Miller indices of <100>. This structure may be achieved by, for example, placing the seed crystal assembly 200s on the bottom 121b of the mold 121 with a plane having the Miller indices of (100) to be the upper surface and unidirectionally growing the silicon melt MS1 to cause the resulting crystals to inherit the crystal direction of the seed crystal assembly 200s. This may improve, for example, the crystal growth rate during unidirectional solidification of the silicon melt MS1. Thus, for example, the silicon ingot In1 including the 1A-mono-like crystalline portion Am1A, the 2A-mono-like crystalline portion Am2A, and the 1A-intermediate portion Ac1A may be easily manufactured by growing crystal grains upward from each of the first seed crystal Sd1, the second seed crystal Sd2, and the first intermediate seed crystal Cs1. The silicon block Bk1 cut out from the silicon ingot In1 may thus easily have higher quality, for example.

For example, the coincidence boundary included in each of the 1A-boundary B1A and the 2A-boundary B2A may include a Σ29 coincidence boundary. In this case, for example, a Σ29 random boundary constantly forms above each of boundaries between the first seed crystal Sd1 and the first intermediate seed crystal Cs1 and between the second seed crystal Sd2 and the first intermediate seed crystal Cs1 while mono-like crystals are growing from the seed crystal assembly 200s into the silicon ingot In1 from which the silicon block Bk1 is cut out. The random boundary further reduces distortions to cause fewer defects. Thus, the silicon block Bk1 with the above structure suited to the manufacture of the silicon ingot In1 causing still fewer defects may have higher quality with still fewer defects.

The 1A-width W1A and the 2A-width W2A may be, for example, the same or different. When, for example, the 1A-width W1A and the 2A-width W2A are different, the first seed crystal Sd1 and the second seed crystal Sd2 on the bottom 121b of the mold 121 may have different widths. Thus, for example, the seed crystal strips cut out from the cylindrical monocrystalline silicon lump Mc0 obtained by, for example, the CZ method and having different widths from one another may be used as the first seed crystal Sd1 and the second seed crystal Sd2. This allows, for example, easy manufacture of the high quality silicon block Bk1. In other words, the quality of silicon block Bk1 may be, for example, easily improved.

For example, the silicon block Bk1 may have a third portion including one end (third end) nearer the fourth surface F4 in the fourth direction (negative Z-direction) opposite to the first direction (positive Z-direction) and a fourth portion including the other end (fourth end) opposite to the third end (nearer the fifth surface F5). When the silicon block Bk1 has a total length of 100 from the third end to the fourth end, the third portion may extend, for example, from 0 to about 30 with the third end being the basal end. The fourth portion may extend, for example, from about 50 to 100 with the third end being the basal end. For example, the third portion may have a higher ratio of Σ29 coincidence boundaries (random boundaries) than the fourth portion. Thus, for example, the random boundaries in the third portion reduce distortions to causer fewer defects. Thus, for example, the silicon block Bk1 cut out from the silicon ingot In1 manufactured using unidirectional solidification of the silicon melt MS1 may have fewer defects in the third portion, which is at a low position in the height direction. The quality of the silicon block Bk1 may thus be improved. For example, the fourth portion may have a higher ratio of Σ5 coincidence boundaries than the third portion. Thus, the fourth portion may have improved crystal quality. The coincidence boundaries and the types of coincidence boundaries in the silicon block Bk1 may be identified by measurement using EBSDs or other techniques. In this example, the portion including Σ5 coincidence boundaries includes a portion in which Σ29 coincidence boundaries and Σ5 coincidence boundaries are both detected.

The silicon block Bk1 may include, for example, three or more mono-like crystalline portions and intermediate portions each between adjacent ones of the mono-like crystalline portions aligned in the positive X-direction as the second direction. This may upsize, for example, the silicon block Bk1 further.

1-4-2. Structure of Silicon Block in First Modification

Figure 23A:
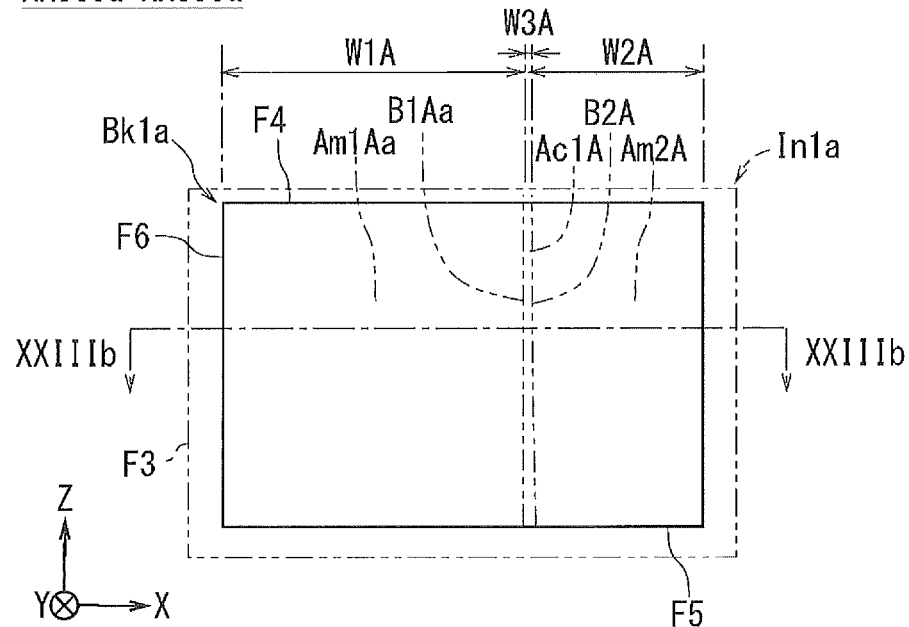
FIG. 23A illustrates a cross-sectional view of the silicon block according to the first modification taken along line XXIIIa-XXIIIa in FIG. 23B.
Figure 23B:
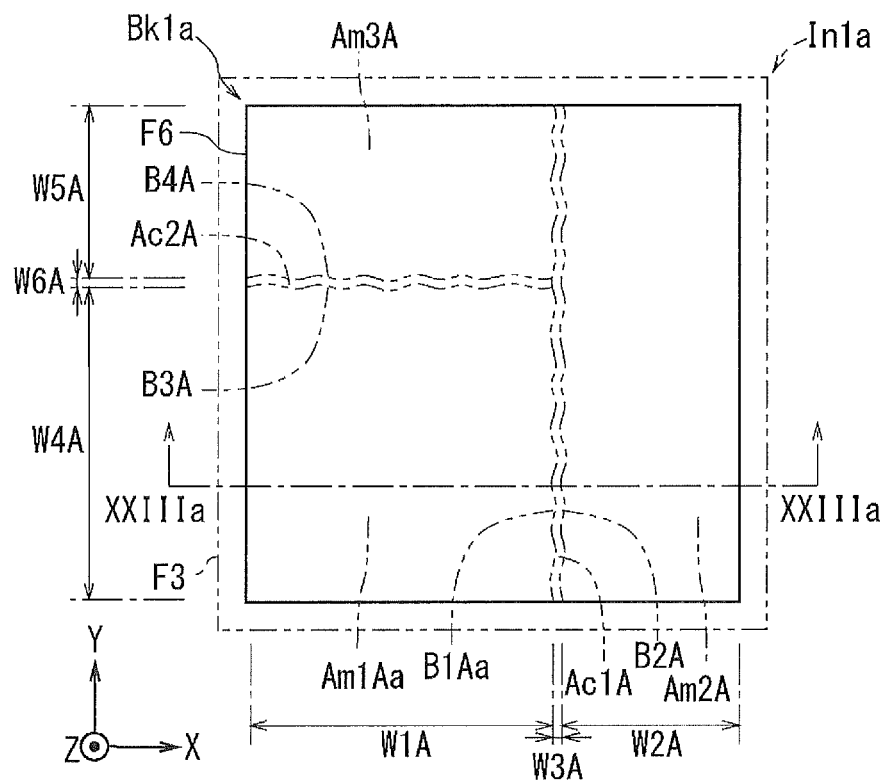
FIG. 23B illustrates a cross-sectional view of the silicon block according to the first modification taken along line XXIIIb-XXIIIb in FIG. 23A.

As shown in FIGS. 23A and 23B, the silicon block Bk1 described above may be, for example, modified into the silicon block Bk1a according to the first modification that includes, in place of the 1A-mono-like crystalline portion Am1A, a 1A-mono-like crystalline portion Am1Aa, a 2A-intermediate portion Ac2A, a 3A-mono-like crystalline portion Am3A that are adjacent to one another in sequence in the positive Y-direction as the third direction, which is perpendicular to the positive Z-direction as the first direction and crosses the positive X-direction as the second direction. For example, the silicon block Bk1a may be obtained by cutting off, using a wire saw or other tools, the outer periphery of the silicon ingot In1a that may be manufactured with the manufacturing method for the silicon ingot In1a according to the first modification described above. The outer periphery is likely to contain defects.

As shown in FIGS. 23A and 23B, the silicon block Bk1a includes, for example, the 1A-mono-like crystalline portion Am1Aa, the 2A-mono-like crystalline portion Am2A, the 3A-mono-like crystalline portion Am3A, the 1A-intermediate portion Ac1A, and the 2A-intermediate portion Ac2A. More specifically, for example, the 1A-mono-like crystalline portion Am1Aa, the 1A-intermediate portion Ac1A, and the 2A-mono-like crystalline portion Am2A are adjacent to one another in the stated order in the positive X-direction as the second direction. For example, the 1A-mono-like crystalline portion Am1Aa, the 2A-intermediate portion Ac2A, and the 3A-mono-like crystalline portion Am3A are adjacent to one another in the stated order in the positive Y-direction as the third direction. For example, the 2A-intennediate portion Ac2A has one end in a direction parallel to the positive X-direction as the second direction in contact with a middle portion of the 1A-intemiediate portion Ac1A in a direction parallel to the positive Y-direction in the third direction. In other words, for example, the 1A-intermediate portion Ac1A and the 2A-intermediate portion Ac2A together form a T-shape. In this example, the 3A-mono-like crystalline portion Am3A, the 1A-intermediate portion Ac1A, and the 2A-mono-like crystalline portion Am2A are adjacent to one another in sequence in the positive X-direction as the second direction.

For example, the 1A-intermediate portion Ac1A has the width (3A-width) W3A less than each of the width (1A-width) W1A of the 1A-mono-like crystalline portion Am1Aa and the width (2A-width) W2A of the 2A-mono-like crystalline portion Am2A in the positive X-direction as the second direction. In other words, for example, each of the 1A-width W1A and the 2A-width W2A is greater than the 3A-width W3A in the positive X-direction as the second direction. For example, the 2A-intermediate portion Ac2A has a width (6A-width) W6A less than each of a width (4A-width) W4A of the 1A-mono-like crystalline portion Am1Aa and a width (5A-width) W5A of the 3A-mono-like crystalline portion Am3A in the positive Y-direction as the third direction. In other words, for example, each of the 4A-width W4A and the 5A-width W5A is greater than the 6A-width W6A in the positive Y-direction as the third direction. For example, each of the fourth surface F4 and the fifth surface F5 of the silicon block Bk1a is rectangular or square, and is about 300 to 320 mm on a side. In this case, for example, the 1A-width W1A, the 2A-width W2A, the 4A-width W4A, and the 5A-width W5A are each about 50 to 250 mm, and the 3A-width W3A and the 6A-width W6A are each about 2 to 25 mm.

For example, a boundary (1A-boundary) B1Aa between the 1A-mono-like crystalline portion Am1Aa and the 1A-intermediate portion Ac1A includes a coincidence boundary. For example, the 2A-boundary B2A between the 1A-intermediate portion Ac1A and the 2A-mono-like crystalline portion Am2A includes a coincidence boundary. For example, a boundary (3A-boundary) B3A between the 1A-mono-like crystalline portion Am1Aa and the 2A-intermediate portion Ac2A includes a coincidence boundary. For example, a boundary (4A-boundary) B4A between the 2A-intermediate portion Ac2A and the 3A-mono-like crystalline portion Am3A includes a coincidence boundary. For example, the boundary between the 3A-mono-like crystalline portion Am3A and 1A-intermediate portion Ac1A may include a coincidence boundary.

For example, each of the 1A-boundary B1Aa, the 2A-boundary B2A, the 3A-boundary B3A, and the 4A-boundary B4A is curved in an imaginary cross section parallel to an XY plane perpendicular to the positive Z-direction as the first direction. Being curved herein includes at least one of, for example, arc-shaped, S-shaped, wavy, or meandering. Each of the 1A-boundary B1Aa and the 2A-boundary B2A including the curve has a width in the positive X-direction as the second direction within a range of, for example, several to 20 mm.

Each of the 3A-boundary B3A and the 4A-boundary B4A including the curve has a width in the positive Y-direction as the third direction within a range of, for example, several to 20 mm. The silicon block Bk1a having such a structure includes functional grain boundaries including variously-directed curves forming constantly while, for example, the silicon melt MS1 is solidifying unidirectionally into the silicon ingot In1a from which the silicon block Bk1a is cut out. The structure may also increase the area of such a functional grain boundary. This allows, for example, more distortions in various directions to be easily absorbed at the functional grain boundary. The increased area of the functional grain boundary also allows easier absorption of distortions. This may, for example, reduce defects in the silicon ingot In1a, and thus reduce defects in the silicon block Bk1a obtained by cutting off the peripheral portion of the silicon ingot In1a.

In one example, each of the 1A-boundary B1Aa, the 2A-boundary B2A, the 3A-boundary B3A, and the 4A-boundary B4A is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1a from which the silicon block Bk1a is cut out. This may further increase, for example, the functional grain boundaries including coincidence boundaries at which distortions are reduced, thus reducing defects. This, for example, improves the quality of the silicon ingot In1a, and thus improves the quality of the silicon block Bk1a obtained by cutting the peripheral portion of the silicon ingot In1a. In this example, the wavy 1A-boundary B1Aa and 2A-boundary B2A each have a maximum width in the positive X-direction as the second direction in a range of, for example, several to 20 mm. In this example, the wavy 3A-boundary B3A and 4A-boundary B4A each have a maximum width in the positive Y-direction as the third direction in a range of, for example, several to 20 mm.

For example, the silicon block Bk1a with the above structure suited to the manufacture of the silicon ingot In1a with fewer defects may have higher quality and fewer defects. The coincidence boundaries and the ratio of each type of coincidence boundary may be identified in each of the 1A-boundary B1Aa, the 2A-boundary B2A, the 3A-boundary B3A, and the 4A-boundary B4A by, for example, EB SDs. The curves in the 1A-boundary B1Aa, the 2A-boundary 92A, the 3A-boundary B3A, and the 4A-boundary B4A in an imaginary cross section parallel to an XY plane may be identified by cutting the silicon block Bk1a parallel to an XY plane with a wire saw, etching the cut surface with, for example, hydrofluoric acid, and then observing the etched surface with an optical microscope.

The silicon block Bk1a may include, for example, three or more mono-like crystalline portions and intermediate portions each between adjacent ones of the mono-like crystalline portions aligned in the positive X-direction as the second direction. The silicon block Bk1a may include, for example, three or more mono-like crystalline portions and intermediate portions each between adjacent ones of the mono-like crystalline portions aligned in the positive Y-direction as the third direction. This may capsize, for example, the silicon block Bk1a further.

1-4-3. Structure of Silicon Block in Second Modification

Figure 24A:
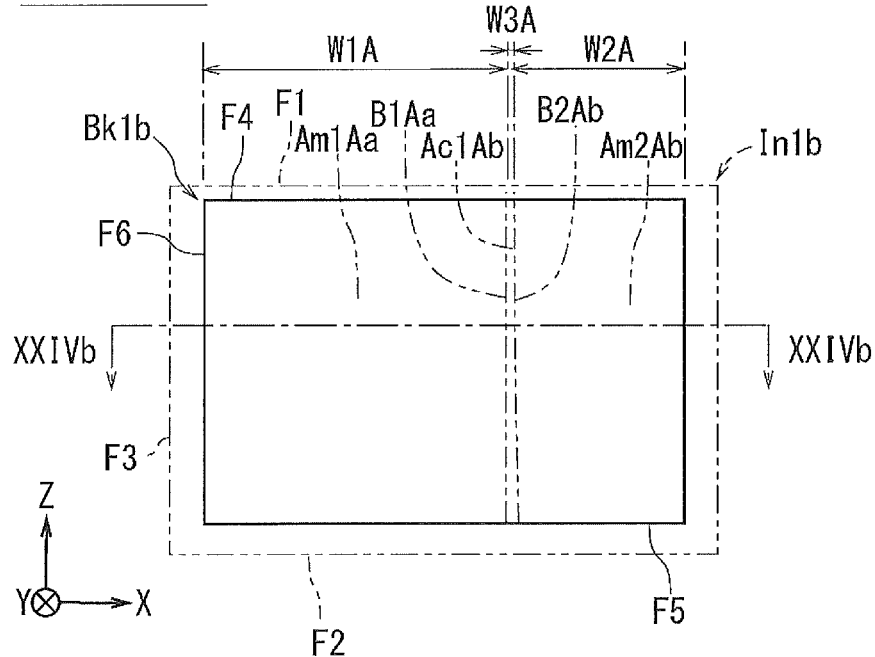
FIG. 24A illustrates a cross-sectional view of the silicon block according to the second modification taken along line XXIVa-XXIVa in FIG. 24B.
Figure 24B:
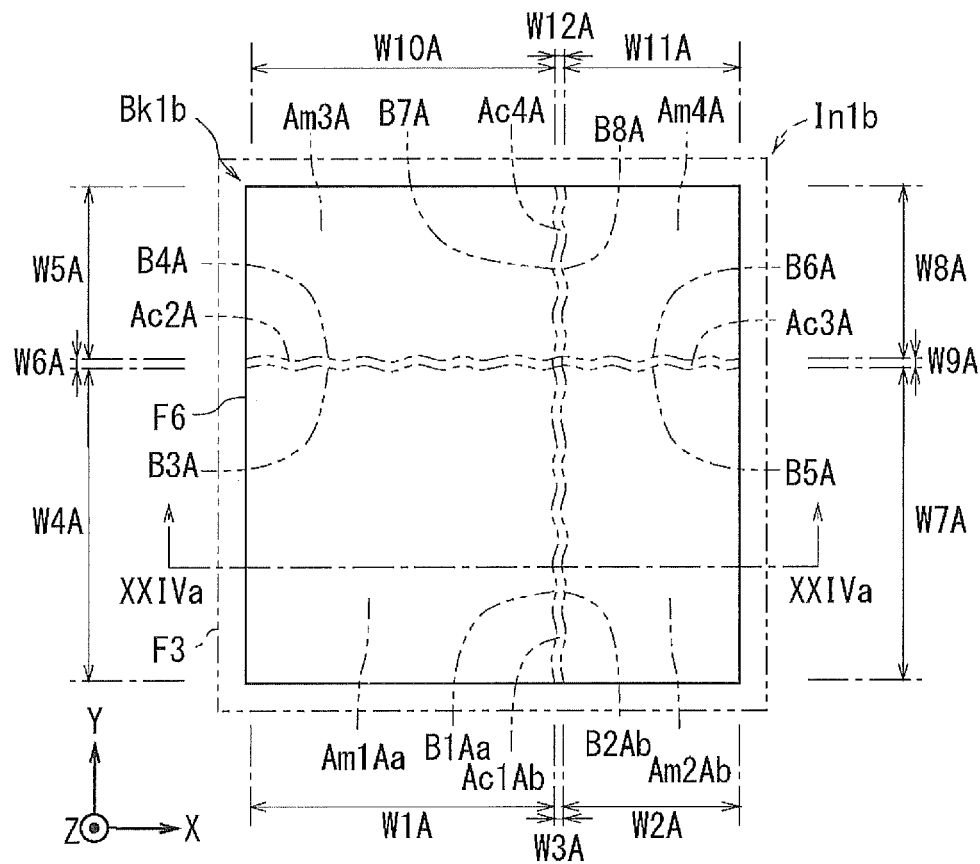
FIG. 24B illustrates a cross-sectional view of the silicon block according to the second modification taken along line XXIVb-XXIVb in FIG. 24A.

As shown in FIGS. 24A and 24B, the silicon block Bk1a described above may be, for example, modified into the silicon block Bk1b according to the second modification that includes, in place of the 2A-mono-like crystalline portion Am2A, a 2A-mono-like crystalline portion Am2Ab, a 3A-intermediate portion Ac3A, and a 4A-mono-like crystalline portion Am4A that are adjacent to one another in sequence in the positive Y-direction as the third direction. For example, the silicon block Bk1b may be obtained by cutting off, using a wire saw or other tools, the outer periphery of the silicon ingot In1b that may be manufactured with the manufacturing method for the silicon ingot In1b according to the second modification described above. The outer periphery is likely to contain defects.

As shown in FIGS. 24A and 24B, the silicon block Bk1b includes, for example, the 1A-mono-like crystalline portion Am1Aa, the 2A-mono-like crystalline portion Am2Ab, the 3A-mono-like crystalline portion Am3A, the 4A-mono-like crystalline portion Am4A, a 1A-intermediate portion Ac1Ab, the 2A-intermediate portion Ac2A, the 3A-intermediate portion Ac3A, and a 4A-intermediate portion Ac4A. More specifically, for example, the 1A-mono-like crystalline portion Am1Aa, the 1A-intermediate portion Ac1Ab, and the 2A-mono-like crystalline portion Am2Ab are adjacent to one another in the stated order in the positive X-direction as the second direction. For example, the 1A-mono-like crystalline portion Am1Aa, the 2A-intermediate portion Ac2A, and the 3A-mono-like crystalline portion Am3A are adjacent to one another in the stated order in the positive Y-direction as the third direction. For example, the 2A-mono-like crystalline portion Am2Ab, the 3A-intermediate portion Ac3A, and the 4A-mono-like crystalline portion Am4A are adjacent to one another in the stated order in the positive Y-direction as the third direction. For example, the 3A-mono-like crystalline portion Am3A, the 4A-intermediate portion Ac4A, and the 4A-mono-like crystalline portion Am4A are adjacent to one another in the stated order in the positive X-direction as the second direction.

The 1A-intermediate portion Ac1Ab and the 4A-intermediate portion Ac4A may define, for example, a single plate-like section extending in the positive Y-direction as the third direction, or may be deviated from each other in the positive X-direction as the second direction. The 2A-intermediate portion Ac2A and the 3A-intermediate portion Ac3A may define, for example, a single plate-like section extending in the positive X-direction as the second direction, or may be deviated from each other in the positive Y-direction as the third direction. In the example in FIG. 24B, the section defined by the 1A-intermediate portion Ac1Ab and the 4A-intermediate portion Ac4A and the section defined by the 2A-intermediate portion Ac2A and the 3A-intermediate portion Ac3A cross each other in a cross shape.

For example, the 1A-intermediate portion Ac1Ab has the width (3A-width) W3A less than each of the width (1A-width) W1A of the 1A-mono-like crystalline portion Am1Aa and the width (2A-width) W2A of the 2A-mono-like crystalline portion Am2Ab in the positive X-direction as the second direction. In other words, for example, each of the 1A-width W1A and the 2A-width W2A is greater than the 3A-width W3A in the positive X-direction as the second direction. For example, the 2A-intermediate portion Ac2A has the width (6A-width) W6A less than each of the width (4A-width) W4A of the 1A-mono-like crystalline portion Am1Aa and the width (5A-width) W5A of the 3A-mono-like crystalline portion Am3A in the positive Y-direction as the third direction. In other words, for example, each of the 4A-width W4A and the 5A-width W5A is greater than the 6A-width W6A in the positive Y-direction as the third direction. For example, the 3A-intermediate portion Ac3A has a width (9A-width) W9A less than each of a width (7A-width) W7A of the 2A-mono-like crystalline portion Am2Ab and a width (8A-width) W8A of the 4A-mono-like crystalline portion Am4A in the positive Y-direction as the third direction. In other words, for example, each of the 7A-width W7A and the 8A-width W8A is greater than the 9A-width W9A in the positive Y-direction as the third direction. For example, the 4A-intermediate portion Ac4A has a width (12A-width) W12A less than each of a width (10A-width) W10A of the 3A-mono-like crystalline portion Am3A and a width (11A-width) W11A of the 4A-mono-like crystalline portion Am4A in the positive X-direction as the second direction. In other words, for example, each of the 10A-width W10A and the 11A-width W11A is greater than the 12A-width W12A in the positive X-direction as the second direction.

In this example, each of the fourth surface F4 and the fifth surface F5 of the silicon block Bk1$b$ is rectangular or square, and is about 300 to 320 mm on a side. In this case, for example, the 1A-width W1A, the 2A-width W2A, the 4A-width W4A, the 5A-width W5A, the 7A-width W7A, the 8A-width W8A, the 10A-width W10A, and the 11A-width W11A are each about 50 to 250 mm. The 3A-width W3A, the 6A-width W6A, the 9A-width W9A, and the 12A-width W12A each are about 2 to 25 mm.

For example, the boundary (1A-boundary) B1Aa between the 1A-mono-like crystalline portion Am1Aa and the 1A-intermediate portion Ac1Ab includes a coincidence boundary. For example, a boundary (2A-boundary) B2Ab between the 1A-intermediate portion Ac1Ab and the 2A-mono-like crystalline portion Am2Ab includes a coincidence boundary. For example, the boundary (3A-boundary) B3A between the 1A-mono-like crystalline portion AmlAa and the 2A-intermediate portion Ac2A includes a coincidence boundary. For example, the boundary (4A-boundary) B4A between the 2A-intermediate portion Ac2A and the 3A-mono-like crystalline portion Am3A includes a coincidence boundary. For example, a boundary (5A-boundary) B5A between the 2A-mono-like crystalline portion Am2Ab and the 3A-intermediate portion Ac3A includes a coincidence boundary. For example, a boundary (6A-boundary) B6A between the 3A-intermediate portion Ac3A and the 4A-mono-like crystalline portion Am4A includes a coincidence boundary. For example, a boundary (7A-boundary) B7A between the 3A-mono-like crystalline portion Am3A and the 4A-intermediate portion Ac4A includes a coincidence boundary. For example, a boundary (8A-boundary) B8A between the 4A-intermediate portion Ac4A and the 4A-mono-like crystalline portion Am4A includes a coincidence boundary.

For example, each of the 1A-boundary B1Aa, the 2A-boundary B2Ab, the 3A-boundary B3A, the 4A-boundary B4A, the 5A-boundary B5A, the 6A-boundary B6A, the 7A-boundary B7A, and the 8A-boundary B8A is curved in an imaginary cross section parallel to an XY plane perpendicular to the positive Z-direction as the first direction. Being curved herein includes at least one of, for example, arc-shaped, S-shaped, wavy, or meandering. Each of the 1A-boundary B1Aa, the 2A-boundary B2Ab, the 7A-boundary B7A, and the 8A-boundary B8A including the curve has a width in the positive X-direction as the second direction within a range of, for example, several to 20 mm. Each of the 3A-boundary B3A, the 4A-boundary B4A, the 5A-boundary B5A, and the 6A-boundary B6A including the curve has a width in the positive Y-direction as the third direction within a range of, for example, several to 20 mm. The silicon block Bk1$b$ having such a structure includes functional grain boundaries including variously-directed curves forming constantly while, for example, the silicon melt MS1 is solidifying unidirectionally into the silicon ingot In1$b$ from which the silicon block Bk1$b$ is cut out. The structure may also further increase the area of such a functional grain boundary. This allows, for example, more distortions in various directions to be easily absorbed at the functional grain boundary. The further increased area of the functional grain boundary also allows easier absorption of distortions. This may, for example, reduce defects in the silicon ingot In1$b$, and thus reduce defects in the silicon block Bk1$b$ obtained by cutting off the peripheral portion of the silicon ingot In1$b$.

In this example, each of the 1A-boundary B1Aa, the 2A-boundary B2Ab, the 3A-boundary B3A, the 4A-boundary B4A, the 5A-boundary B5A, the 6A-boundary B6A, the 7A-boundary B7A, and the 8A-boundary B8A is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1$b$ from which the silicon block Bk1$b$ is cut out. This may further increase, for example, the functional grain boundaries including coincidence boundaries at which distortions are reduced, thus reducing defects. This, for example, improves the quality of the silicon ingot In1$b$, and thus improves the quality of the silicon block Bk1$b$ obtained by cutting the peripheral portion of the silicon ingot In1$b$. In this example, the wavy 1A-boundary B1Aa, 2A-boundary B2Ab, 7A-boundary B7A, and 8A-boundary B8A each have a maximum width in the positive X-direction as the second direction in a range of, for example, several to 20 mm. In this example, the wavy 3A-boundary B3A, 4A-boundary B4A, 5A-boundary B5A, and 6A-boundary B6A each have a maximum width in the positive Y-direction as the third direction in a range of, for example, several to 20 mm.

For example, the silicon block Bk1$b$ with the above structure suited to the manufacture of the silicon ingot In1$b$ with fewer defects may have higher quality and fewer defects. The coincidence boundaries and the ratio of each type of coincidence boundary may be identified in each of the 1A-boundary B1Aa, the 2A-boundary B2Ab, the 3A-boundary B3A, the 4A-boundary B4A, the 5A-boundary B5A, the 6A-boundary B6A, the 7A-boundary B7A, and the 8A-boundary B8A by measurement using EBSDs or other techniques. The curves in the 1A-boundary B1Aa, the 2A-boundary B2Ab, the 3A-boundary B3A, the 4A-boundary B4A, the 5A-boundary B5A, the 6A-boundary B6A, the 7A-boundary B7A, and the 8A-boundary B8A in an imaginary cross section parallel to an XY plane may be identified by cutting the silicon block Bk1$b$ parallel to an XY plane with a wire saw, etching the cut surface with, for example, hydrofluoric acid, and then observing the etched surface with an optical microscope.

The silicon block Bk1$b$ may include, for example, three or more mono-like crystalline portions and intermediate portions similar to 1A-intermediate portions Ac1Ab each between adjacent ones of the mono-like crystalline portions aligned in the positive X-direction as the second direction. The silicon block Bk1b may include, for example, three or more mono-like crystalline portions and intermediate portions similar to the 2A-intermediate portions Ac2A each between adjacent ones of the mono-like crystalline portions aligned in the positive Y-direction as the third direction. This may upsize, for example, the silicon block Bk1b further.

1-5. Small Silicon Block

Figure 25A:
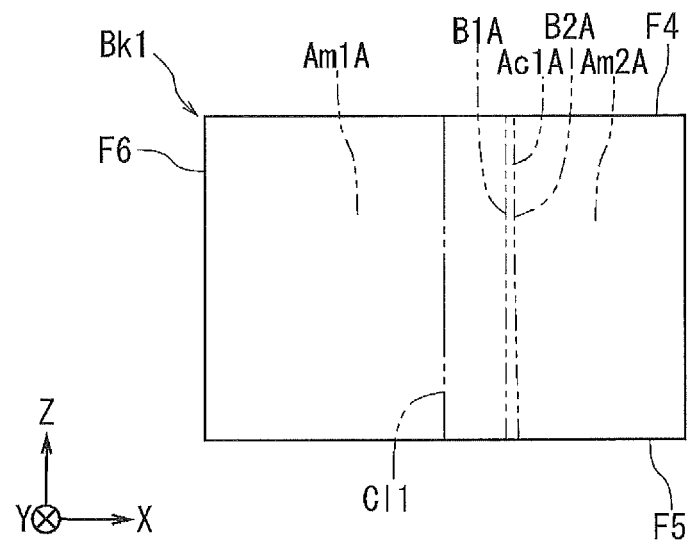
FIG. 25A illustrates a front view of a silicon block, showing an example position at which the silicon block is cut.
Figure 25B:
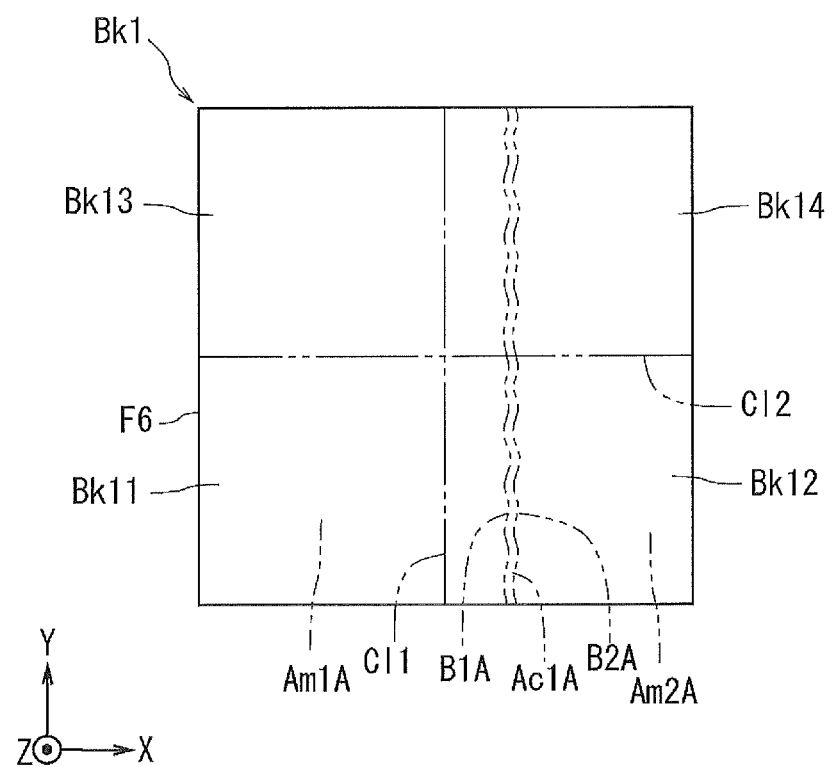
FIG. 25B illustrates a plan view of the silicon block, showing the position at which the silicon block is cut.

In the example show in FIGS. 25A and 25B, the silicon block Bk1 is divided into two equal parts in the positive X-direction as the second direction and also into two equal parts in the positive Y-direction as the third direction for manufacture of silicon substrates 1. For example, the silicon block Bk1 is cut along a first cut surface C11 in a YZ plane and along a second cut surface C12 in an XZ plane into four silicon blocks, which are relatively small (small silicon blocks). The four small silicon blocks include a first small silicon block Bk11, a second small silicon block Bk12, a third small silicon block Bk13, and fourth small silicon block Bk14. The silicon block Bk1 is cut with, for example, a wire saw.

Figure 26A:
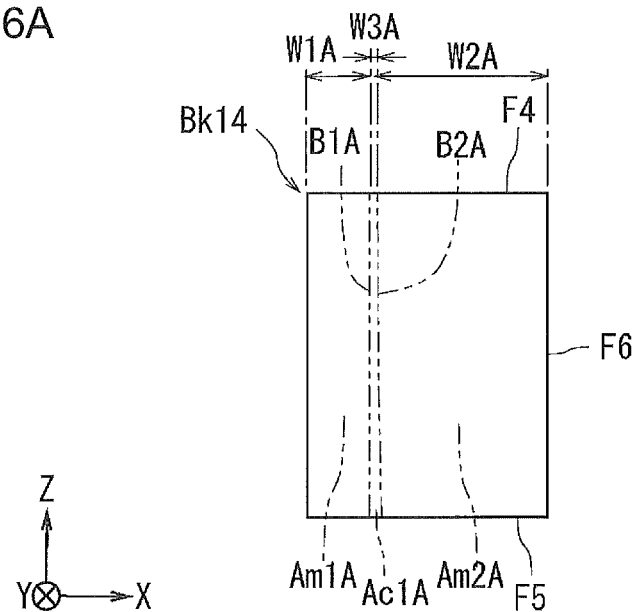
FIG. 26A illustrates a front view of an example fourth small silicon block.
Figure 26B:
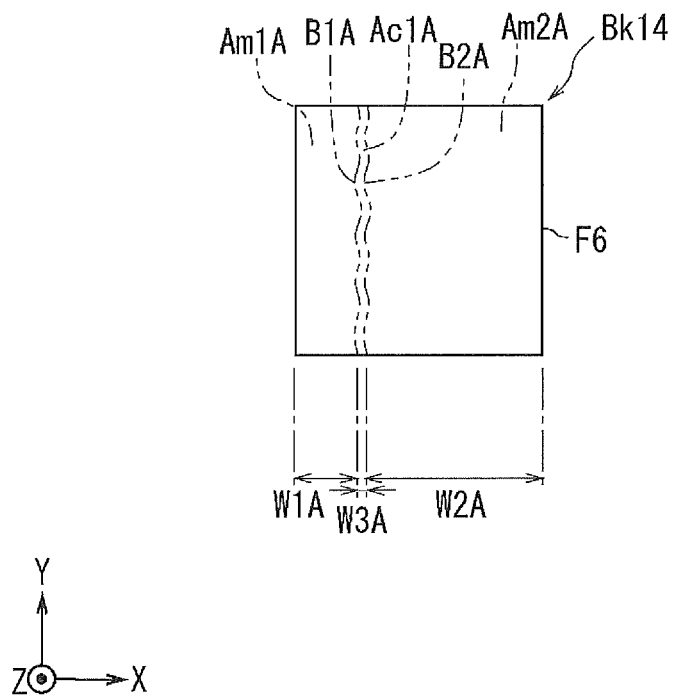
FIG. 26B illustrates a plan view of the fourth small silicon block.

In the example in FIGS. 25A and 25B, the first small silicon block Bk11 includes a part of the 1A-mono-like crystalline portion Am1A. The second small silicon block Bk12 includes a part of the 1A-mono-like crystalline portion Am1A, a part of the 1A-intermediate portion Ac1A, and a part of the 2A-mono-like crystalline portion Am2A. The third small silicon block Bk13 includes a part of the 1A-mono-like crystalline portion Am1A. The fourth small silicon block Bk14 includes a part of the 1A-mono-like crystalline portion Am1A, a part of the 1A-intermediate portion Ac1A, and the 2A-mono-like crystalline portion Am2A. As shown in FIGS. 26A and 26B, the fourth small silicon block Bk14 may have, for example, each of the 1A-width W1A of 1A-mono-like crystalline portion Am1A and the 2A-width W2A of the 2A-mono-like crystalline portion Am2A greater than the 3A-width W3A of the 1A-intermediate portion Ac1A in the positive X-direction as the second direction. The 1A-width W1A and the 2A-width W2A may be the same or different.

1-6. Silicon Substrate 1-6-1. Structure of Silicon Substrate

Figure 27A:
FIG. 27A illustrates a front view of an example silicon substrate according to the first embodiment.
Figure 27B:
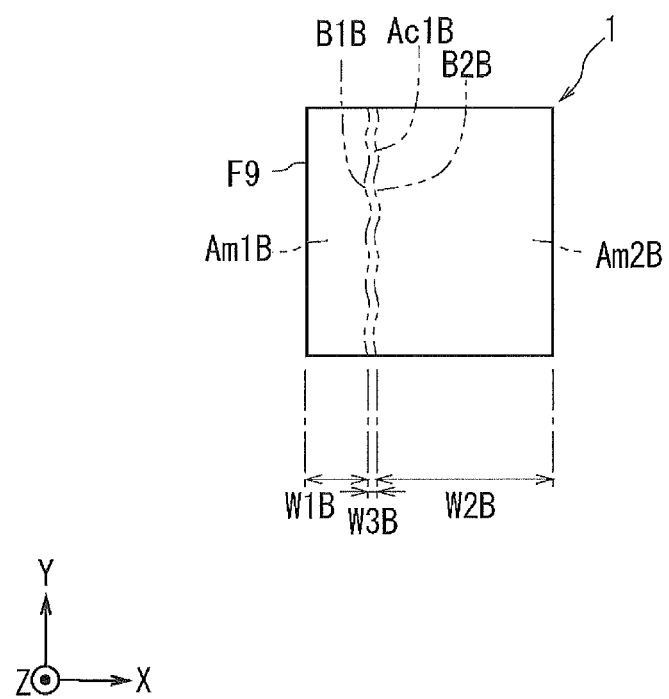
FIG. 27B illustrates a plan view of the silicon substrate according to the first embodiment.

The substrate of silicon (silicon substrate) 1 according to the first embodiment will be described with reference to FIGS. 27A and 27B. In the example in FIGS. 27A and 27B, the silicon substrate 1 is a plate having rectangular front and back surfaces. For example, the silicon substrate 1 may be obtained by slicing, at predetermined intervals in the positive Z-direction as the first direction, a small silicon block such as the fourth small silicon block Bk14 along an XY plane parallel to the fourth and fifth surfaces F4 and F5. FIGS. 27A and 27B each show an example silicon substrate 1 obtained by slicing the fourth small silicon block Bk14. For example, the fourth small silicon block Bk14 is sliced with, for example, a wire saw into silicon substrates 1 each having a thickness of about 100 to 300 μm and having a square plate surface that is about 150 mm on a side. The surface layer of the silicon substrate 1 may include a damage layer resulting from the cutting of the small silicon block. The damage layer may be removed by etching using, for example, a sodium hydroxide solution.

As shown in FIGS. 27A and 27B, the silicon substrate 1 is a flat plate having, for example, a seventh surface F7, an eighth surface F8, and a ninth surface F9. The eighth surface F8 is located opposite to the seventh surface F7. The ninth surface F9 connects the seventh surface F7 and the eighth surface F8, and is an outer peripheral surface extending in the positive Z-direction as the first direction from the eighth surface F8 to the seventh surface F7. In the example in FIGS. 27A and 27B, the seventh surface F7 is a rectangular or square surface (front surface) facing in the positive Z-direction as the first direction. The eighth surface F8 is a rectangular or square surface (back surface) facing in the negative Z-direction as the fourth direction, which is opposite to the first direction. The ninth surface F9 is an outer peripheral surface aligned with the four sides of each of the seventh surface F7 and the eighth surface F8.

The silicon substrate 1 includes, for example, a 1B-mono-like crystalline portion Am1B, a 2B-mono-like crystalline portion Am2B, and a 1B-intermediate portion Ac1B. The 1B-mono-like crystalline portion Am1B, the 1B-intermediate portion Ac1B, and the 2B-mono-like crystalline portion Am2B are adjacent to one another in the stated order in the positive X-direction as the second direction. Each of the 1B-mono-like crystalline portion Am1B and the 2B-mono-like crystalline portion Am2B is a section of a mono-like crystal (mono-like crystalline portion).

The 1B-mono-like crystalline portion Am1B is, for example, at least a part of the 1A-mono-like crystalline portion Am1A in the silicon block Bk1. The 2B-mono-like crystalline portion Am2B is, for example, at least a part of the 2A-mono-like crystalline portion Am2A in the silicon block Bk1. In the example in FIGS. 27A and 27B, each of the 1B-mono-like crystalline portion Am1B and the 2B-mono-like crystalline portion Am2B is a plate-like portion having a rectangular front surface facing in the positive Z-direction as the first direction and a rectangular back surface facing in the negative Z-direction as the fourth direction.

The 1B-intermediate portion Ac1B is a portion including one or more mono-like crystalline sections (intermediate portion). The 1B-intermediate portion Ac1B is, for example, at least a part of the 1A-intermediate portion Ac1A in the silicon block Bk1. In the example in FIGS. 27A and 27B, the 1B-intermediate portion Ac1B is a rod-like portion having a narrow rectangular upper surface facing in the positive Z-direction as the first direction and a narrow rectangular lower surface facing in the negative Z-direction as the fourth direction. For example, a boundary (1B-boundary) B1B between the 1B-mono-like crystalline portion Am1B and the 1B-intermediate portion Ac1B and a boundary (2B-boundary) B2B between the 2B-mono-like crystalline portion Am2B and the 1B-intermediate portion Ac1B are elongated in the positive Y-direction as the third direction. For example, the 1B-intermediate portion Ac1B is elongated in the positive Y-direction as the third direction.

For example, a width (1B-width) W1B of the 1B-mono-like crystalline portion Am1B and a width (2B-width) W2B of the 2B-mono-like crystalline portion Am2B each are greater than a width (3B-width) W3B of the 1B-intermediate portion Ac1B in the positive X-direction as the second direction. In this example, the seventh surface F7 and the eighth surface F8 of the silicon substrate 1 each are square, and is about 150 mm on a side. In this case, each of the 1B-width W1B and the 2B-width W2B is, for example, about 50 to 100 mm. For example, the 3B-width W3B is about 2 to 25 mm.

For example, each of the 1B-boundary B1B and the 2B-boundary B2B includes a coincidence boundary. In this example, the surface of each of the 1B-mono-like crystalline portion Am1B, the 2B-mono-like crystalline portion Am2B, and the 1B-intermediate portion Ac1B perpendicular to the positive Z-direction as the first direction has the Miller indices of (100). In other words, for example, the crystal direction of each of the 1B-mono-like crystalline portion Am1B and the 2B-mono-like crystalline portion Am2B parallel to the positive Z-direction as the first direction has the Miller indices of <100>, and the crystal direction of one or more mono-like crystals included in the 1B-intermediate portion Ac1B parallel to the positive Z-direction as the first direction also has the Miller indices of <100>. In this case, for example, the coincidence boundary includes at least one of a Σ5 coincidence boundary, a Σ13 coincidence boundary, a Σ17 coincidence boundary, a Σ25 coincidence boundary, or a Σ29 coincidence boundary. The silicon substrate 1 having such a structure may be obtained by, for example, growing mono-like crystals from the seed crystal assembly 200s and forming a coincidence boundary above each of the boundaries between the first seed crystal Sd1 and the first intermediate seed crystal Cs1 and between the second seed crystal Sd2 and the first intermediate seed crystal Cs1, when manufacturing the silicon ingot In1 from which the silicon substrate 1 is cut out. While the coincidence boundary is forming, for example, distortions are reduced and thus cause fewer defects in the silicon ingot In1. For example, the silicon substrate 1 sliced from the silicon block Bk1 obtained by cutting off the periphery of the silicon ingot In1 may also have fewer defects.

In this example, each of the 1B-boundary B1B and the 2B-boundary B2B is curved in an imaginary cross section parallel to an XY plane perpendicular to the positive Z-direction as the first direction. Being curved herein includes at least one of, for example, arc-shaped, S-shaped, wavy, or meandering. Each of the 1B-boundary B1B and the 2B-boundary B2B including the curve has a width in the positive X-direction as the second direction within a range of, for example, several to 20 mm. The silicon substrate 1 having such a structure includes curves in its functional grain boundaries including coincidence boundaries, which, for example, constantly form as the silicon melt MS1 solidifies unidirectionally into the silicon ingot In1 from which the silicon substrate 1 is cut out. In this case, for example, the tangential direction of each functional grain boundary changes variously at various locations. This allows distortions in various directions to be easily absorbed by the functional grain boundary. The increased area of the functional grain boundary also allows easy absorption of distortions. This may, for example, reduce defects in the silicon ingot In1, and thus reduce defects in the silicon substrate 1 obtained by cutting off the peripheral portion of the silicon ingot In1 and slicing the resultant silicon ingot In1.

In one example, each of the 1B-boundary B1B and the 2B-boundary B2B is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1 from which the silicon substrate 1 is cut out. This may increase, for example, the functional grain boundaries including coincidence boundaries at which distortions are reduced, thus reducing defects. This, for example, improves the quality of the silicon substrate 1 sliced from the silicon block Bk1 obtained by cutting the peripheral portion of the silicon ingot In1. In this example, the wavy 1B-boundary B1B and 2B-boundary B2B each have a maximum width in the positive X-direction as the second direction in a range of, for example, several to 20 mm.

For example, the silicon substrate 1 with the above structure suited to the manufacture of the silicon ingot In1 with fewer defects may have higher quality with fewer defects. The coincidence boundaries and the ratio of each type of coincidence boundary may be identified in each of the 1B-boundary B1B and the 2B-boundary B2B by, for example, EBSDs. The curves in the 1B-boundary B1B and the 2B-boundary B2B in an imaginary cross section parallel to an XY plane perpendicular to the positive Z-direction as the first direction may be identified by etching the seventh surface F7 or the eighth surface F8 as appropriate and observing the resultant surfaces with an optical microscope.

In this example, the crystal direction of each of the 1B-mono-like crystalline portion Am1B and the 2B-mono-like crystalline portion Am2B parallel to the positive Z-direction as the first direction has the Miller indices of <100>, and the crystal direction of one or more mono-like crystals included in the 1B-intermediate portion Ac1B parallel to the positive Z-direction as the first direction also has the Miller indices of <100>. This structure may be achieved by, for example, placing the seed crystal assembly 200s on the bottom 121b of the mold 121 with a plane having the Miller indices of (100) to be the upper surface and unidirectionally growing the silicon melt MS1 to cause the resulting crystals to inherit the crystal direction of the seed crystal assembly 200s when manufacturing the silicon ingot In1 from which the silicon substrate 1 is cut out. This may improve, for example, the crystal growth rate during unidirectional solidification of the silicon melt MS1. Thus, for example, the silicon ingot In1 including the first mono-like crystalline portion Am1, the second mono-like crystalline portion Am2, and the first intermediate portion Ac1 may be easily manufactured by growing crystal grains upward from each of the first seed crystal Sd1, the second seed crystal Sd2, and the first intermediate seed crystal Cs1. The silicon substrate 1 sliced from the silicon block Bk1 cut out from the silicon ingot In1 may easily have higher quality, for example. With the upper surfaces of the 1B-mono-like crystalline portion Am1B, the 1B-intermediate portion Ac1B, and the 2B-mono-like crystalline portion Am2B facing in the positive Z-direction as the first direction having the Miller indices of (100), the upper surface of the silicon substrate 1 is, for example, easily textured finely by dry or wet etching when the silicon substrate 1 is used in a solar cell element 10 (refer to FIGS. 30 to 32) described later.

For example, the coincidence boundary included in each of the 1B-boundary B1B and the 2B-boundary B2B may include a Σ29 coincidence boundary. In this case, for example, a Σ29 random boundary constantly forms above each of boundaries between the first seed crystal Sd1 and the first intermediate seed crystal Cs1 and between the second seed crystal Sd2 and the first intermediate seed crystal Cs1 while mono-like crystals are growing from the seed crystal assembly 200s into the silicon ingot In1 from which the silicon substrate 1 is cut out. The random boundary further reduces distortions to cause fewer defects. Thus, the silicon substrate 1 with the above structure suited to the manufacture of the silicon ingot In1 causing fewer defects may have higher quality with still fewer defects.

The 1B-width W1B and the 2B-width W2B may be, for example, the same or different. The silicon substrate 1 may include, for example, three or more mono-like crystalline portions and intermediate portions each between adjacent ones of the mono-like crystalline portions aligned in the positive X-direction as the second direction.

1-6-2. Structure of Silicon Substrate in First Modification

Figure 28A:
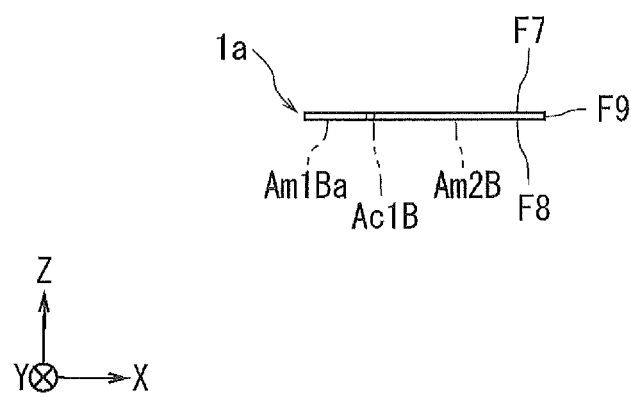
FIG. 28A illustrates a front view of an example silicon substrate according to the first modification.
Figure 28B:
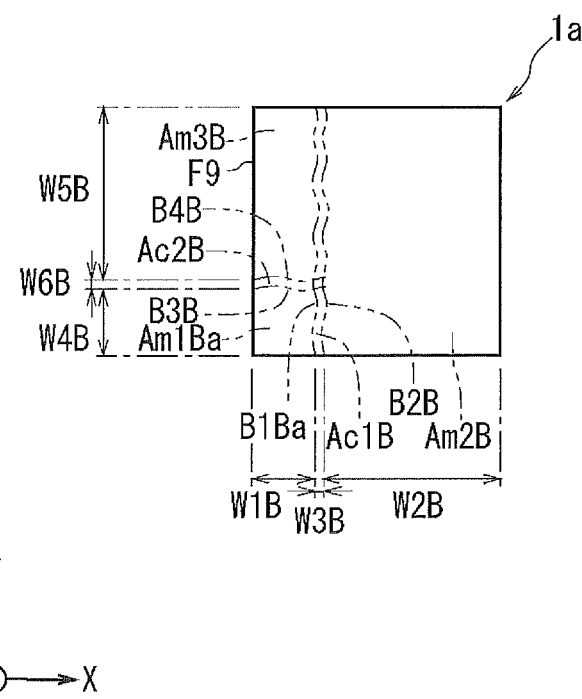
FIG. 28B illustrates a plan view of the silicon substrate according to the first modification.

As shown in FIGS. 28A and 28B, the silicon substrate 1 described above may be, for example, modified into a silicon substrate 1a according to the first modification that includes, in place of the 1B-mono-like crystalline portion Am1B, a 1B-mono-like crystalline portion Am1Ba, a 2B-intermediate portion Ac2B, and a 3B-mono-like crystalline portion Am3B that are adjacent to one another in sequence in the positive Y-direction as the third direction, which is perpendicular to the positive Z-direction as the first direction and crosses the positive X-direction as the second direction. For example, the silicon substrate 1a may be obtained by cutting off, using a wire saw or other tools, the outer periphery of the silicon ingot In1a that may be manufactured with the manufacturing method for the silicon ingot In1a according to the first modification described above and then cutting and slicing the resultant ingot. The outer periphery is likely to contain defects.

As shown in FIGS. 28A and 28B, the silicon substrate 1a includes, for example, the 1B-mono-like crystalline portion Am1Ba, the 2B-mono-like crystalline portion Am2B, the 3B-mono-like crystalline portion Am3B, the 1B-intermediate portion Ac1B, and the 2B-intenuediate portion Ac2B. More specifically, for example, the 1B-mono-like crystalline portion Am1Ba, the 1B-intermediate portion Ac1B, and the 2B-mono-like crystalline portion Am2B are adjacent to one another in the stated order in the positive X-direction as the second direction. For example, the 1B-mono-like crystalline portion Am1Ba, the 2B-intermediate portion Ac2B, and the 3B-mono-like crystalline portion Am3B are adjacent to one another in the stated order in the positive Y-direction as the third direction. For example, the 2B-intermediate portion Ac2B has one end in its longitudinal direction parallel to the positive X-direction as the second direction in contact with a middle portion of the 1B-intermediate portion Ac1B in its longitudinal direction parallel to the positive Y-direction in the third direction. In other words, for example, the 1B-intermediate portion Ac1B and the 2B-intermediate portion Ac2B together form a T-shape. In this example, the 3B-mono-like crystalline portion Am3B, the 1B-intermediate portion Ac1B, and the 2B-mono-like crystalline portion Am2B are adjacent to one another in sequence in the positive X-direction as the second direction.

For example, the 1B-intermediate portion Ac1B has the width (3B-width) W3B less than each of the width (1B-width) W1B of the 1B-mono-like crystalline portion Am1Ba and the width (2B-width) W2B of the 2B-mono-like crystalline portion Am2B in the positive X-direction as the second direction. In other words, for example, each of the 1B-width W1B and the 2B-width W2B is greater than the 3B-width W3B in the positive X-direction as the second direction. For example, the 2B-intermediate portion Ac2B has a width (6B-width) W6B less than each of a width (4B-width) W4B of the 1B-mono-like crystalline portion Am1Ba and a width (5B-width) W5B of the 3B-mono-like crystalline portion Am3B in the positive Y-direction as the third direction. In other words, for example, each of the 4B-width W4B and the 5B-width W5B is greater than the 6B-width W6B in the positive Y-direction as the third direction. In this example, the seventh surface F7 and the eighth surface F8 of the silicon substrate 1a each are square, and is about 150 mm on a side. In this case, each of the 1B-width W1B, the 2B-width W2B, the 4B-width W4B, and the 5B-width W5B is, for example, about 50 to 100 mm. In this case, each of the 3B-width W3B and the 6B-width W6B is, for example, about 2 to 25 mm.

For example, a boundary (1B-boundary) B1Ba between the 1B-mono-like crystalline portion Am1Ba and the 1B-intermediate portion Ac1B includes a coincidence boundary. For example, the 2B-boundary B2B between the 1B-intermediate portion Ac1B and the 2B-mono-like crystalline portion Am2B includes a coincidence boundary. For example, a boundary (3B-boundary) B3B between the 1B-mono-like crystalline portion Am1Ba and the 2B-intermediate portion Ac2B includes a coincidence boundary. For example, a boundary (4B-boundary) B4B between the 2B-intermediate portion Ac2B and the 3B-mono-like crystalline portion Am3B includes a coincidence boundary. For example, the boundary between the 3B-mono-like crystalline portion Am3B and the 1B-intermediate portion Ac1B may include a coincidence boundary.

For example, each of the 1B-boundary B1Ba, the 2B-boundary B2B, the 3B-boundary B3B, and the 4B-boundary B4B is curved in an imaginary cross section parallel to an XY plane perpendicular to the positive Z-direction as the first direction. Being curved herein includes at least one of, for example, arc-shaped, S-shaped, wavy, or meandering. Each of the 1B-boundary B1Ba and the 2B-boundary B2B including the curve has a width in the positive X-direction as the second direction within a range of, for example, several to 20 mm. Each of the 3B-boundary B3B and the 4B-boundary B4B including the curve has a width in the positive Y-direction as the third direction within a range of, for example, several to 20 mm. The silicon substrate 1a having such a structure includes functional grain boundaries including variously-directed curves forming constantly while, for example, the silicon melt MS1 is solidifying unidirectionally into the silicon ingot In1a from which the silicon substrate 1a is cut out. The structure may also increase the area of such a functional grain boundary. This allows, for example, more distortions in various directions to be easily absorbed at the functional grain boundary. The increased area of the functional grain boundary also allows easier absorption of distortions. This may, for example, reduce defects in the silicon ingot In1a, and thus reduce defects in the silicon substrate 1a obtained by cutting off the peripheral portion of the silicon ingot In1a and cutting and slicing the resultant silicon ingot In1a.

In one example, each of the 1B-boundary B1Ba, the 2B-boundary B2B, the 3B-boundary B3B, and the 4B-boundary B4B is wavy in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1a from which the silicon substrate 1a is cut out. This may further increase, for example, the functional grain boundaries including coincidence boundaries at which distortions are reduced, thus reducing defects. This, for example, improves the quality of the silicon ingot In1a, and thus improves the quality of the silicon substrate 1a obtained by cutting the peripheral portion of the silicon ingot In1a and cutting and slicing the resultant silicon ingot In1a. In this example, the wavy 1B-boundary B1Ba and 2B-boundary B2B each have a maximum width in the positive X-direction as the second direction in a range of, for example, several to 20 mm. In this example, the wavy 3B-boundary B3B and 4B-boundary B4B each have a maximum width in the positive Y-direction as the third direction in a range of, for example, several to 20 mm.

For example, the silicon substrate 1a with the above structure suited to the manufacture of the silicon ingot In1a with fewer defects may have higher quality with fewer defects. The coincidence boundaries and the ratio of each type of coincidence boundary may be identified in each of the 1B-boundary B1Ba, the 2B-boundary B2B, the 3B-boundary B3B, and 4B-boundary B4B using EBSDs or other techniques. The curves in the 1B-boundary B1Ba, the 2B-boundary B2B, the 3B-boundary B3B, and the 4B-boundary B4B in an imaginary cross section parallel to an XY plane perpendicular to the positive Z-direction as the first direction may be identified by, for example, etching the seventh surface F7 or the eighth surface F8 as appropriate and observing the resultant surfaces with an optical microscope.

The silicon substrate 1a may include, for example, three or more mono-like crystalline portions and intermediate portions each between adjacent ones of the mono-like crystalline portions aligned in the positive X-direction as the second direction. The silicon substrate 1a may include, for example, three or more mono-like crystalline portions and intermediate portions each between adjacent ones of the mono-like crystalline portions aligned in the positive Y-direction as the third direction.

1-6-3. Structure of Silicon Substrate in Second Modification

Figure 29A:
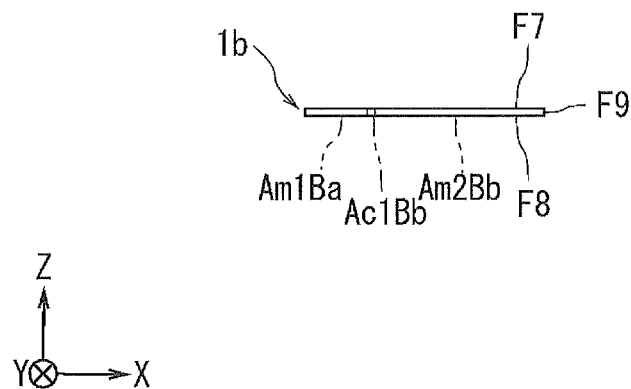
FIG. 29A illustrates a front view of an example silicon substrate according to the second modification.
Figure 29B:
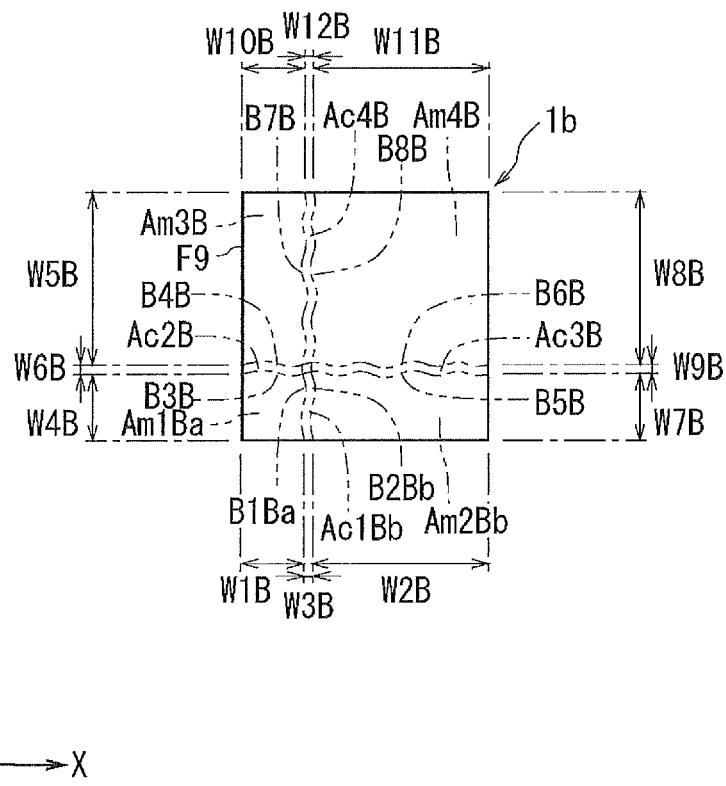
FIG. 29B illustrates a plan view of the silicon substrate according to the second modification.

As shown in FIGS. 29A and 29B, the silicon substrate 1a described above may be, for example, modified into a silicon substrate 1b according to the second modification that includes, in place of the 2B-mono-like crystalline portion Am2B, a 2B-mono-like crystalline portion Am2Bb, a 3B-intermediate portion Ac3B, and a 4B-mono-like crystalline portion Am4B that are adjacent to one another in sequence in the positive Y-direction as the third direction. For example, the silicon substrate 1b may be obtained by cutting off, using a wire saw or other tools, the outer periphery of the silicon ingot In1b that may be manufactured with the manufacturing method for the silicon ingot In1b according to the second modification described above and then cutting and slicing the resultant silicon ingot In1b. The outer periphery is likely to contain defects.

As shown in FIGS. 29A and 29B, the silicon substrate 1b includes, for example, the 1B-mono-like crystalline portion Am1Ba, the 2B-mono-like crystalline portion Am2Bb, the 3B-mono-like crystalline portion Am3B, the 4B-mono-like crystalline portion Am4B, a 1B-intermediate portion Ac1Bb, the 2B-intermediate portion Ac2B, the 3B-intermediate portion Ac3B, and the 4B-intermediate portion Ac4B. More specifically, for example, the 1B-mono-like crystalline portion Am1Ba, the 1B-intermediate portion Ac1Bb, and the 2B-mono-like crystalline portion Am2Bb are adjacent to one another in the stated order in the positive X-direction as the second direction. For example, the 1B-mono-like crystalline portion Am1Ba, the 2B-intermediate portion Ac2B, and the 3B-mono-like crystalline portion Am3B are adjacent to one another in the stated order in the positive Y-direction as the third direction. For example, the 2B-mono-like crystalline portion Am2Bb, the 3B-intermediate portion Ac3B, and the 4B-mono-like crystalline portion Am4B are adjacent to one another in the stated order in the positive Y-direction as the third direction. For example, the 3B-mono-like crystalline portion Am3B, the 4B-intermediate portion Ac4B, and the 4B-mono-like crystalline portion Am4B are adjacent to one another in the stated order in the positive X-direction as the second direction.

The 1B-intermediate portion Ac1Bb and the 4B-intermediate portion Ac4B may define, for example, a single rod-like section extending in the positive Y-direction as the third direction, or may be deviated from each other in the positive X-direction as the second direction. The 2B-intermediate portion Ac2B and the 3B-intermediate portion Ac3B may define, for example, a single rod-like section extending in the positive X-direction as the second direction, or may be deviated from each other in the positive Y-direction as the third direction. In the example in FIG. 29B, the section defined by the 1B-intermediate portion Ac1Bb and the 4B-intermediate portion Ac4B and the section defined by the 2B-intermediate portion Ac2B and the 3B-intermediate portion Ac3B cross each other in a cross shape.

For example, the 1B-intermediate portion Ac1Bb has the width (3B-width) W3B less than each of the width (1B-width) W1B of the 1B-mono-like crystalline portion Am1Ba and the width (2B-width) W2B of the 2B-mono-like crystalline portion Am2Bb in the positive X-direction as the second direction. In other words, for example, each of the 1B-width W1B and the 2B-width W2B is greater than the 3B-width W3B in the positive X-direction as the second direction. For example, the 2B-intermediate portion Ac2B has the width (6B-width) W6B less than each of the width (4B-width) W4B of the 1B-mono-like crystalline portion Am1Ba and the width (5B-width) W5B of the 3B-mono-like crystalline portion Am3B in the positive Y-direction as the third direction. In other words, for example, each of the 4B-width W4B and the 5B-width W5B is greater than the 6B-width W6B in the positive Y-direction as the third direction. For example, the 3B-intermediate portion Ac3B has a width (9B-width) W9B less than each of a width (7B-width) W7B of the 2B-mono-like crystalline portion Am2Bb and a width (8B-width) W8B of the 4B-mono-like crystalline portion Am4B in the positive Y-direction as the third direction. In other words, for example, each of the 7B-width W7B and the 8B-width W8B is greater than the 9B-width W9B in the positive Y-direction as the third direction. For example, the 4B-intermediate portion Ac4B has a width (12B-width) W12B less than each of a width (10B-width) W10B of the 3B-mono-like crystalline portion Am3B and a width (11B-width) W11B of the 4B-mono-like crystalline portion Am4B in the positive X-direction as the second direction. In other words, for example, each of the 10B-width W10B and the 11B-width W11B is greater than the 12B-width W12B in the positive X-direction as the second direction.

In this example, the seventh surface F7 and the eighth surface F8 of the silicon substrate 1b each are square, and is about 150 mm on a side. In this case, each of the 1B-width W1B, the 2B-width W2B, the 4B-width W4B, the 5B-width W5B, the 7B-width W7B, the 8B-width W8B, the 10B-width W10B, and the 11B-width W11B is, for example, about 50 to 100 mm. In this case, each of the 3B-width W3B, the 6B-width W6B, the 9B-width W9B, and the 12B-width W12B is, for example, about 2 to 25 mm.

For example, the boundary (1B-boundary) B1Ba between the 1B-mono-like crystalline portion Am1Ba and the 1B-intermediate portion Ac1Bb includes a coincidence boundary. For example, a boundary (2B-boundary) B2Bb between the 1B-intermediate portion Ac1Bb and the 2B-mono-like crystalline portion Am2Bb includes a coincidence boundary. For example, the boundary (3B-boundary) B3B between the 1B-mono-like crystalline portion Am1Ba and the 2B-intermediate portion Ac2B includes a coincidence boundary. For example, the boundary (4B-boundary) B4B between the 2B-intermediate portion Ac2B and the 3B-mono-like crystalline portion Am3B includes a coincidence boundary. For example, a boundary (5B-boundary) B5B between the 2B-mono-like crystalline portion Am2Bb and the 3B-intermediate portion Ac3B includes a coincidence boundary. For example, a boundary (6B-boundary) B6B between the 3B-intermediate portion Ac3B and 4B-mono-like crystalline portion Am4B includes a coincidence boundary. For example, a boundary (7B-boundary) B7B between the 3B-mono-like crystalline portion Am3B and the 4B-intermediate portion Ac4B includes a coincidence boundary. For example, a boundary (8B-boundary) B8B between the 4B-intermediate portion Ac4B and the 4B-mono-like crystalline portion Am4B includes a coincidence boundary.

For example, each of the 1B-boundary B1Ba, the 2B-boundary B2Bb, the 3B-boundary B3B, the 4B-boundary B4B, the 5B-boundary B5B, the 6B-boundary B6B, the 7B-boundary B7B, and the 8B-boundary B8B is curved in an imaginary cross section parallel to an XY plane perpendicular to the positive Z-direction as the first direction. Being curved herein includes at least one of, for example, arc-shaped, S-shaped, wavy, or meandering. Each of the 1B-boundary B1Ba, the 2B-boundary B2Bb, the 7B-boundary B7B, and the 8B-boundary B8B including the curve has a width in the positive X-direction as the second direction within a range of, for example, several to 20 mm. Each of the 3B-boundary B3B, the 4B-boundary B4B, the 5B-boundary B5B, and the 6B-boundary B6B including the curve has a width in the positive Y-direction as the third direction within a range of, for example, several to 20 mm. The silicon substrate 1b having such a structure includes functional grain boundaries including variously-directed curves forming constantly while, for example, the silicon melt MS1 is solidifying unidirectionally into the silicon ingot In1b from which the silicon substrate 1b is cut out. The structure may also further increase the area of such a functional grain boundary. This allows, for example, more distortions in various directions to be easily absorbed at the functional grain boundary. The further increased area of the functional grain boundary also allows easier absorption of distortions. This may, for example, reduce defects in the silicon ingot In1b, and thus reduce defects in the silicon substrate 1b obtained by cutting off the peripheral portion of the silicon ingot In1b and cutting and slicing the resultant silicon ingot In1b.

In one example, each of the 1B-boundary B1Ba, the 2B-boundary B2Bb, the 3B-boundary B3B, the 4B-boundary B4B, the 5B-boundary B5B, the 6B-boundary B6B, the 7B-boundary B7B, and the 8B-boundary B8B is waved in an imaginary cross section parallel to an XY plane perpendicular to the positive Z-direction as the first direction. The wavy shape may increase, for example, the area of the functional grain boundaries including curves, which constantly form while the silicon melt MS1 is solidifying unidirectionally into the silicon ingot In1b from which the silicon substrate 1b is cut out. This may further increase, for example, the functional grain boundaries including coincidence boundaries at which distortions are reduced, thus reducing defects. This, for example, improves the quality of the silicon ingot In1b, and thus improves the quality of the silicon substrate 1b obtained by cutting the peripheral portion of the silicon ingot In1b and cutting and slicing the resultant silicon ingot In1b. In this example, the wavy 1B-boundary B1Ba, 2B-boundary B2Bb, 7B-boundary B7B, and the 8B-boundary B8B each have a maximum width in the positive X-direction as the second direction in a range of, for example, several to 20 mm. In this example, the wavy 3B-boundary B3B, 4B-boundary B4B, 5B-boundary B5B, and 6B-boundary B6B each have a maximum width in the positive Y-direction as the third direction in a range of, for example, several to 20 mm.

For example, the silicon substrate 1b with the above structure suited to the manufacture of the silicon ingot In1b with fewer defects may have higher quality with fewer defects. The coincidence boundaries and the ratio of each type of coincidence boundary may be identified in each of the 1B-boundary B1Ba, the 2B-boundary B2Bb, the 3B-boundary B3B, the 4B-boundary B4B, the 5B-boundary B5B, the 6B-boundary B6B, the 7B-boundary B7B, and the 8B-boundary B8B by measurement using EBSDs or other techniques. The curves in the 1B-boundary B1Ba, the 2B-boundary B2Bb, the 3B-boundary B3B, the 4B-boundary B4B, the 5B-boundary B5B, the 6B-boundary B6B, the 7B-boundary B7B, and the 8B-boundary B8B in an imaginary cross section parallel to an XY plane perpendicular to the positive Z-direction as the first direction may be identified by, for example, etching the seventh surface F7 or the eighth surface F8 as appropriate and observing the resultant surfaces with an optical microscope.

The silicon substrate 1b may include, for example, three or more mono-like crystalline portions and intermediate portions each between adjacent ones of the mono-like crystalline portions aligned in the positive X-direction as the second direction. The silicon substrate 1b may include, for example, three or more mono-like crystalline portions and intermediate portions each between adjacent ones of the mono-like crystalline portions aligned in the positive Y-direction as the third direction. This may upsize, for example, the silicon ingot In1b further.

1-7. Solar Cell Element

The silicon substrate 1, 1a, or 1b obtained from the silicon block Bk1, Bk1a, or Bk1b cut out from the silicon ingot In1, In1a, or In1b described above is used in, for example, a semiconductor board included in the solar cell element 10 as a solar cell. In other words, for example, the solar cell element 10 includes the silicon substrate 1, 1a, or 1b having the structure suited to the manufacture of the silicon ingot In1, In1a, or In1b causing fewer defects. For example, the solar cell element 10 may thus achieve higher performance in, for example, output characteristics.

An example solar cell element 10 will be described with reference to FIGS. 30 to 32. The solar cell element 10 has a light receiving surface 10a to receive light and a non-light receiving surface 10b opposite to the light receiving surface 10a.

Figure 30:
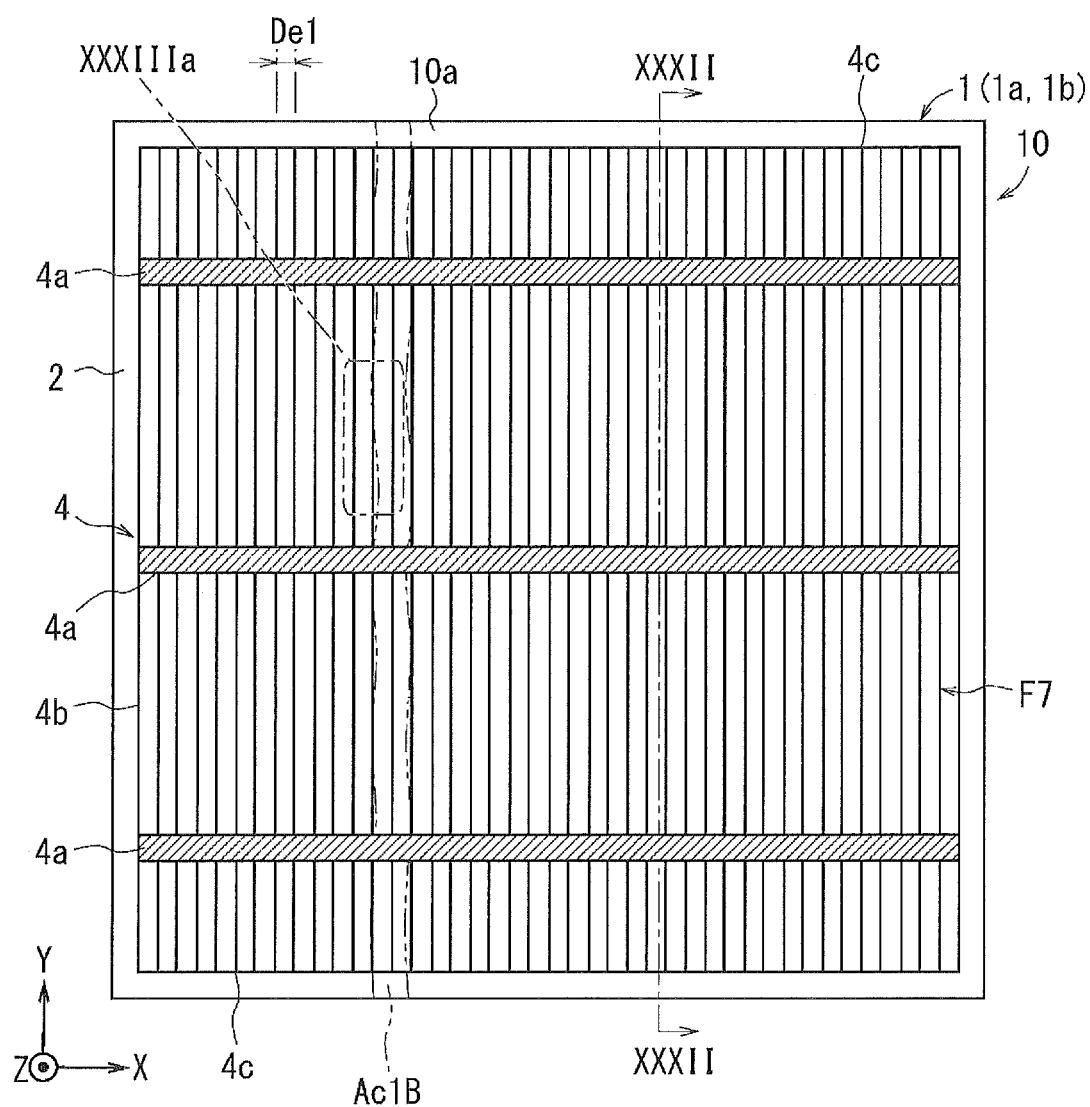
FIG. 30 illustrates a plan view of an example solar cell element according to the first embodiment, showing its light receiving surface.
Figure 31:
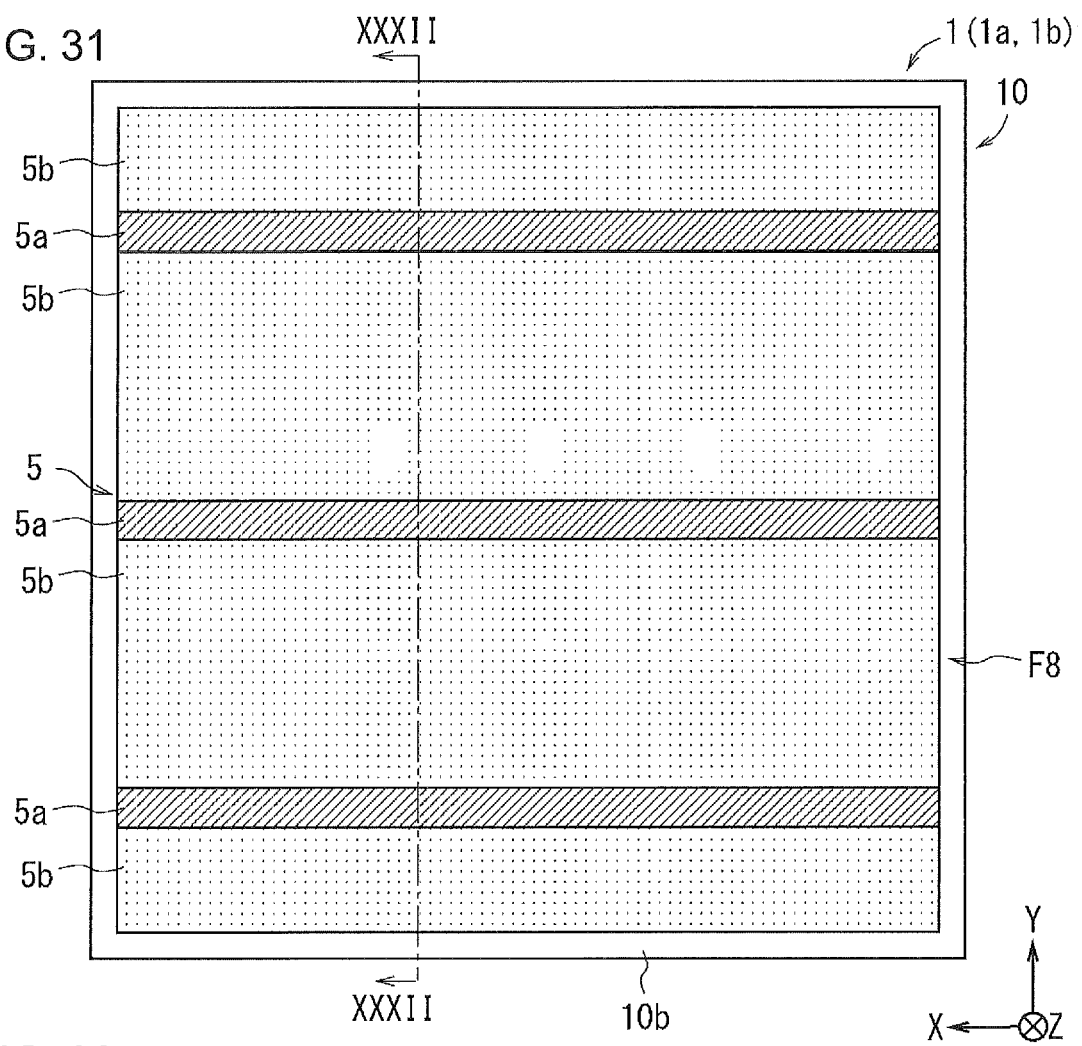
FIG. 31 illustrates a plan view of the solar cell element according to the first embodiment, showing its non-light receiving surface.
Figure 32:
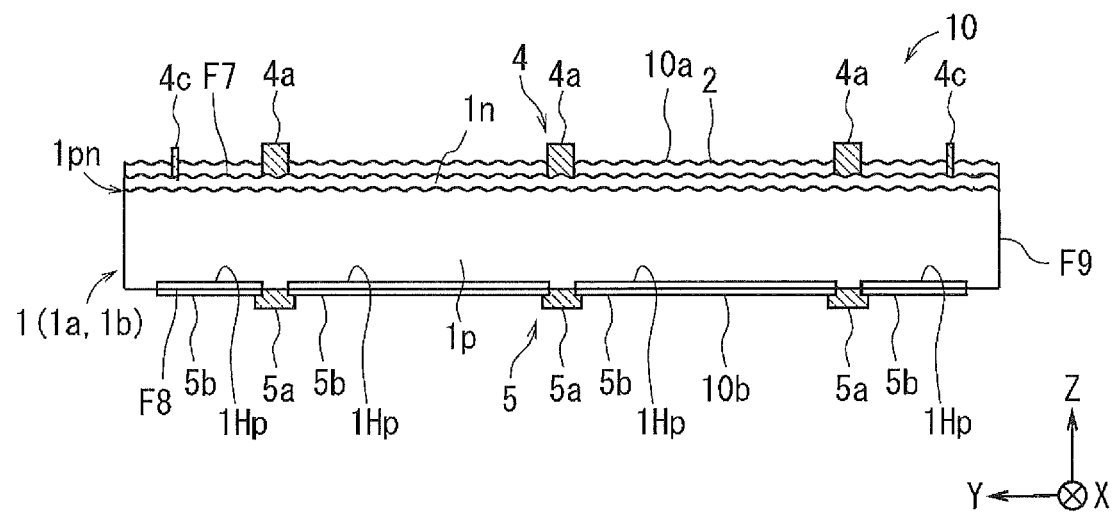
FIG. 32 illustrates an imaginary cross-sectional view of the solar cell element according to the first embodiment taken along line XXXII-XXXII in FIGS. 30 and 31.

As shown in FIGS. 30 to 32, the solar cell element 10 includes, for example, the silicon substrate 1, an anti-reflection film 2, a first electrode 4, and a second electrode 5.

The silicon substrate 1 includes, for example, a first semiconductor layer 1p of a first conduction type and a second semiconductor layer 1n of a second conduction type adjacent to the light receiving surface 10a of the first semiconductor layer 1p. For example, when the first conduction type is p-type, the second conduction type is n-type. For example, when the first conduction type is n-type, the second conduction type is p-type. For example, when the first conduction type is p-type, boron or another element is used as a dopant element to obtain the silicon ingot In1 of p-type. For example, the silicon ingot In1 may have a boron concentration (the number of atoms per unit volume) of about $1 \times 10^{16}$ to $1 \times 10^{17}$ atoms per cubic centimeter (atoms/cm$^3$). In this case, the silicon substrate 1 has a specific resistance of about 0.2 to 2 ohm-centimeter (Ω·cm). The silicon substrate 1 may be doped with boron by, for example, mixing an appropriate amount of a simple boron element or an appropriate amount of silicon lumps having a known boron concentration during the manufacture of the silicon ingot In1. For example, when the first conduction type is p-type, the second semiconductor layer 1n may be formed by introducing impurities such as phosphorus into the surface layer on the seventh surface F7 of the silicon substrate 1 by diffusion. For example, the first semiconductor layer 1p and the second semiconductor layer 1n thus form a p-n junction 1pn.

The silicon substrate 1 may include, for example, a back-surface-field (BSF) 1Hp located adjacent to the eighth surface F8. The BSF 1Hp produces, for example, an internal electric field adjacent to the eighth surface F8 of the silicon substrate 1 and reduces recombination of minority carriers near the eighth surface F8. Thus, for example, the solar cell element 10 can avoid decrease in photoelectric conversion efficiency. The BSF 1Hp has the same conduction type as the first semiconductor layer 1p. The BSF 1Hp contains majority carriers at a higher concentration level than the first semiconductor layer 1p. For example, when the silicon substrate 1 is of p-type, the BSF 1Hp may be formed by introducing a dopant element such as boron or aluminum into the surface layer on the eighth surface F8 of the silicon substrate 1 by diffusion. In this example, the concentration of the dopant in the BSF 1Hp is, for example, about $1\times10^{18}$ to $5\times10^{21}$ atoms/cm$^3$.

The anti-reflection film 2 is located, for example, on the seventh surface F7 adjacent to the light receiving surface 10a of the silicon substrate 1. The anti-reflection film 2 reduces the reflectivity of the light receiving surface 10a against light in an intended wavelength range, thus allowing light in the intended wavelength range to be easily absorbed into the silicon substrate 1. This may increase, for example, the amount of carriers generated through photoelectric conversion in the silicon substrate 1. The anti-reflection film 2 may be formed from, for example, one or more materials selected from silicon nitride, titanium oxide, and silicon oxide. For example, the anti-reflection film 2 may have a thickness specified as appropriate in accordance with the material to achieve a condition under which incident light in an intended wavelength range is hardly reflected (reflection-free condition). More specifically, for example, the anti-reflection film 2 has a refractive index of about 1.8 to 2.3 and a thickness of about 50 to 120 nanometers (nm).

The first electrode 4 is located on, for example, the seventh surface F7 adjacent to the light receiving surface 10a of the silicon substrate 1. As shown in FIGS. 30 and 32, the first electrode 4 includes, for example, first output-intake electrodes 4a and first current-collecting electrodes 4b being linear (linear electrodes). In the example in FIGS. 30 and 32, the first electrode 4 includes three first output-intake electrodes 4a elongated in the positive X-direction as the second direction and forty-three linear first current-collecting electrodes 4b elongated in the positive Y-direction as the third direction. At least one of the first output-intake electrodes 4a crosses each first current-collecting electrode 4b. The first output-intake electrodes 4a each have a line width of, for example, about 0.6 to 1.5 mm. The first current-collecting electrodes 4b each have a line width of, for example, about 25 to 100 µm. The first current-collecting electrodes 4b thus have a less line width than the first output-intake electrodes 4a. The linear first current-collecting electrodes 4b are at predetermined intervals (first intervals) De1 in the positive X-direction as the second direction and are substantially parallel to one another. The predetermined first interval De1 is, for example, about 1.5 to 3 mm. The first electrode 4 has a thickness of, for example, about 10 to 40 µm. The first electrode 4 may include, for example, an auxiliary electrode 4c connecting the ends of the first current-collecting electrodes 4b in the positive Y-direction and an auxiliary electrode 4c connecting the ends of the first current-collecting electrodes 4b in the negative Y-direction. The auxiliary electrodes 4c have, for example, substantially the same line width as the first current-collecting electrodes 4b. The first electrode 4 may be formed by, for example, applying silver paste in an intended pattern to the seventh surface F7 of the silicon substrate 1 and then firing the silver paste. The silver paste may be a mixture of, for example, powder containing silver as the main ingredient, glass fit, and an organic vehicle. The main ingredient refers to an ingredient that has the highest content among the contained ingredients. The silver paste may be applied by, for example, screen printing.

The second electrode 5 is located on, for example, the eighth surface F8 adjacent to the non-light receiving surface 10b of the silicon substrate 1. As shown in FIGS. 31 and 32, the second electrode 5 includes, for example, second output-intake electrodes 5a and second current-collecting electrodes 5b. In the example in FIGS. 31 and 32, the second electrode 5 includes three second output-intake electrodes 5a elongated in the positive X-direction. The second output-intake electrodes 5a each have a thickness of, for example, about 10 to 30 µm. The second output-intake electrodes 5a each have a line width of, for example, about 1 to 4 mm. The second output-intake electrodes 5a may be formed from, for example, the same material and in the same manner as the first electrode 4. For example, the second output-intake electrodes 5a may be formed by, for example, applying silver paste in an intended pattern to the eighth surface F8 of the silicon substrate 1 and then firing the silver paste. The second current-collecting electrodes 5b are located across, for example, substantially the entire eighth surface F8 of the silicon substrate 1 except in a large portion of the area in which the second output-intake electrodes 5a are located. The second current-collecting electrodes 5b each have a thickness of, for example, about 15 to 50 µm. The second current-collecting electrodes 5b may be formed by, for example, applying aluminum paste in an intended pattern to the eighth surface F8 of the silicon substrate 1 and then firing the aluminum paste. The aluminum paste may be a mixture of, for example, powder containing aluminum as the main ingredient, glass frit, and an organic vehicle. The aluminum paste may be applied by, for example, screen printing.

Figure 33A:
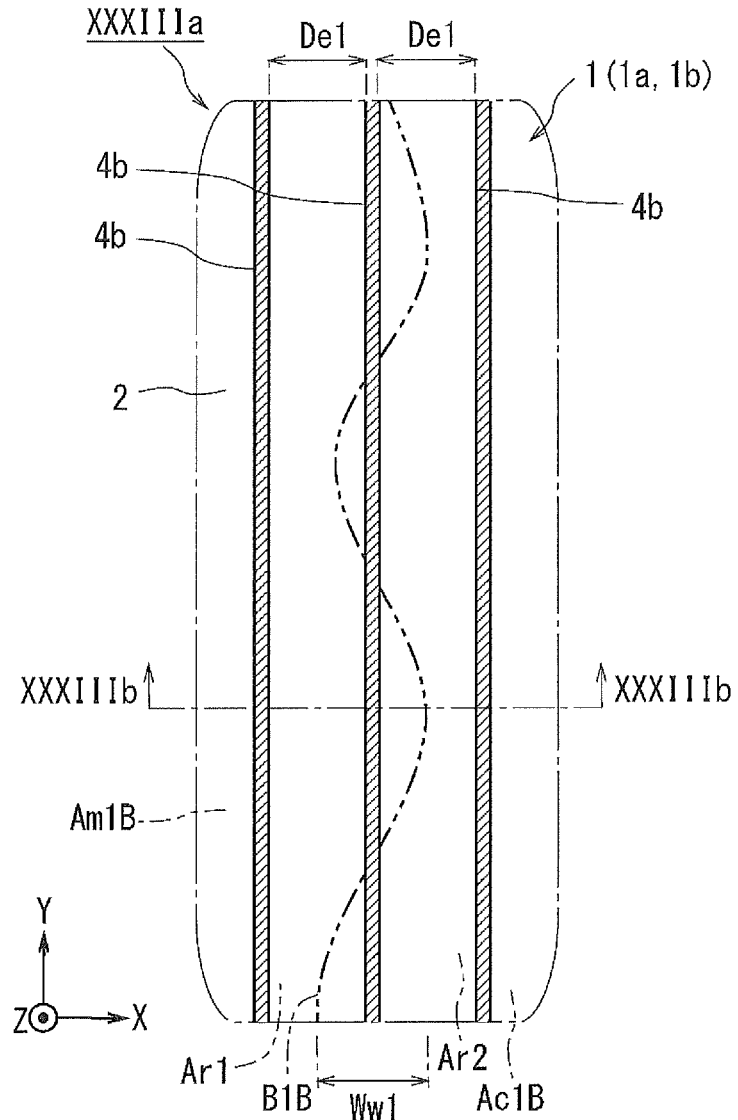
FIG. 33A illustrates a plan view of the solar cell element according to the first embodiment, showing XXXIIIa portion in FIG. 30 on the light receiving surface.
Figure 33B:
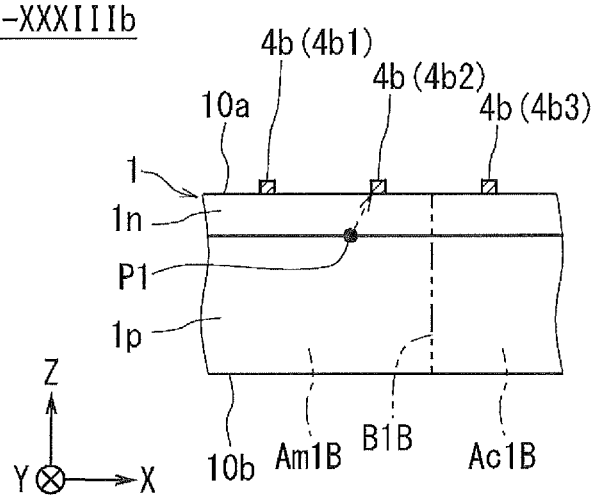
FIG. 33B illustrates an imaginary cross-sectional view of the solar cell element taken along line XXXIIIb-XXXIIIb in FIG. 33A.

As shown in the example in FIG. 33A, the solar cell element 10 with such a structure may include the curved 1B-boundary B1B, which extends over a greater width (extending width) Ww1 than a first current-collecting electrode 4b in the positive X-direction as the second direction. In this case, for example, the 1B-boundary B1B may extend over the two areas Ar1 and Ar2 across one first current-collecting electrode 4b, when the light receiving surface 10a of the solar cell element 10 is viewed in plan. In this case, as shown in FIG. 33B, carriers generated through photoelectric conversion at the p-n junction 1pn in response to light falling on the light receiving surface 10a are, for example, collected by the first current-collecting electrode 4b nearest the carrier generation point P1 among the multiple first current-collecting electrodes 4b. For the first conduction type being p-type, electrons as carriers are collected by the first current-collecting electrodes 4b.

Figure 34A:
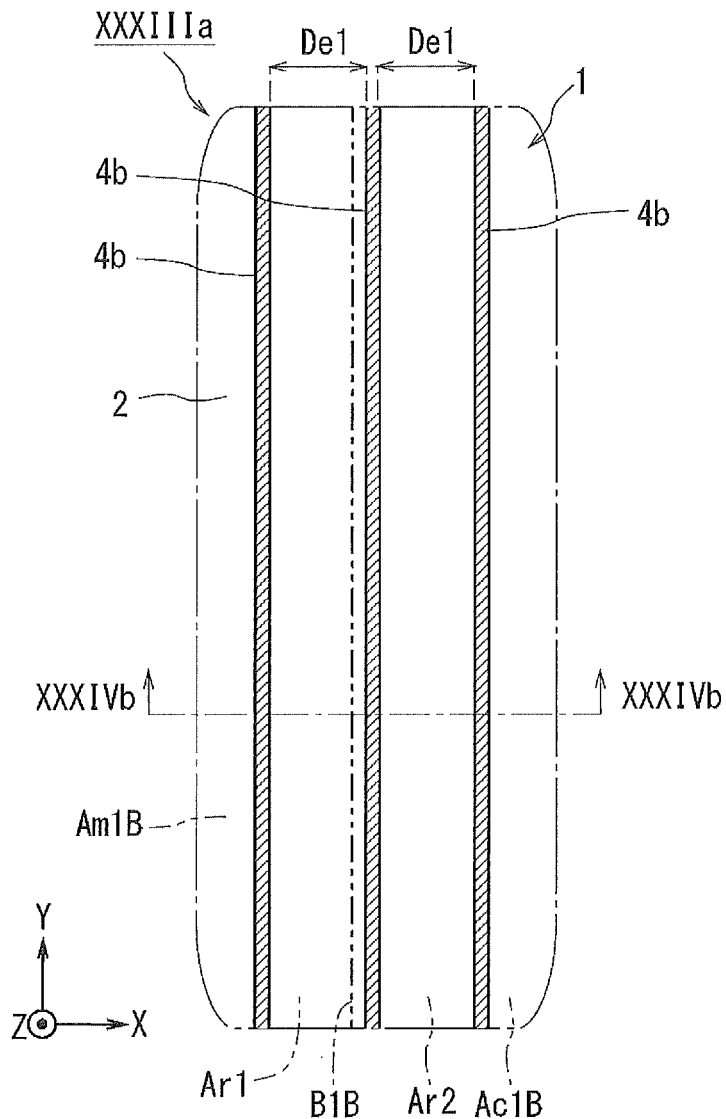
FIG. 34A illustrates a plan view of an example solar cell element in one reference example, showing a portion corresponding to XXXIIIa portion in FIG. 30 on the light receiving surface.
Figure 34B:
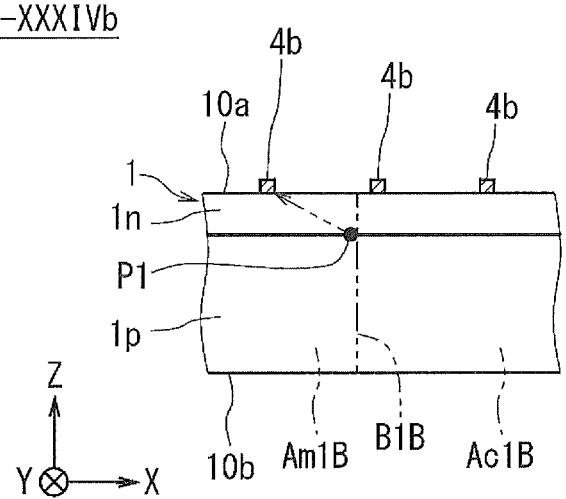
FIG. 34B illustrates an imaginary cross-sectional view of the solar cell element taken along line XXXIVb-XXXIVb in FIG. 34A.

As shown in FIG. 34A, any 1B-boundary B1B extending linearly along a first current-collecting electrode 4b may be between the point P at which carriers are generated and the first current-collecting electrode 4b nearest the carrier generation point P1 among the multiple first current-collecting electrodes 4b. In this case, as shown in FIG. 34B, the carrier generated at the generation point P1 is, for example, collected by the first current-collecting electrode 4b that is the second nearest the carrier generation point P1 among the multiple first current-collecting electrodes 4b. In this case, for example, carriers travel a longer distance in the silicon substrate 1 to be recombined. This is likely to decrease the photoelectric conversion efficiency.

Thus, as shown in FIGS. 33A and 33B, the curved 1B-boundary B1B extends, for example, across a greater width Ww1 than the first current-collecting electrode 4b in the positive X-direction as the second direction. This improves photoelectric conversion efficiency and improves the performance of the solar cell element 10. Although the 1B-boundary B1B is described, any curved 2B-boundary B2B that extends over a greater width than the first current-collecting electrodes 4b in the positive X-direction as the second direction may also improve photoelectric conversion efficiency and improve the performance of the solar cell element 10.

As shown in FIG. 33A, the extending width Ww1 of the curved 1B-boundary B1B in the positive X-direction as the second direction may be greater than the first interval De1 between adjacent ones of the linear first current-collecting electrodes 4b. More specifically, for example, the first interval De1 is 1.6 mm, the line width of each first current-collecting electrode 4b is 50 μm, and the extending width Ww1 is several to several tens of millimeters. This allows, for example, the 1B-boundary B1B to easily extend over the two areas Ar1 and Ar2 across one first current-collecting electrode 4b, when the light receiving surface 10a of the solar cell element 10 is viewed in plan. In this case, for example, the 1B-boundary B1B is less likely to obstruct collection, performed by the first current-collecting electrodes 4b, of carriers generated through photoelectric conversion in response to light falling on the solar cell element 10. For example, the solar cell element 10 may thus achieve higher performance in, for example, output characteristics. For example, at least one of the 1B-boundary B1B or the 2B-boundary B2B may have the extending width Ww1 greater than the first interval De1 in the positive X-direction as the second direction.

1-8. Overview of First Embodiment

The silicon ingot In1 according to the first embodiment includes, for example, the first intermediate portion Ac1 including one or more mono-like crystalline sections between the first mono-like crystalline portion Am1 and the second mono-like crystalline portion Am2 in the positive X-direction as the second direction. Each of the first mono-like crystalline portion Am1 and the second mono-like crystalline portion Am2 has a greater width than the first intermediate portion Ac1 in the positive X-direction as the second direction. For example, each of the first boundary B1 between the first mono-like crystalline portion Am1 and the first intermediate portion Ac1 and the second boundary B2 between the second mono-like crystalline portion Am2 and the first intermediate portion Ac1 includes a coincidence boundary. For example, the first boundary B1 and the second boundary B2 are curved in an imaginary cross section perpendicular to the positive Z-direction as the first direction. The silicon ingot In1 having such a structure includes curves in its functional grain boundaries including coincidence boundaries, which constantly form as the silicon melt MS1 solidifies unidirectionally into the silicon ingot In1, for example. In this case, for example, the tangential direction of each functional grain boundary changes variously at various locations. This allows distortions in various directions to be easily absorbed by the functional grain boundary. The increased area of the functional grain boundary also allows easy absorption of distortions. Thus, for example, the silicon ingot In1 may have fewer defects and thus have higher quality.

The silicon block Bk1 according to the first embodiment includes, for example, the 1A-intermediate portion Ac1A including one or more mono-like crystalline sections between the 1A-mono-like crystalline portion Am1A and the 2A-mono-like crystalline portion Am2A in the positive X-direction as the second direction. Each of the 1A-mono-like crystalline portion Am1A and the 2A-mono-like crystalline portion Am2A has a greater width than the 1A-intermediate portion Ac1A in the positive X-direction as the second direction. For example, each of the 1A-boundary B1A between the 1A-mono-like crystalline portion Am1A and the 1A-intermediate portion Ac1A and the 2A-boundary B2A between the 2A-mono-like crystalline portion Am2A and the 1A-intermediate portion Ac1A includes a coincidence boundary. For example, the 1A-boundary B1A and the 2A-boundary B2A are curved in an imaginary cross section perpendicular to the positive Z-direction as the first direction. The silicon block Bk1 having such a structure includes curves in its functional grain boundaries including coincidence boundaries, which, for example, constantly form as the silicon melt MS1 solidifies unidirectionally into the silicon ingot ha from which the silicon block Bk1 is cut out. In this case, for example, the tangential direction of each functional grain boundary changes variously at various locations. This allows distortions in various directions to be easily absorbed by the functional grain boundary. The increased area of the functional grain boundary also allows easy absorption of distortions. These may reduce defects in the silicon ingot In1, for example. For example, the silicon block Bk1 with the structure suited to the manufacture of the silicon ingot In1 causing fewer defects may have higher quality with fewer defects.

The silicon substrate 1 according to the first embodiment includes, for example, the 1B-intermediate portion Ac1B including one or more mono-like crystalline sections between the 1B-mono-like crystalline portion Am1B and the 2B-mono-like crystalline portion Am2B in the positive X-direction as the second direction. Each of the 1B-mono-like crystalline portion Am1B and the 2B-mono-like crystalline portion Am2B has a greater width than the 1B-intermediate portion Ac1B in the positive X-direction as the second direction. For example, each of the 1B-boundary B1B between the 1B-mono-like crystalline portion Am1B and the 1B-intennediate portion Ac1B and the 2B-boundary B2B between the 2B-mono-like crystalline portion Am2B and the 1B-intermediate portion Ac1B includes a coincidence boundary. For example, the 1B-boundary B1B and the 2B-boundary B2B are curved in an imaginary cross section perpendicular to the positive Z-direction as the first direction. The silicon substrate 1 having such a structure includes curves in its functional grain boundaries including coincidence boundaries, which, for example, constantly form as the silicon melt MS1 solidifies unidirectionally into the silicon ingot In1 from which the silicon substrate 1 is cut out. In this case, for example, the tangential direction of each functional grain boundary changes variously at various locations. This allows distortions in various directions to be easily absorbed by the functional grain boundary. The increased area of the functional grain boundary also allows easy absorption of distortions. These may reduce defects in the silicon ingot In1, for example. In this example, the silicon substrate 1 with the structure suited to the manufacture of the silicon ingot In1 causing fewer defects may have higher quality with fewer defects.

The solar cell element 10 including the silicon substrate 1 with the structure suited to the manufacture of the silicon ingot In1 causing fewer defects may achieve, for example, higher performance in, for example, output characteristics.

2. Other Embodiments

The present disclosure is not limited to the above first embodiment and may be changed or modified variously without departing from the spirit and scope of the present disclosure.

In the first embodiment described above, each of the silicon ingots In1, In1a, and In1b may include, for example, at least one of the first boundary B1 or B1a or the second boundary B2 or B2b curved or wavy in an imaginary cross section perpendicular to the positive Z-direction as the first direction. Each of the silicon ingots In1a and In1b may include, for example, at least one of the third boundary B3 or the fourth boundary B4 curved or wavy in an imaginary cross section perpendicular to the positive Z-direction as the first direction. The silicon ingot In1b may include, for example, at least one of the fifth boundary B5 or the sixth boundary B6 curved or wavy in an imaginary cross section perpendicular to the positive Z-direction as the first direction. The silicon ingot In1b may include, for example, at least one of the seventh boundary B7 or the eighth boundary B8 curved or wavy in an imaginary cross section perpendicular to the positive Z-direction as the first direction.

In the first embodiment described above, each of the silicon blocks Bk1, Bk1a, and Bk1b may include, for example, at least one of the 1A-boundary B1A or B1Aa or the 2A-boundary B2A or B2Ab curved or wavy in an imaginary cross section perpendicular to the positive Z-direction as the first direction. Each of the silicon blocks Bk1a and Bk1b may include, for example, at least one of the 3A-boundary B3A or the 4A-boundary B4A curved or wavy in an imaginary cross section perpendicular to the positive Z-direction as the first direction. The silicon block Bk1b may include, for example, at least one of the 5A-boundary B5A or the 6A-boundary B6A curved or wavy in an imaginary cross section perpendicular to the positive Z-direction as the first direction. The silicon block Bk1b may include, for example, at least one of the 7A-boundary B7A or the 8A-boundary B8A curved or wavy in an imaginary cross section perpendicular to the positive Z-direction as the first direction.

In the first embodiment described above, each of the silicon substrates 1, 1a, and 1b may include, for example, at least one of the 1B-boundary B1B or B1Ba or the 2B-boundary B2B or B2Bb curved or wavy in an imaginary cross section perpendicular to the positive Z-direction as the first direction. Each of the silicon substrates 1a and 1b may include, for example, at least one of the 3B-boundary B3B or the 4B-boundary B4B curved or wavy in an imaginary cross section perpendicular to the positive Z-direction as the first direction. The silicon substrate 1b may include, for example, at least one of the 5B-boundary B5B or the 6B-boundary B6B curved or wavy in an imaginary cross section perpendicular to the positive Z-direction as the first direction. The silicon substrate 1b may include, for example, at least one of the 7B-boundary B7B or the 8B-boundary B8B curved or wavy in an imaginary cross section perpendicular to the positive Z-direction as the first direction.

The solar cell element 10 in the first embodiment described above may include, for example, the silicon substrate 1 to have the seventh surface F7 at the non-light receiving surface 10b and the eighth surface F8 at the light receiving surface 10a. In other words, for example, the multiple first current-collecting electrodes 4b as linear electrodes are located on the seventh surface F7 or the eighth surface F8.

Figure 35A:
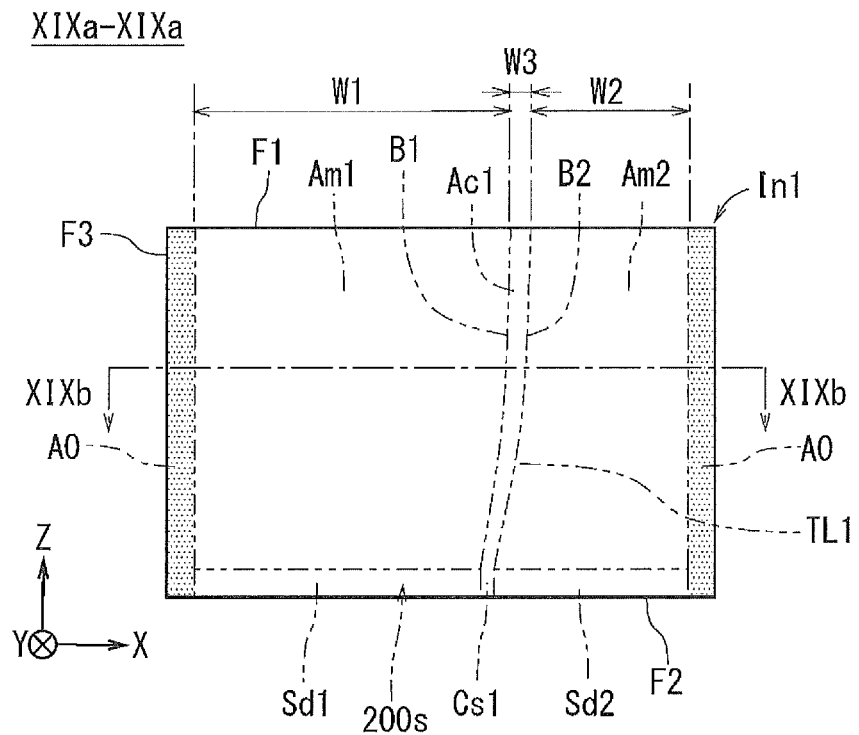
FIG. 35A illustrates a cross-sectional view of an example silicon ingot according to a third modification taken along line XIXa-XIXa in FIG. 19B.
Figure 35B:
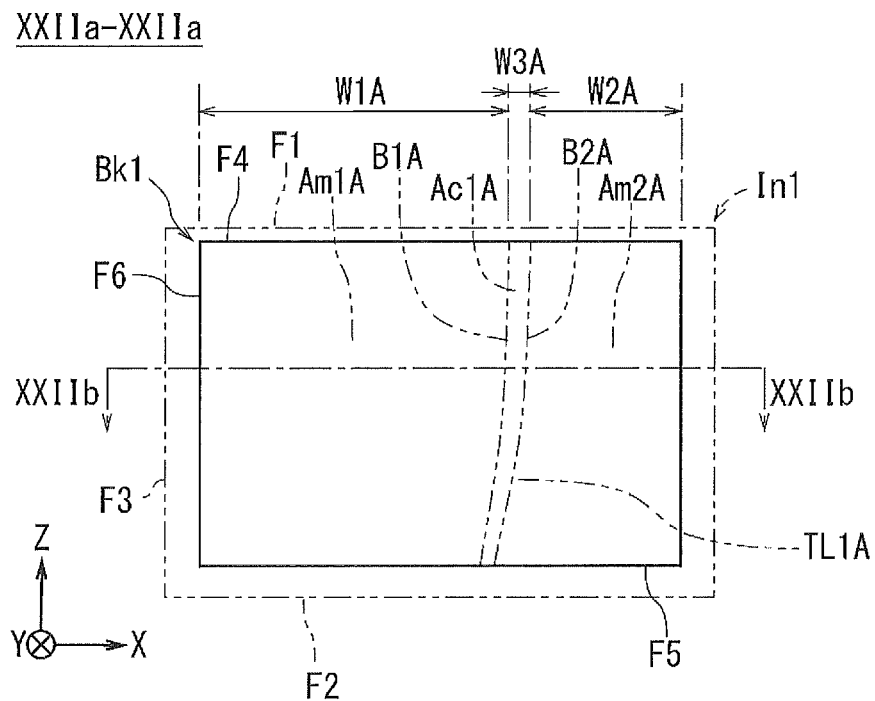
FIG. 35B illustrates a cross-sectional view of the silicon block according to the third modification taken along line XXIIa-XXIIa in FIG. 22B.

In the first embodiment, as shown in FIG. 35A, the second boundary B2 in the silicon ingot In1 may include a slant (first slant) TL1 being at an angle to the positive Z-direction as the first direction and being slanted in the positive X-direction as the second direction with greater distances in the positive Z-direction as the first direction. More specifically, the first slant TL1 is at an angle to a YZ plane. In the example in FIG. 35A, the second boundary B2 extends diagonally upward. For example, as shown in FIG. 35B, the 2A-boundary B2A in the silicon block Bk1 may include a slant (1A-slant) TL1A at an angle to the positive Z-direction as the first direction. The slant is slanted in the positive X-direction as the second direction with greater distances in the positive Z-direction as the first direction. More specifically, for example, the 1A-slant TL1A is at an angle to a YZ plane. In the example in FIG. 35B, the 2A-boundary B2A extends diagonally upward. The width of the first slant TL1 and the 1A-slant TL1A extending in the positive X-direction as the second direction is, for example, from several to several tens of millimeters.

The above structure may be achieved in the example manner described below. The first intermediate seed crystal Cs1 is first placed on the bottom 121b of the mold 121 at a position off the center in the positive X-direction as the second direction. While the silicon melt MS1 is unidirectionally solidifying upward (positive Z-direction) from the bottom 121b of the mold 121, heating from around the mold 121 and other conditions are adjusted as appropriate to cause the boundary between the silicon melt MS1 and the solid state silicon to protrude in the positive Z-direction as the first direction. In this case, the silicon melt MS1 may unidirectionally solidifies with, for example, the second boundary B2 forming above dislocations propagating upward from the bottom 121b. For example, the second boundary B2 may obstruct the dislocations propagating upward. For example, the silicon melt MS1 solidifies with the second boundary B2 diagonally extending near the wall of the mold 121 at which dislocations tend to occur. The second boundary B2 may thus easily obstruct such dislocations propagating upward. This may, for example, reduce defects in the resultant silicon ingot In1 and improve the quality of the silicon ingot In1. For example, the silicon block Bk1 cut out from the silicon ingot In1 may also have higher quality.

In the first embodiment, for example, the second direction and the third direction may cross each other at an angle other than 90 degrees. For example, in the first and second modifications of the first embodiment, the angle between the second direction and the third direction may be set to an angle included in the rotation angle relationship of silicon monocrystals corresponding to a coincidence boundary. Being orthogonal to each other allows the second direction and the third direction to cross each other at an angle deviating from 90 degrees within an error margin of about 1 to 3 degrees. More specifically, the second direction and the third direction crossing each other orthogonally may cross each other at an angle of 87 to 93 degrees. The error in the angle between the second direction and the third direction deviating from 90 degrees may occur when, for example, preparing the seed crystals and the intermediate seed crystals by cutting and when arranging the seed crystals and the intermediate seed crystals.

In the first embodiment, for example, the first surface F1 and the second surface F2 of the silicon ingot In1, In1a, or In1b and the fourth surface F4 and the fifth surface F5 of the silicon block Bk1, Bk1a, or Bk1b may each be shaped variously in accordance with, for example, the shape of the silicon substrate 1, 1a, or 1b rather than being rectangular.

The components described in the first embodiment and the modifications above may be entirely or partially combined as appropriate unless any contradiction arises.

REFERENCE SIGNS LIST

The invention claimed is:

1. A silicon ingot having a first surface, a second surface opposite to the first surface, and a third surface extending in a first direction from the second surface to the first surface and connecting the first surface and the second surface, the silicon ingot comprising:
   a first mono-like crystalline portion;
   a first intermediate portion including one or more mono-like crystalline sections; and
   a second mono-like crystalline portion,
   wherein the first mono-like crystalline portion, the first intermediate portion, and the second mono-like crystalline portion are adjacent to one another in sequence in a second direction perpendicular to the first direction,
   a first width of the first mono-like crystalline portion and a second width of the second mono-like crystalline portion each are greater than a third width of the first intermediate portion in the second direction,
   a first boundary between the first mono-like crystalline portion and the first intermediate portion and a second boundary between the second mono-like crystalline portion and the first intermediate portion each include a coincidence boundary,
   at least one of the first boundary or the second boundary is curved in an imaginary cross section perpendicular to the first direction, and
   a crystal direction of each of the first mono-like crystalline portion, the second mono-like crystalline portion and the one or more mono-like crystalline sections in the first intermediate portion is parallel to the first direction and has Miller indices of <100>.

2. The silicon ingot according to claim 1, wherein each of the first boundary and the second boundary is curved in an imaginary cross section perpendicular to the first direction.

3. The silicon ingot according to claim 1, wherein
   at least one of the first boundary or the second boundary is wavy in an imaginary cross section perpendicular to the first direction.

4. The silicon ingot according to claim 1, wherein the second boundary includes a first slant being at an angle to the first direction and being slanted in the second direction with greater distances in the first direction.

5. The silicon ingot according to claim 1, further comprising:
   a second intermediate portion including one or more mono-like crystalline sections; and
   a third mono-like crystalline portion,
   wherein the first mono-like crystalline portion, the second intermediate portion, and the third mono-like crystalline portion are adjacent to one another in sequence in a third direction perpendicular to the first direction and crossing the second direction,
   a fourth width of the first mono-like crystalline portion and a fifth width of the third mono-like crystalline portion each are greater than a sixth width of the second intermediate portion in the third direction,
   a third boundary between the first mono-like crystalline portion and the second intermediate portion and a fourth boundary between the third mono-like crystalline portion and the second intermediate portion each include a coincidence boundary, and
   at least one of the third boundary or the fourth boundary is curved in an imaginary cross section perpendicular to the first direction.

6. The silicon ingot according to claim 1, further comprising:
   a first portion including a first end in a direction opposite to the first direction; and
   a second portion including a second end opposite to the first end,
   wherein the first portion has a higher ratio of Σ29 coincidence boundaries than the second portion, and
   the second portion has a higher ratio of Σ5 coincidence boundaries than the first portion.

7. The silicon ingot according to claim 1, wherein the first width of the first mono-like crystalline portion is greater than the second width of the second mono-like crystalline portion.

8. The silicon ingot according to claim 2, wherein each of the first boundary and the second boundary has a width less than 20 mm in the second direction.

* * * * *